United States Patent
Long et al.

(10) Patent No.: US 12,462,756 B2
(45) Date of Patent: Nov. 4, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yixuan Long, Beijing (CN); Biao Liu, Beijing (CN); Mengmeng Du, Beijing (CN); Xiaoqing Shu, Beijing (CN); Hongwei Ma, Beijing (CN); Yujing Li, Beijing (CN); Xiangdan Dong, Beijing (CN); Siyu Wang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/753,419

(22) Filed: Jun. 25, 2024

(65) Prior Publication Data
US 2024/0349536 A1   Oct. 17, 2024

Related U.S. Application Data

(63) Continuation of application No. 17/428,631, filed as application No. PCT/CN2020/127757 on Nov. 10, (Continued)

(51) Int. Cl.
*H10K 59/121* (2023.01)
*G09G 3/3241* (2016.01)
(Continued)

(52) U.S. Cl.
CPC ....... *G09G 3/3241* (2013.01); *H10K 59/1213* (2023.02); *H10K 59/1216* (2023.02);
(Continued)

(58) Field of Classification Search
CPC ... H10K 59/352; H10K 59/353; H10K 59/121
See application file for complete search history.

(56) References Cited

U.S. PATENT DOCUMENTS

| 10,971,556 B1 | 4/2021 | Fang et al. |
| 2005/0116232 A1* | 6/2005 | Kim ..................... H10D 86/441 |
| | | 257/E27.111 |

(Continued)

FOREIGN PATENT DOCUMENTS

| CN | 1622716 A | 6/2005 |
| CN | 102244090 A | 11/2011 |

(Continued)

OTHER PUBLICATIONS

International Search Report & Written Opinion mailed Jul. 15, 2021, regarding PCT/CN2020/127757.

(Continued)

*Primary Examiner* — Yuzhen Shen
(74) *Attorney, Agent, or Firm* — Intellectual Valley Law, P.C.

(57) ABSTRACT

An array substrate is provided. The array substrate includes a plurality of first type data lines and a plurality of second type data lines. A respective one of the plurality of first type data lines crosses over subpixel apertures of multiple subpixels of a first color, and does not crosses over subpixel apertures of any subpixel of a second color and does not crosses over subpixel apertures of any subpixel of a third color, the first color, the second color, and the third color being different colors. A respective one of the plurality of second type data line does not cross over any subpixel aperture. A respective subpixel aperture of a subpixel of the first color includes a first region and a second region. A ratio of a first area of the first region to a second area of the second region is in a range of 2:8 to 8:2.

19 Claims, 36 Drawing Sheets

Related U.S. Application Data 2020, now Pat. No. 12,052,889, which is a continuation-in-part of application No. PCT/CN2020/121752, filed on Oct. 19, 2020.

(51) Int. Cl.
  *H10K 59/122* (2023.01)
  *H10K 59/131* (2023.01)
  *H10K 59/35* (2023.01)
  *H10K 59/80* (2023.01)

(52) U.S. Cl.
  CPC ......... *H10K 59/122* (2023.02); *H10K 59/131* (2023.02); *H10K 59/351* (2023.02); *H10K 59/353* (2023.02); *H10K 59/8051* (2023.02); *H10K 59/80515* (2023.02)

(56) References Cited

U.S. PATENT DOCUMENTS

| | | |
|---|---|---|
| 2009/0091254 A1 | 4/2009 | Jeong et al. |
| 2012/0298983 A1 | 11/2012 | Chang et al. |
| 2014/0284570 A1 | 9/2014 | Jinta et al. |
| 2015/0206930 A1 | 7/2015 | Liu |
| 2017/0317156 A1 | 11/2017 | Kim et al. |
| 2018/0197932 A1 | 7/2018 | Ho |
| 2018/0261663 A1 | 9/2018 | Li et al. |
| 2018/0277040 A1 | 9/2018 | Lee et al. |
| 2018/0315801 A1* | 11/2018 | Matsueda .......... H10K 59/1315 |
| 2019/0206955 A1 | 7/2019 | Paek et al. |
| 2020/0119120 A1 | 4/2020 | Feng et al. |
| 2020/0211473 A1 | 7/2020 | Kim et al. |
| 2020/0328264 A1 | 10/2020 | Wu et al. |
| 2021/0134232 A1 | 5/2021 | Ueno |
| 2021/0151470 A1 | 5/2021 | Cho et al. |
| 2021/0225293 A1 | 7/2021 | Wang |
| 2022/0115480 A1 | 4/2022 | Park et al. |

FOREIGN PATENT DOCUMENTS

| | | |
|---|---|---|
| CN | 103762223 A | 4/2014 |
| CN | 104078001 A | 10/2014 |
| CN | 108010944 A | 5/2018 |
| CN | 108133952 A | 6/2018 |
| CN | 108155213 A | 6/2018 |
| CN | 108305888 A | 7/2018 |
| CN | 108461529 A | 8/2018 |
| CN | 108666345 A | 10/2018 |
| CN | 108695370 A | 10/2018 |
| CN | 108933155 A | 12/2018 |
| CN | 109873012 A | 6/2019 |
| CN | 110268465 A | 9/2019 |
| CN | 110335564 A | 10/2019 |
| CN | 110610684 A | 12/2019 |
| CN | 111028717 A | 4/2020 |
| CN | 111463255 A | 7/2020 |
| CN | 111627926 A | 9/2020 |
| CN | 111724736 A | 9/2020 |
| WO | 2019186865 A1 | 10/2019 |
| WO | 2020111420 A1 | 6/2020 |

OTHER PUBLICATIONS

International Search Report & Written Opinion mailed Jul. 19, 2021, regarding PCT/CN2020/121752.
Non-Final Office Action in the U.S. Appl. No. 17/428,969, dated Nov. 3, 2023.
Response to Non-Final Office Action in the U.S. Appl. No. 17/428,969, dated Dec. 26, 2023.
Notice of Allowance in the U.S. Appl. No. 17/428,969, dated Feb. 8, 2024.
Non-Final Office Action in the U.S. Appl. No. 17/428,631, dated Feb. 29, 2024.
Response to Non-Final Office Action in the U.S. Appl. No. 17/428,631, dated Apr. 30, 2024.
Notice of Allowance in the U.S. Appl. No. 17/428,631, dated May 22, 2024.
First Office Action in the Chinese Patent Application No. 202080002798.7, dated Mar. 5, 2025; English translation attached.

* cited by examiner

ARRAY SUBSTRATE AND DISPLAY APPARATUS

CROSS-REFERENCE TO RELATED APPLICATION

This application is a continuation of U.S. application Ser. No. 17/428,631, filed Oct. 19, 2020, which is a national stage application under 35 U.S.C. § 371 of International Application No. PCT/CN2020/121752, filed Oct. 19, 2020. Each of the forgoing applications is herein incorporated by reference in its entirety for all purposes.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of first type data lines and a plurality of second type data lines; wherein a respective one of the plurality of first type data lines crosses over subpixel apertures of multiple subpixels of a first color, and does not crosses over subpixel apertures of any subpixel of a second color and does not crosses over subpixel apertures of any subpixel of a third color, the first color, the second color, and the third color being three different colors; a respective one of the plurality of second type data line does not cross over any subpixel aperture; a first plane containing an orthographic projection of the respective one of the plurality of first type data lines on a second plane containing a surface of a pixel definition layer divides a respective subpixel aperture of a subpixel of the first color into a first region and a second region, the first plane orthogonal to the second plane; and a ratio of a first area of the first region to a second area of the second region is in a range of 2:8 to 8:2.

Optionally, a ratio of a total number of the plurality of first type data lines to a total number of the plurality of second type data lines is in a range of 0.2 to 4.

Optionally, the array substrate further comprises a first anode of a first light emitting element, the first anode comprising a main portion and a protrusion protruding along a first direction from a side of the main portion; and an orthographic projection of the protrusion on the base substrate at least partially overlaps with an orthographic projection of a semiconductor material portion of a third transistor on the base substrate, the semiconductor material portion extending along the first direction.

Optionally, an orthographic projection of the protrusion on the base substrate at least partially overlaps with an orthographic projection of a gate electrode of a third transistor on the base substrate.

Optionally, the array substrate further comprises a second anode of a second light emitting element, the second anode comprising a main portion and a protrusion protruding along a second direction from a side of the main portion; and an orthographic projection of the protrusion on the base substrate at least partially overlaps with an orthographic projection of a semiconductor material portion of a third transistor on the base substrate, the semiconductor material portion extending along the first direction.

Optionally, the array substrate further comprises a third anode of a third light emitting element, the third anode comprising a main portion, a first protrusion and a second protrusion respectively protruding along a first direction from two sides of the main portion; the first protrusion and the second protrusion are on a same side of a gate line controlling a third transistor; a ratio of a first dimension of the first protrusion along the second direction to a second dimension of the second protrusion along the second direction is in a range of 0.1 to 8.0; and a ratio of a first area of the first protrusion to a second area of the second protrusion is in a range of 0.1 to 8.0.

Optionally, a ratio of a first area of the first protrusion to a main area of the main portion is in a range of 0.01 to 0.1; a ratio of a second area of the second protrusion to a main area of the main portion is in a range of 0.02 to 0.2; and the second rea of the second protrusion is greater than the first area of the first protrusion.

Optionally, an orthographic projection of the first protrusion on the base substrate at least partially overlaps with an orthographic projection of a first semiconductor material portion of a third transistor in a first adjacent subpixel on the base substrate, the first semiconductor material portion extending along the first direction; and an orthographic projection of the first protrusion on the base substrate at least partially overlaps with an orthographic projection of a second semiconductor material portion of the third transistor in a second adjacent subpixel on the base substrate, the second semiconductor material portion extending along the first direction, the first adjacent subpixel and the second adjacent subpixel directly adjacent to each other.

Optionally, shortest distances between a subpixel aperture and edges of an anode other than an edge wherein the anode connects to an anode contact pad are non-uniform; wherein a light emitting layer connects to the anode through the subpixel aperture extending through a pixel definition layer.

Optionally, the array substrate comprises a first transistor in a pixel driving circuit in a present stage; a sixth transistor in a second pixel driving circuit in a previous stage, wherein the first transistor and the sixth transistor are commonly controlled by a same reset control signal line; a plurality of first reset signal lines; and an initialization connecting line connecting the respective one of the plurality of first reset signal lines and a source electrode of the first transistor, the respective one of the plurality of first reset signal lines configured to provide a reset signal to the source electrode of the first transistor, through the initialization connecting line; wherein the initialization connecting line is on a same side of active layers or gate electrodes of the first transistor and the sixth transistor along a first direction.

Optionally, the array substrate further comprises a first planarization layer; a first data line and a balancing block on the first planarization layer, wherein the balancing block being electrically connected to a respective one of the plurality of voltage supply lines through a via extending through the first planarization layer; a second planarization layer on a side of the first data line and the balancing block away from the first planarization layer; a first anode of a first light emitting element on a side of the second planarization layer away from the first planarization layer; and a pixel definition layer on a side of the first anode away from the second planarization layer, and defining a respective first subpixel aperture; wherein an orthographic projection of the first anode on a base substrate at least partially overlaps with an orthographic projection of the balancing block on the base substrate and at least partially overlaps with an orthographic projection of the first data line on the base substrate.

Optionally, along the first direction, orthographic projections of the first data line and the balancing block on the base substrate are respectively on two opposite sides of an orthographic projection of the respective first subpixel aperture on the base substrate; and the orthographic projection of the respective first subpixel aperture on the base substrate is non-overlapping with the orthographic projection of the first data line on the base substrate, and is also non-overlapping with the orthographic projection of the balancing block on the base substrate.

Optionally, the first anode comprises a main portion and a protrusion protruding along a first direction from a side of the main portion; an orthographic projection of the protrusion on the base substrate at least partially overlaps with an orthographic projection of a semiconductor material portion of a third transistor on the base substrate, the semiconductor material portion extending along the first direction; an orthographic projection of the main portion on the base substrate at least partially overlaps with the orthographic projection of the first data line on the base substrate, and also at least partially overlaps with the orthographic projection of the balancing block on the base substrate; and an orthographic projection of the protrusion on the base substrate at least partially overlaps with the orthographic projection of the balancing block on the base substrate.

Optionally, the array substrate comprises a base substrate; a plurality of data lines; a plurality of light emitting elements respectively in a plurality of subpixels; and a pixel definition layer on the base substrate, the pixel definition layer defining a plurality of subpixel apertures; wherein the plurality of light emitting elements comprise a first light emitting element in a respective first subpixel, a second light emitting element in a respective second subpixel, a third light emitting element in a respective third subpixel, and a fourth light emitting element in a respective fourth subpixel; the plurality of subpixel apertures comprise a respective first subpixel aperture, a respective second subpixel aperture, a respective third subpixel aperture, a respective fourth subpixel aperture respectively extending through the pixel definition layer; a first light emitting layer of the first light emitting element is connected to a first anode of the first light emitting element through the respective first subpixel aperture; a second light emitting layer of the second light emitting element is connected to a second anode of the second light emitting element through the respective second subpixel aperture; a third light emitting layer of the third light emitting element is connected to a third anode of the third light emitting element through the respective third subpixel aperture; a fourth light emitting layer of the fourth light emitting element is connected to a fourth anode of the fourth light emitting element through the respective fourth subpixel aperture; each of the respective first subpixel aperture, the respective second subpixel aperture, and the respective fourth subpixel aperture is not crossed over by any data line; and the respective third subpixel aperture is crossed over by one of the plurality of data lines.

Optionally, the plurality of subpixel apertures comprise a plurality of minimum repeating units, a respective one of the plurality of minimum repeating units comprising the respective first subpixel aperture, the respective second subpixel aperture, the respective third subpixel aperture, and the respective fourth subpixel aperture; the plurality of data lines comprise a plurality of repeating groups of data lines, a respective group of the plurality of repeating groups of data lines comprising a first data line, a second data line, a third data line, and a fourth data line consecutively arranged, and respectively configured to provide data signals respectively to the respective first subpixel, the respective second subpixel, the respective third subpixel, and the respective fourth subpixel; and the fourth data line crosses over the respective third subpixel aperture.

Optionally, the respective first subpixel aperture, the respective second subpixel aperture, the respective third subpixel aperture, and the respective fourth subpixel aperture in the respective one of the plurality of minimum repeating units are consecutively arranged along a row; the first data line, the second data line, the third data line, and the fourth data line are consecutively arranged along the row; the respective first subpixel aperture is between the first data line and the second data line; the respective second subpixel aperture is between the second data line and the third data line; the respective third subpixel aperture is crossed over by the fourth data line; and the respective fourth subpixel aperture is on a side of the fourth data line away from the third data line.

Optionally, the respective first subpixel aperture, the respective second subpixel aperture, the respective third subpixel aperture, and the respective fourth subpixel aperture are in a first minimum repeating unit in a first row of two nearest adjacent rows; a second minimum repeating unit in a second row of the two nearest adjacent rows, along a first direction, has a displacement of twice of an inter-data line distance with respect to the first minimum repeating unit, the inter-data line distance being a shortest distance between two nearest data lines along the first direction; the second minimum repeating unit in the second row comprises a second respective first subpixel aperture, a second respective second subpixel aperture, a second respective third subpixel aperture, and a second respective fourth subpixel aperture consecutively arranged along the row; and the second data line crosses over the second respective second subpixel aperture in the second row.

Optionally, a first plane containing an orthographic projection of the fourth data line on a second plane containing a surface of the pixel definition layer divides the respective third subpixel aperture into a first region and a second region, the first plane orthogonal to the second plane; and a ratio of a first area of the first region to a second area of the second region is in a range of 2:8 to 8:2.

Optionally, the ratio of the first area of the first region to the second area of the second region is in a range of 1:1.5 to 1.5:1; and the respective third subpixel aperture has a substantially mirror symmetry with respect to a plane perpendicular to the pixel definition layer and intersecting with the orthographic projection of the fourth data line on the pixel definition layer.

Optionally, the fourth data line crosses over the third anode; an orthographic projection of the fourth data line on the third anode divides the third anode into a first anode region and a second anode region; and a ratio of a first area of the first anode region to a second area of the second anode region is in a range of 2:8 to 8:2.

Optionally, an area of an orthographic projection of any data line on the second anode is smaller than an area of an orthographic projection of any data line on the first anode and smaller than an area of an orthographic projection of any data line on the third anode; and an area of an orthographic projection of any data line on the fourth anode is smaller than an area of an orthographic projection of any data line on the first anode and smaller than an area of an orthographic projection of any data line on the third anode.

Optionally, an edge of the second anode is at least partially covered by an orthographic projection of a data line adjacent to the edge of the second anode on the second anode; and an edge of the fourth anode is at least partially covered by an orthographic projection of a data line adjacent to the edge of the fourth anode on the fourth anode.

Optionally, an edge of the first anode is at least partially covered by an orthographic projection of a data line adjacent to the edge of the first anode on the first anode.

Optionally, a minimum repeating unit of the plurality of subpixels of the array substrate comprises the respective first subpixel, the respective second subpixel, the respective third subpixel, and the respective fourth subpixel; the respective second subpixel and the respective fourth subpixel are subpixels of a same color, which is different from a color of the respective first subpixel and different from a color of the respective third subpixel; the second light emitting element and the fourth light emitting element are light emitting elements of a same color, which is different from a color of the first light emitting element and different from a color of the third light emitting element; the first anode, the second anode, and the third anode have different areas and different shapes; and the first anode, the third anode, and the fourth anode have different areas and different shapes.

Optionally, the second anode and the fourth anode are anodes of two light emitting elements of the same color; the second anode comprises a first main portion and a first extra portion and a second extra portion; the fourth anode comprises a second main portion and a third extra portion; the first main portion is a combination of a rectangle part and a triangle part; the second main portion is a combination of a rectangle part and a triangle part; the first main portion and the second main portion have substantially same shape; the first extra portion abuts the triangle part of the first main portion; the second extra portion abuts a side of the rectangle part of the first main portion away from the triangle part of the first main portion; the third extra portion abuts the triangle part of the second main portion; the first extra portion, the first main portion, the second extra portion, are sequentially arranged along a direction substantially parallel to the plurality of data lines; and the second main portion and the third extra portion are sequentially arranged along a direction substantially parallel to the plurality of data lines.

Optionally, the array substrate further comprises a first anode of a first light emitting element, the first anode comprising a main portion, and a protrusion protruding along a first direction from a side of the main portion; and an orthographic projection of the protrusion on the base substrate at least partially overlaps with an orthographic projection of a semiconductor material portion of a third transistor on a base substrate, the semiconductor material portion extending along the first direction.

Optionally, the array substrate further comprises a second anode of a second light emitting element, the second anode comprising a main portion, and a protrusion protruding along a second direction from a side of the main portion away from a portion wherein the second anode connects to an anode contact pad; and an orthographic projection of the protrusion on the base substrate at least partially overlaps with an orthographic projection of a semiconductor material portion of a third transistor on the base substrate, the semiconductor material portion extending along the first direction.

Optionally, the array substrate further comprises a third anode of a third light emitting element, the third anode comprising a main portion, a first protrusion and a second protrusion respectively protruding along a first direction from two sides of the main portion; orthographic projections of the first protrusion and the second protrusion on a plane parallel to a second direction and intersecting the anode substantially overlap with each other; a ratio of a first dimension of the first protrusion along the second direction to a second dimension of the second protrusion along the second direction is in a range of 0.1 to 8.0; and a ratio of a first area of the first protrusion to a second area of the second protrusion is in a range of 0.1 to 8.0.

Optionally, an orthographic projection of the first protrusion on the base substrate at least partially overlaps with an orthographic projection of a first semiconductor material portion of a third transistor in a first adjacent subpixel on the base substrate, the first semiconductor material portion extending along the first direction; and an orthographic projection of the first protrusion on the base substrate at least partially overlaps with an orthographic projection of a second semiconductor material portion of the third transistor in a second adjacent subpixel on the base substrate, the second semiconductor material portion extending along the first direction, the first adjacent subpixel and the second adjacent subpixel directly adjacent to each other.

Optionally, the array substrate further comprises a plurality of pixel driving circuits respectively in the plurality of subpixels configured to respectively drive the plurality of light emitting elements, wherein a respective one of the plurality of pixel driving circuits comprises a plurality of transistors, and a storage capacitor comprising a first capacitor electrode, a second capacitor electrode electrically connected to a respective voltage supply line, and an insulating layer between the first capacitor electrode and the second capacitor electrode; a semiconductor material layer on the base substrate; and a node connecting line in a same layer as the respective voltage supply line, connected to the first capacitor electrode through a first main via, and connected to the semiconductor material layer through a second main via; wherein an orthographic projection of a first anode of the first light emitting element in the respective first subpixel on the base substrate at least partially overlaps with an orthographic projection of the node connecting line in the respective first subpixel on the base substrate; an orthographic projection of a second anode of the second light emitting element in the respective second subpixel on the base substrate at least partially overlaps with an orthographic projection of the node connecting line in the respective second subpixel on the base substrate; and an orthographic projection of a third anode of the third light emitting element in the respective third subpixel on the base substrate at least partially overlaps with an orthographic projection of the node connecting line in the respective third subpixel on the base substrate, at least partially overlaps with an orthographic projection of the node connecting line in the respective fourth subpixel on the base substrate.

Optionally, the orthographic projection of the first anode in the respective first subpixel on the base substrate covers an orthographic projection of a portion of the node connecting line at a position connecting to a first capacitor electrode in the respective first subpixel on the base substrate; the orthographic projection of the second anode in the respective second subpixel on the base substrate covers an orthographic projection of a portion of the node connecting line at a position connecting to a first capacitor electrode in the respective second subpixel on the base substrate; and the orthographic projection of the third anode in the respective third subpixel on the base substrate covers an orthographic projection of a portion of the node connecting line at a position connecting to a first capacitor electrode in the respective fourth subpixel on the base substrate, and partially overlaps with an orthographic projection of a portion of the node connecting line at a position connecting to a first capacitor electrode in the respective third subpixel on the base substrate.

Optionally, the orthographic projection of the third anode on the base substrate at least partially overlaps with an orthographic projection of a third transistor in the respective third subpixel on the base substrate and at least partially overlaps with an orthographic projection of a third transistor in the respective fourth subpixel adjacent to the respective third subpixel on the base substrate.

Optionally, the orthographic projection of the third anode on the base substrate at least partially overlaps with an orthographic projection of an active layer of the third transistor in the respective third subpixel on the base substrate, at least partially overlaps with an orthographic projection of a source electrode of a third transistor in the respective fourth subpixel on the base substrate, and at least partially overlaps with an orthographic projection of an active layer of the third transistor in the respective fourth subpixel on the base substrate.

Optionally, the orthographic projection of the first anode on the base substrate at least partially overlaps with an orthographic projection of a third transistor in the respective first subpixel on the base substrate.

Optionally, the orthographic projection of the first anode on the base substrate covers an orthographic projection of a source electrode of the third transistor in the respective first subpixel on the base substrate, and at least partially overlaps with an orthographic projection of an active layer of the third transistor in the respective first subpixel on the base substrate.

Optionally, the orthographic projection of the second anode on the base substrate at least partially overlaps with an orthographic projection of a third transistor in the respective second subpixel on the base substrate.

Optionally, the orthographic projection of the second anode on the base substrate at least partially overlaps with an orthographic projection of an active layer of the third transistor in the respective second subpixel on the base substrate.

Optionally, the array substrate further comprises a semiconductor material layer on the base substrate; a gate insulating layer on a side of the semiconductor material layer away from the base substrate; an insulating layer on a side of the gate insulating layer away from the base substrate; an inter-layer dielectric layer on a side of the insulating layer away from the gate insulating layer; a relay electrode layer on a side of the inter-layer dielectric layer away from the insulating layer; a first planarization layer on a side of the relay electrode layer away from the inter-layer dielectric layer; an anode contact pad layer on a side of the first planarization layer away from the inter-layer dielectric layer; and a second planarization layer on side of the anode contact pad layer away from the first planarization layer; wherein the pixel definition layer is on a side of the second planarization layer away from the base substrate; wherein respective anodes are on a side of the second planarization layer away from the first planarization layer; and respective light emitting layers are on a side of the respective anodes away from the second planarization layer; wherein, in the respective first subpixel, the first anode is connected to a first anode contact pad through a first via extending through the second planarization layer; in the respective second subpixel, the second anode is connected to a second anode contact pad through a second via extending through the second planarization layer; in the respective third subpixel, the third anode is connected to a third anode contact pad through a third via extending through the second planarization layer; and in a respective fourth subpixel, the fourth anode is connected to a fourth anode contact pad through a fourth via extending through the second planarization layer.

Optionally, the array substrate further comprises a plurality of voltage supply lines respectively extending along a second direction; wherein a respective one of the plurality of voltage supply lines comprises a first inclined portion, a second inclined portion, a first parallel portion connecting the first inclined portion and the second inclined portion, a second parallel portion connected to the first parallel portion through the second inclined portion; the first parallel portion and the second parallel portion respectively extend along a direction substantially parallel to the second direction; the first inclined portion extends along a first inclined angle with respect to the first direction; the second inclined portion extends along a second inclined angle with respect to the first direction; the first inclined angle and the second inclined angle are supplementary angles; central lines of the first parallel portion and the second parallel portion respectively along the direction substantially parallel to the second direction are spaced apart by a width greater than zero; the respective one of the plurality of voltage supply lines comprises a repeating pattern of the first inclined portion, the first parallel portion, the second inclined portion, the second parallel portion sequentially connected; first parallel portions in the respective one of the plurality of voltage supply lines are aligned along a first aligned direction substantially parallel to the second direction; second parallel portions in the respective one of the plurality of voltage supply lines are aligned along a second aligned direction substantially parallel to the second direction; and the first parallel portion and the second inclined portion, in combination, surround one side of the connecting portion, which is connected to a respective one of the plurality of data lines through a via extending through the first planarization layer, and connected to a source electrode of the second transistor through a via extending through the inter-layer dielectric layer, the insulating layer, and the gate insulating layer.

Optionally, the array substrate further comprises a plurality of voltage supply lines respectively extending along a second direction; and an interference preventing block in a same layer as the second capacitor electrode, the respective one of the plurality of voltage supply lines connected to the interference preventing block through a third main via; wherein the interference preventing block comprises a base, a first arm, and a second arm; the respective one of the plurality of voltage supply lines is connected to the base through the third main via; the first arm comprises a first tip portion and a first connecting bridge portion connecting the base and the first tip portion; the second arm comprises a second tip portion, and a second connecting bridge portion connecting the base and the second tip portion; the first tip portion and the first connecting bridge portion are arranged along a direction substantially parallel to the second direction; the second tip portion and the second connecting bridge portion are arranged along a direction substantially parallel to the second direction; a longitudinal side of the base is along a direction substantially parallel to the first direction; a lateral side of the base is along a direction substantially parallel to the second direction; the base has a substantially rectangular shape; the first tip portion has a substantially rectangular shape; the second tip portion has a substantially rectangular shape; the first connecting bridge portion has a pseudo triangular shape; and the second connecting bridge portion has a triangular shape.

Optionally, the respective one of the plurality of pixel driving circuits further comprises a driving transistor; the orthographic projection of the first anode in a respective first subpixel on the base substrate at least partially overlaps with an orthographic projection of the second capacitor electrode in the respective first subpixel on the base substrate; an orthographic projection of the second anode in a respective second subpixel on the base substrate at least partially overlaps with an orthographic projection of the second capacitor electrode in the respective second subpixel on the base substrate; and an orthographic projection of the third anode in a respective third subpixel on the base substrate at least partially overlaps with an orthographic projection of the second capacitor electrode in the respective third subpixel on the base substrate; and the orthographic projection of the first anode in a respective first subpixel on the base substrate at least partially overlaps with an orthographic projection of an active layer of a driving transistor in the respective first subpixel on the base substrate; an orthographic projection of the second anode in a respective second subpixel on the base substrate at least partially overlaps with an orthographic projection of the active layer of the driving transistor in the respective second subpixel on the base substrate; an orthographic projection of the third anode in a respective third subpixel on the base substrate at least partially overlaps with an orthographic projection of the active layer of the driving transistor in the respective third subpixel on the base substrate; and an orthographic projection of the fourth anode in a respective fourth subpixel on the base substrate is non-overlapping with an orthographic projection of the active layer of the driving transistor in the respective fourth subpixel on the base substrate.

In one aspect, the present disclosure provides a display apparatus, comprising the array substrate described herein or fabricated by a method described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
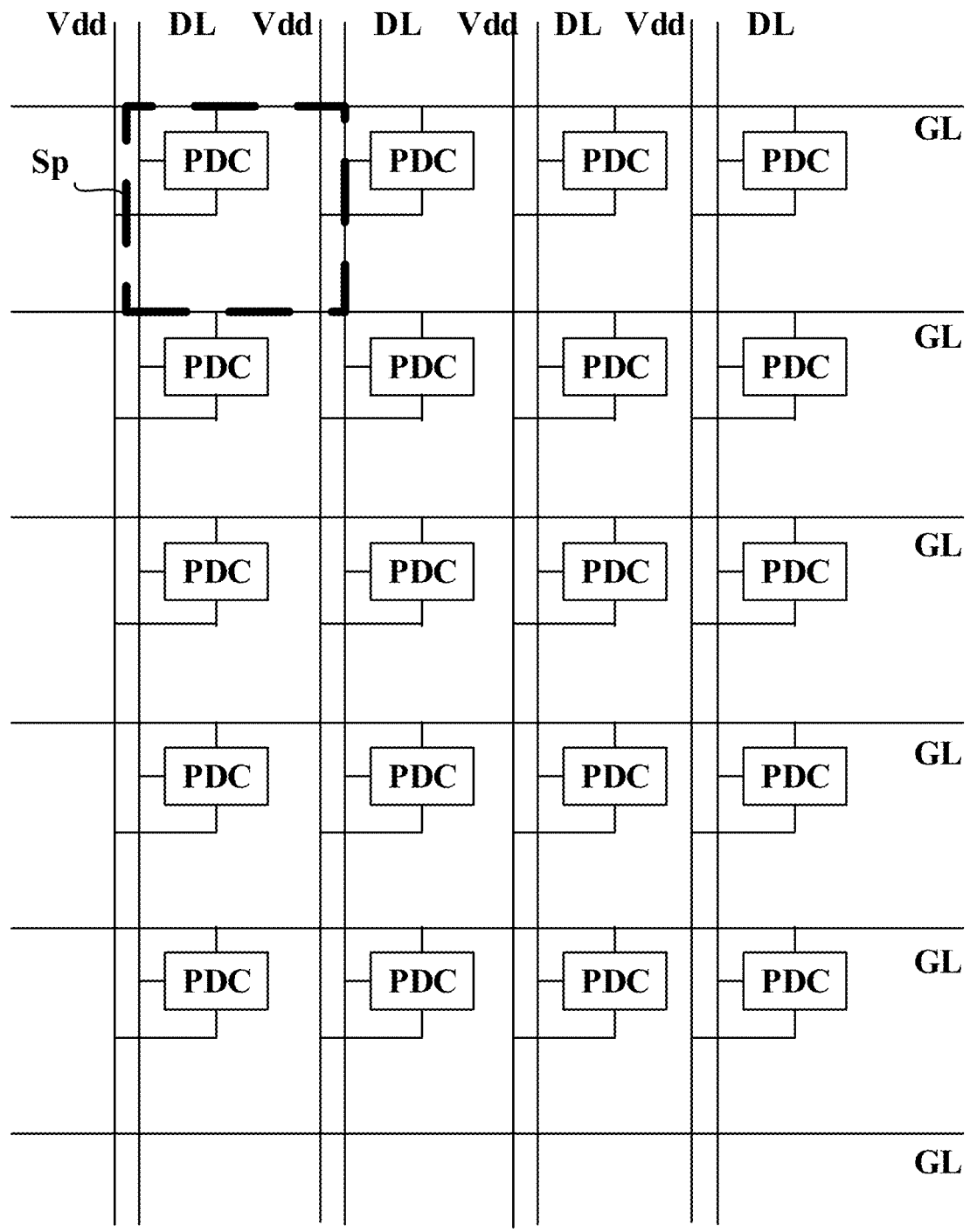
FIG. 1 is a plan view of an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of first type data lines and a plurality of second type data lines. Optionally, a respective one of the plurality of first type data lines crosses over subpixel apertures of multiple subpixels of a first color, and does not crosses over subpixel apertures of any subpixel of a second color and does not crosses over subpixel apertures of any subpixel of a third color, the first color, the second color, and the third color being three different colors; and a respective one of the plurality of second type data line does not cross over any subpixel aperture. Optionally, a first plane containing an orthographic projection of the respective one of the plurality of first type data lines on a second plane containing a surface of a pixel definition layer divides a respective subpixel aperture of a subpixel of the first color into a first region and a second region, the first plane orthogonal to the second plane. Optionally, a ratio of a first area of the first region to a second area of the second region is in a range of 2:8 to 8:2. Optionally, a ratio of a total number of the plurality of first type data lines to a total number of the plurality of second type data lines is in a range of 0.2 to 4, e.g., 0.3 to 3.

In some embodiments, the array substrate includes a base substrate; a plurality of data lines; a plurality of light emitting elements respectively in a plurality of subpixels; a pixel definition layer on the base substrate, and the pixel definition layer defining a plurality of subpixel apertures. Optionally, the plurality of light emitting elements comprise a first light emitting element in a respective first subpixel, a second light emitting element in a respective second subpixel, a third light emitting element in a respective third subpixel, and a fourth light emitting element in a respective fourth subpixel. Optionally, the plurality of subpixel apertures comprise a respective first subpixel aperture, a respective second subpixel aperture, a respective third subpixel aperture, a respective fourth subpixel aperture respectively extending through the pixel definition layer. Optionally, a first light emitting layer of the first light emitting element connected to a first anode of the first light emitting element through the respective first subpixel aperture. Optionally, a second light emitting layer of the second light emitting element connected to a second anode of the second light emitting element through the respective second subpixel aperture. Optionally, a third light emitting layer of the third light emitting element connected to a third anode of the third light emitting element through the respective third subpixel aperture. Optionally, a fourth light emitting layer of the fourth light emitting element connected to a fourth anode of the fourth light emitting element through the respective fourth subpixel aperture. Optionally, each of the respective first subpixel aperture, the respective second subpixel aperture, and the respective fourth subpixel aperture is not crossed over by any data line. Optionally, the respective third subpixel aperture is crossed over by one of the plurality of data lines.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a pixel driving circuit PDC. The array substrate includes a plurality of gate lines GL, a plurality of data lines DL, a plurality of voltage supply lines Vdd (e.g., high voltage supply lines), and a plurality of second voltage supply lines (e.g., low voltage supply lines Vss). Light emission in a respective one of the subpixels Sp is driven by a pixel driving circuit PDC. In one example, a high voltage signal (e.g., a VDD signal) is input, through a respective one of the plurality of voltage supply lines Vdd, to the pixel driving circuit PDC connected to an anode of the light emitting element; a low voltage signal (e.g., a VSS signal) is input, through a respective one of the plurality of second voltage supply lines (e.g., a low voltage supply line Vss), to a cathode of the light emitting element. A voltage difference between the high voltage signal (e.g., the VDD signal) and the low voltage signal (e.g., the VSS signal) is a driving voltage $\Delta V$ that drives light emission in the light emitting element.

Various appropriate pixel driving circuits may be used in the present array substrate. Examples of appropriate driving circuits include 3T1C, 2T1C, 4T1C, 4T2C, 5T2C, 6T1C, 7T1C, 7T2C and 8T2C. In some embodiments, the respective one of the plurality of pixel driving circuits is a 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 2B:
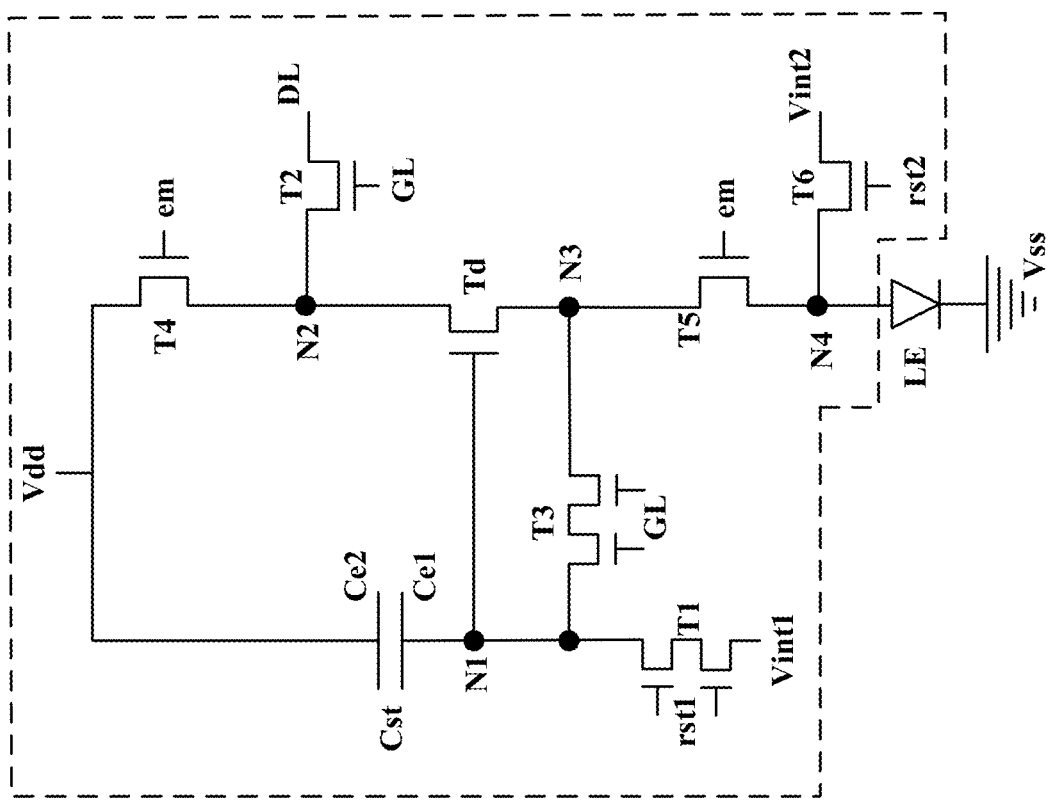
FIG. 2B is a circuit diagram illustrating the structure of a pixel driving circuit in some embodiments according to the present disclosure.
Figure 2A:
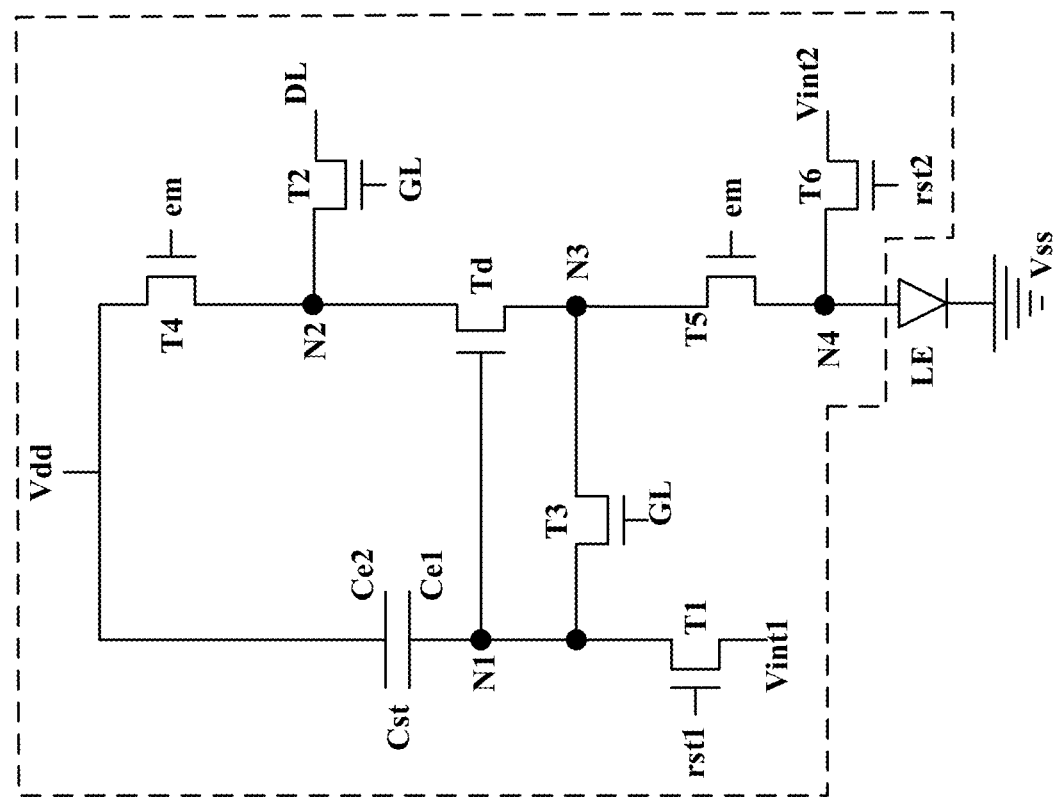
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2, in some embodiments, the pixel driving circuit includes a driving transistor Td; a storage capacitor Cst having a first capacitor electrode Ce1 and a second capacitor electrode Ce2; a first transistor T1 having a gate electrode connected to a respective one of the plurality of first reset control signal lines rst1, a source electrode connected to a respective one of the plurality of first reset signal lines Vint1, and a drain electrode connected to a first capacitor electrode Ce1 of the storage capacitor Cst and a gate electrode of the driving transistor Td; a second transistor T2 having a gate electrode connected to a gate line GL, a source electrode connected to the data line DL, and a drain electrode connected to a source electrode of the driving transistor Td; a third transistor T3 having a gate electrode connected to the gate line GL, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective one of the plurality of light emitting control signal lines cm, a source electrode connected to a respective one of a plurality of voltage supply lines Vdd, and a drain electrode connected to the source electrode of the driving transistor Td and the drain electrode of the second transistor T2; a fifth transistor T5 having a gate electrode connected to the respective one of the plurality of light emitting control signal lines em, a source electrode connected to drain electrodes of the driving transistor Td and the third transistor T3, and a drain electrode connected to an anode of a light emitting element LE; and a sixth transistor T6 having a gate electrode connected to a respective one of the plurality of second reset control signal lines rst2, a source electrode connected to a respective one of the plurality of second reset signal lines Vint2, and a drain electrode connected to the drain electrode of the fifth transistor and the anode of the light emitting element LE. The second capacitor electrode Ce2 is connected to the respective one of the plurality of voltage supply lines Vdd and the source electrode of the fourth transistor T4.

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

Figure 3A:
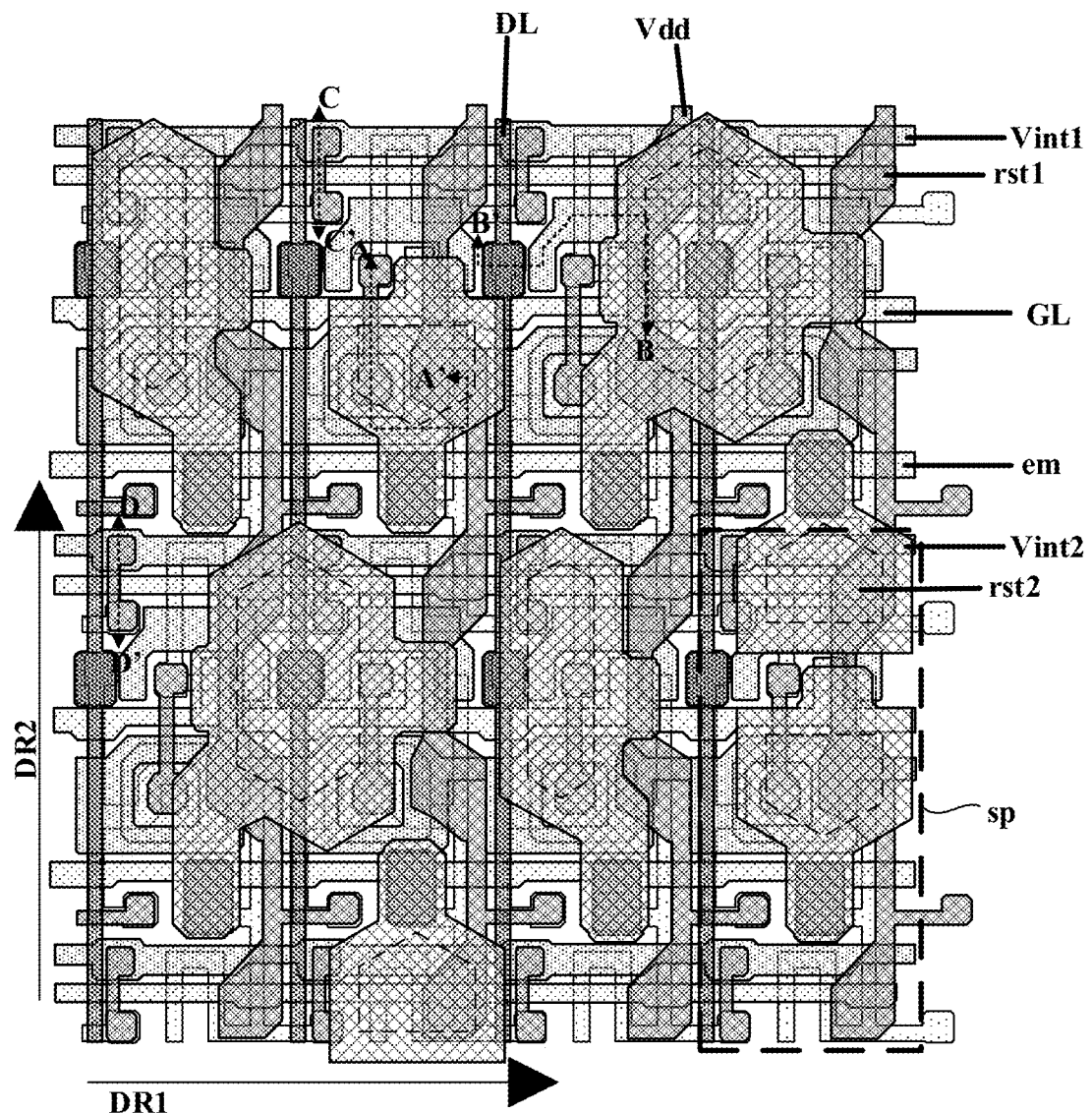
FIG. 3A is a diagram illustrating the structure of a plurality of subpixels of an array substrate in some embodiments according to the present disclosure.
Figure 3B:
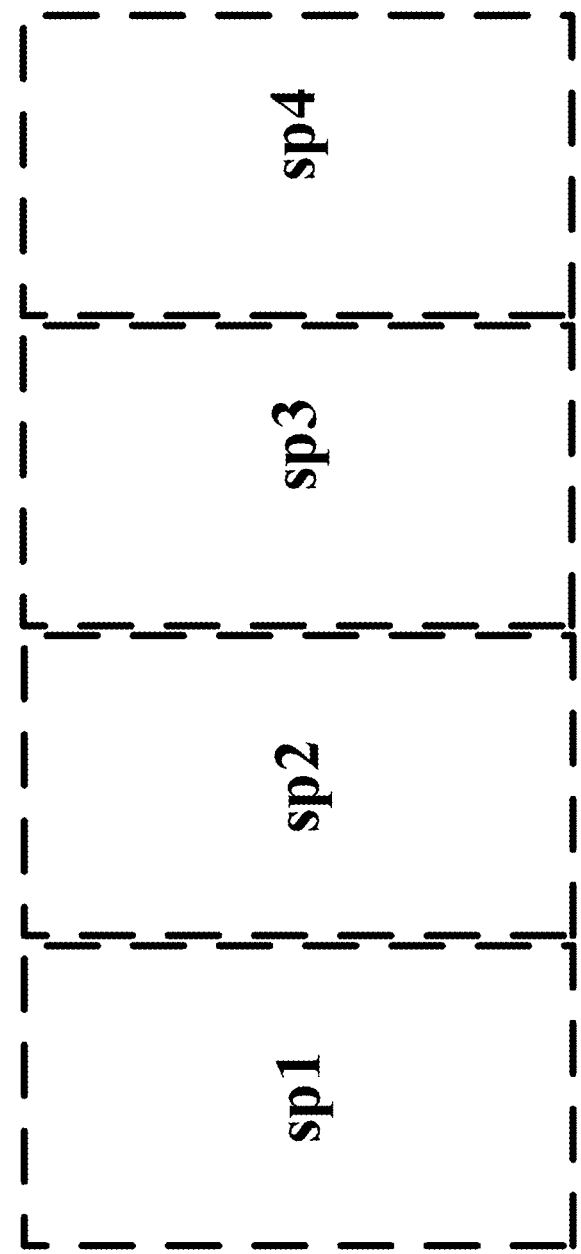
FIG. 3B is a schematic diagram illustrating a subpixel arrangement of a plurality of subpixels of an array substrate in an array substrate in some embodiments according to the present disclosure.

FIG. 3A is a diagram illustrating the structure of a plurality of subpixels of an array substrate in some embodiments according to the present disclosure. FIG. 3B is a schematic diagram illustrating a subpixel arrangement of a plurality of subpixels of an array substrate in an array substrate in some embodiments according to the present disclosure. Referring to FIG. 3A and FIG. 3B, the array substrate in some embodiments includes a plurality of subpixels. In some embodiments, the plurality of subpixels includes a respective first subpixel sp1, a respective second subpixel sp2, a respective third subpixel sp3, and a respective fourth subpixel sp4. Optionally, a respective pixel of the array substrate includes the respective first subpixel sp1, the respective second subpixel sp2, the respective third subpixel sp3, and the respective fourth subpixel sp4. The plurality of subpixels in the array substrate are arranged in an array. In one example, the array of the plurality of subpixels includes a S1-S2-S3-S4 format repeating array, in which S1 stands for the respective first subpixel sp1, S2 stands for the respective second subpixel sp2, S3 stands for the respective third subpixel sp3, and S4 stands for the respective fourth subpixel sp4. In another example, the S1-S2-S3-S4 format is a C1-C2-C3-C4 format, in which C1 stands for the respective first subpixel sp1 of a first color, C2 stands for the respective second subpixel sp2 of a second color, C3 stands for the respective third subpixel sp3 of a third color, and C4 stands for the respective fourth subpixel sp4 of a fourth color. In another example, the S1-S2-S3-S4 format is a C1-C2-C3-C2' format, in which C1 stands for the respective first subpixel sp1 of a first color, C2 stands for the respective second subpixel sp2 of a second color, C3 stands for the respective third subpixel sp3 of a third color, and C2' stands for the respective fourth subpixel sp4 of the second color. In another example, the C1-C2-C3-C2' format is a R-G-B-G format, in which the respective first subpixel sp1 is a red subpixel, the respective second subpixel sp2 is a green subpixel, the respective third subpixel sp3 is a blue subpixel, and the respective fourth subpixel sp4 is a green subpixel.

As depicted in FIG. 3A and FIG. 3B, in some embodiments, a minimum repeating unit of the plurality of subpixels of the array substrate includes the respective first subpixel sp1, the respective second subpixel sp2, the respective third subpixel sp3, and the respective fourth subpixel sp4. FIG. 3A shows a total of eight subpixels of the plurality of subpixels sp arranged adjacent to each other. Each of the respective first subpixel sp1, the respective second subpixel sp2, the respective third subpixel sp3, and the respective fourth subpixel sp4, includes the first transistor T1, the second transistor T2, the third transistor T3, the fourth transistor T4, the fifth transistor T5, the sixth transistor T6, and the driving transistor Td. In some embodiments, the plurality of subpixels sp are arranged in an array of a plurality of rows along a first direction DR1 and a plurality of columns along a second direction DR2. Optionally, the first direction DR1 is perpendicular to the second direction DR2. Optionally, the first direction DR1 and the second direction DR2 cross over each other at an angle not equal to 90 degrees.

Figure 3C:
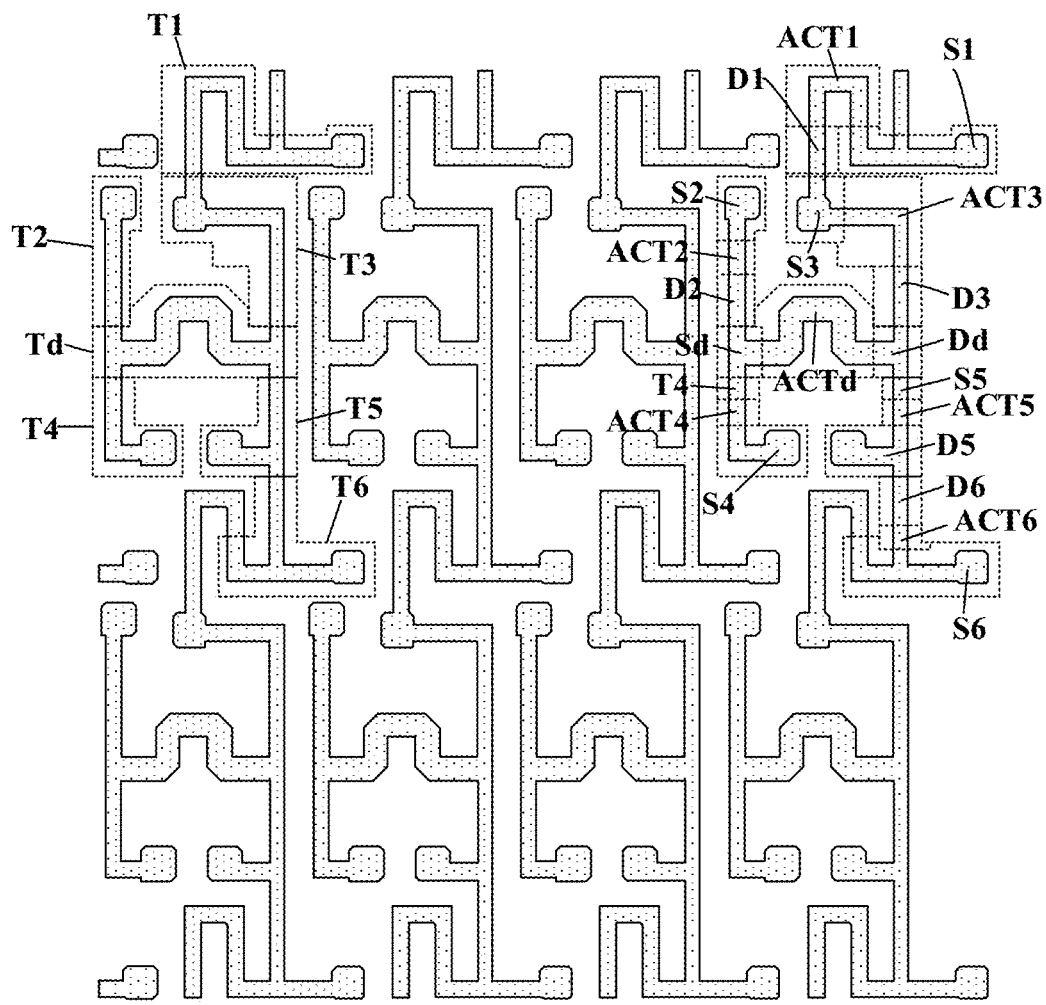
FIG. 3C is a diagram illustrating the structure of a semiconductor material layer in a plurality of subpixels of an array substrate depicted in FIG. 3A.
Figure 3D:
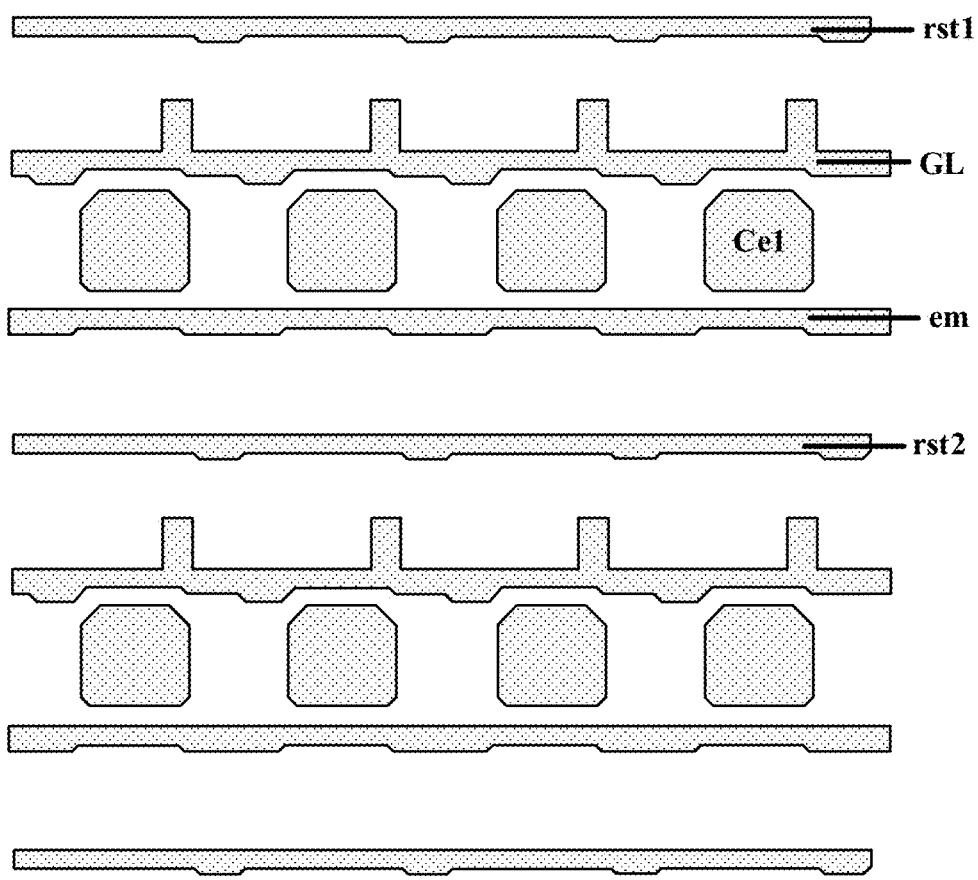
FIG. 3D is a diagram illustrating the structure of a first conductive layer in a plurality of subpixels of an array substrate depicted in FIG. 3A.
Figure 3E:
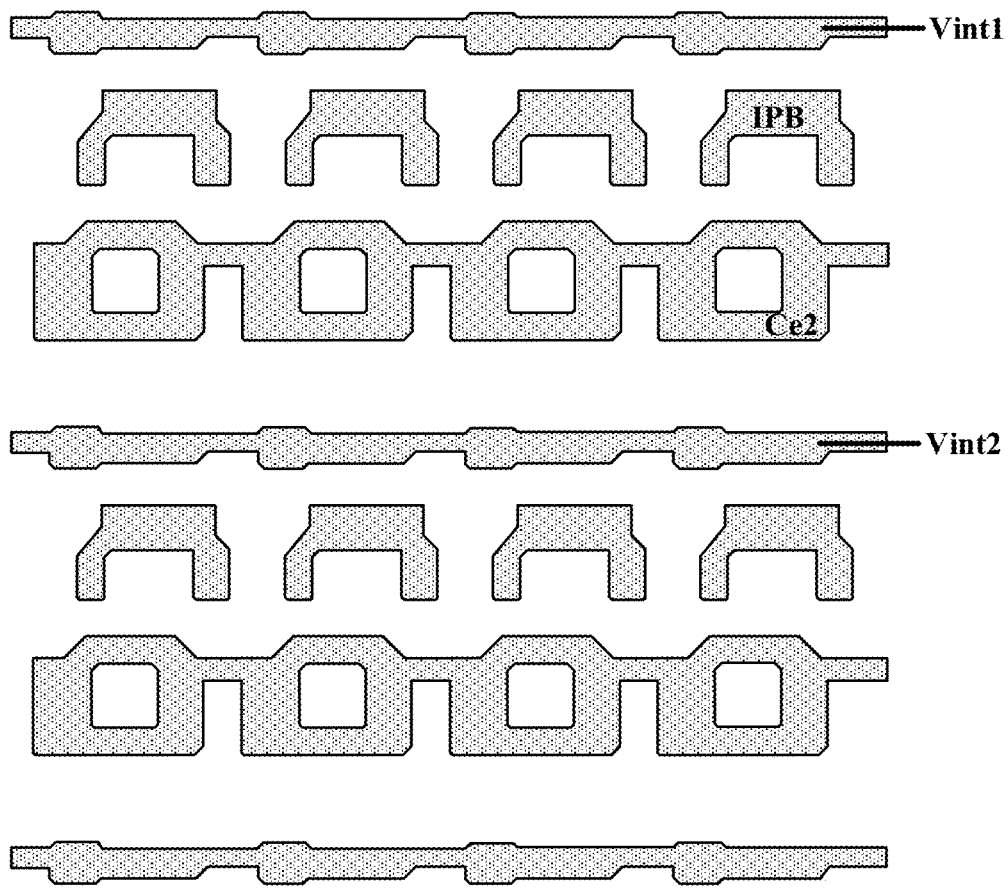
FIG. 3E is a diagram illustrating the structure of a second conductive layer in a plurality of subpixels of an array substrate depicted in FIG. 3A.
Figure 3F:
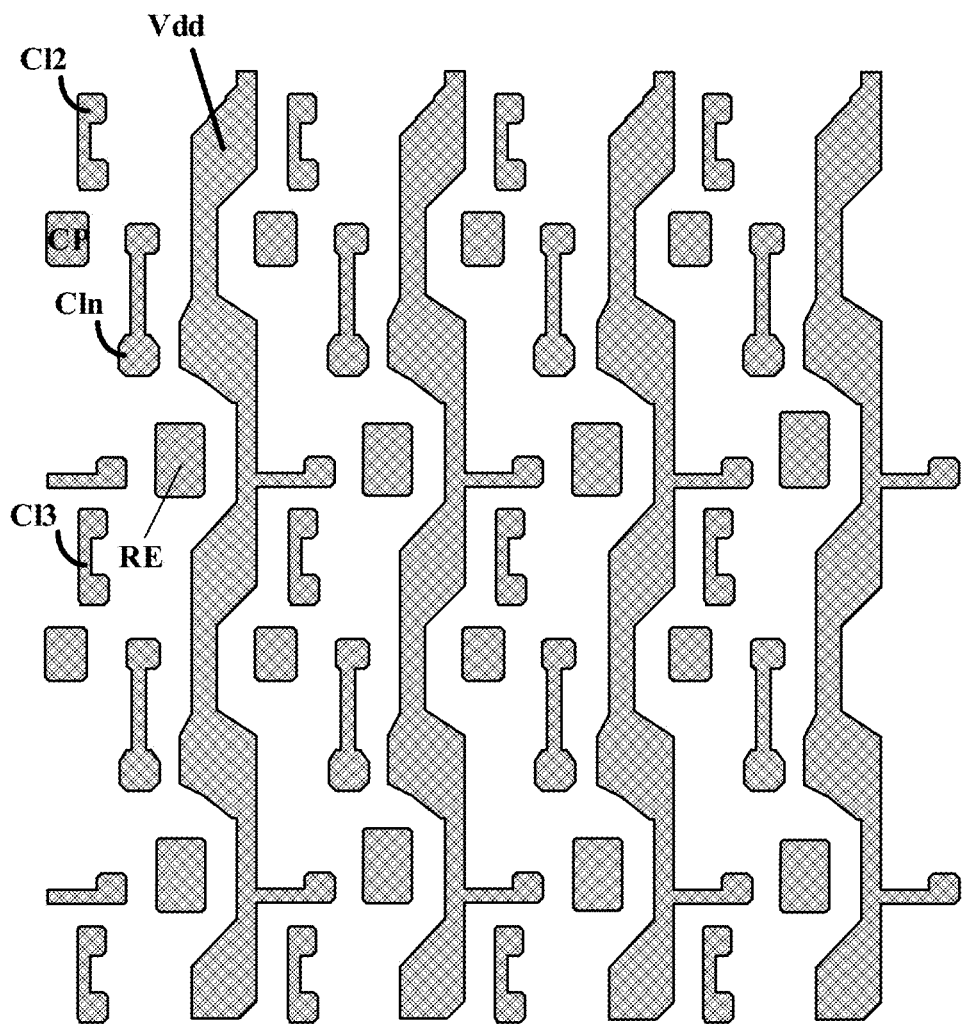
FIG. 3F is a diagram illustrating the structure of a first signal line layer in a plurality of subpixels of an array substrate depicted in FIG. 3A.
Figure 3G:
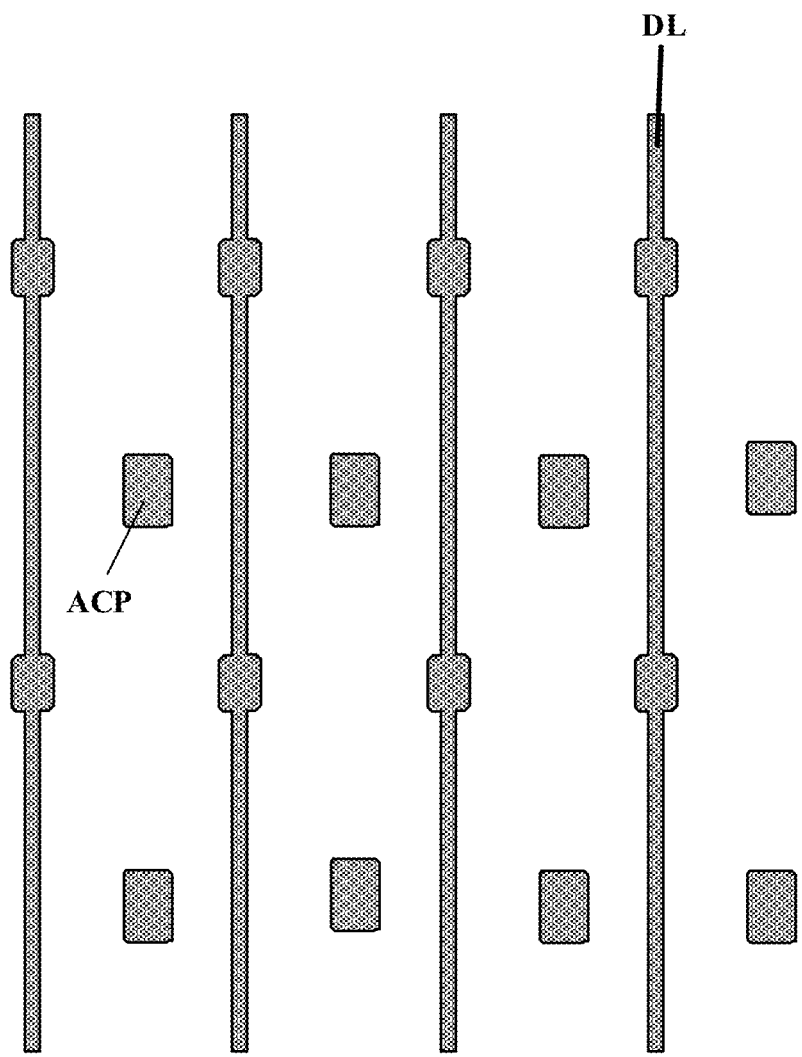
FIG. 3G is a diagram illustrating the structure of a second signal line layer in a plurality of subpixels of an array substrate depicted in FIG. 3A.
Figure 3H:
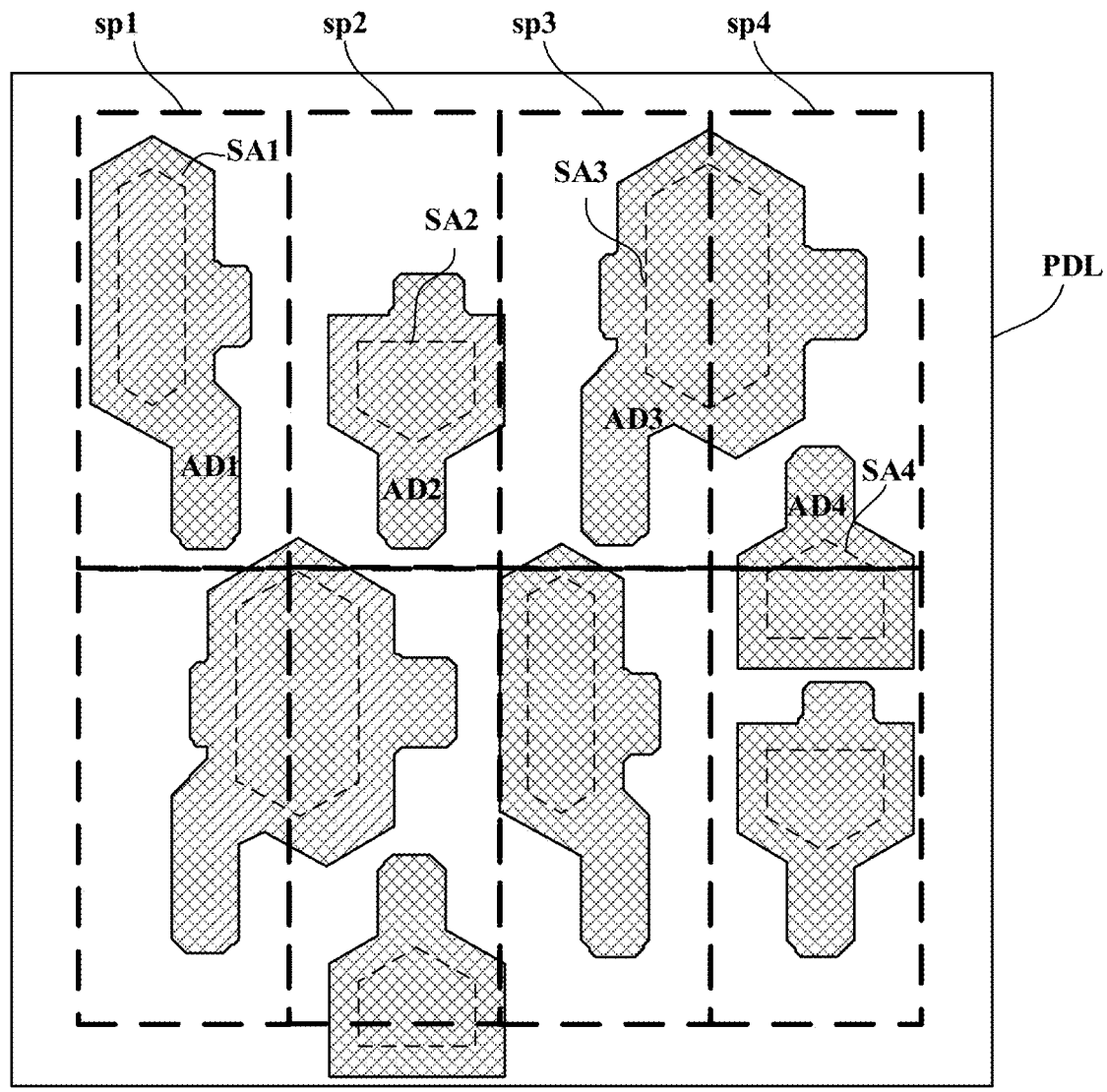
FIG. 3H is a diagram illustrating the structure of anodes in a plurality of subpixels of an array substrate depicted in FIG. 3A.
Figure 4A:
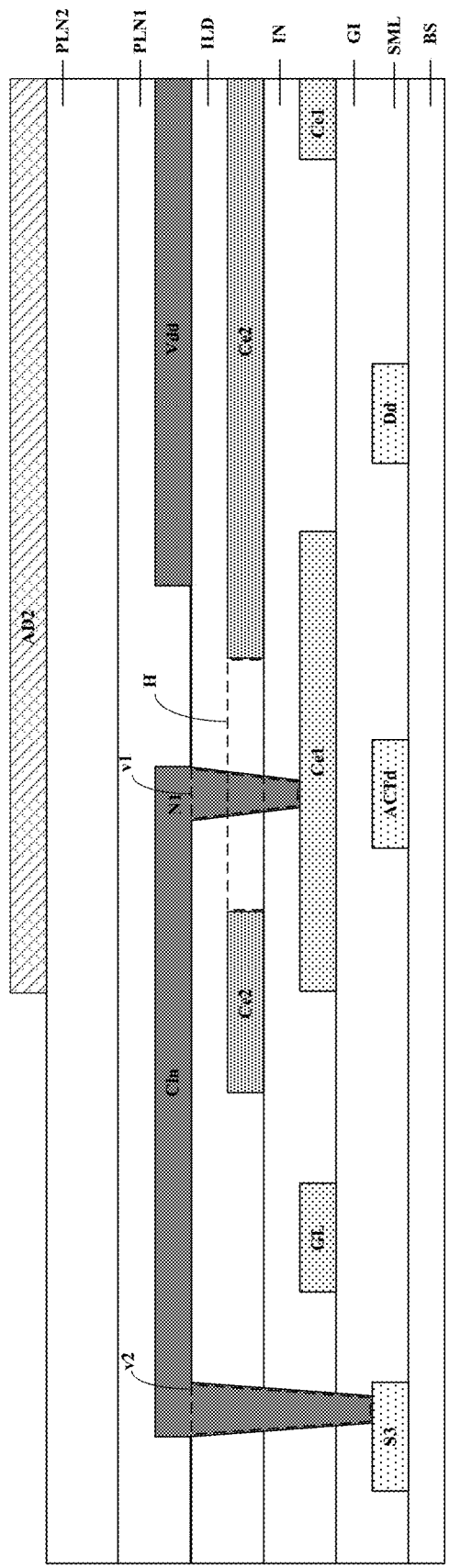
FIG. 4A is a cross-sectional view along an A-A' line in FIG. 3A.
Figure 4B:
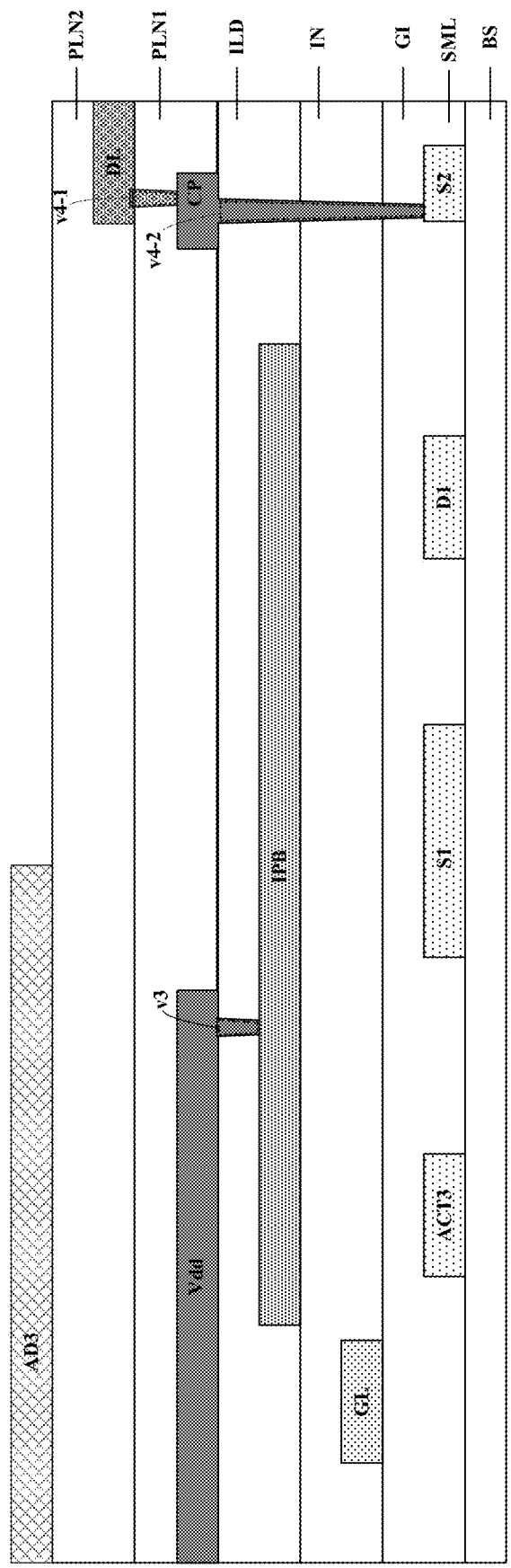
FIG. 4B is a cross-sectional view along a B-B' line in FIG. 3A.
Figure 4C:
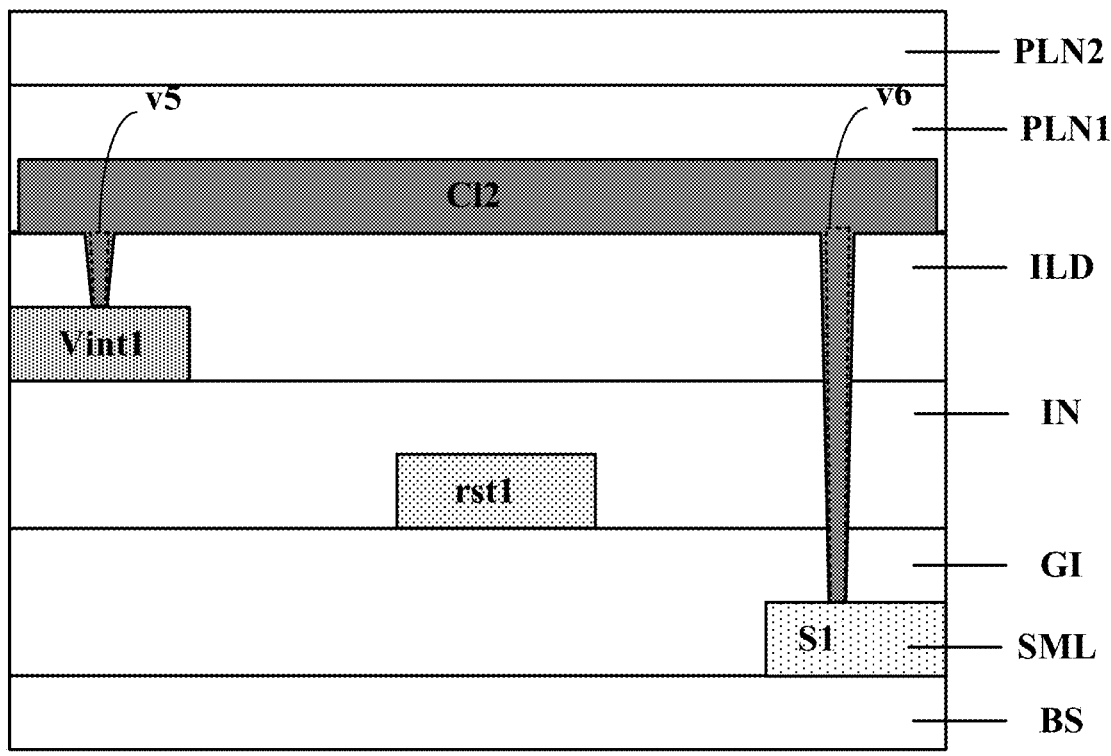
FIG. 4C is a cross-sectional view along a C-C' line in FIG. 3A.
Figure 4D:
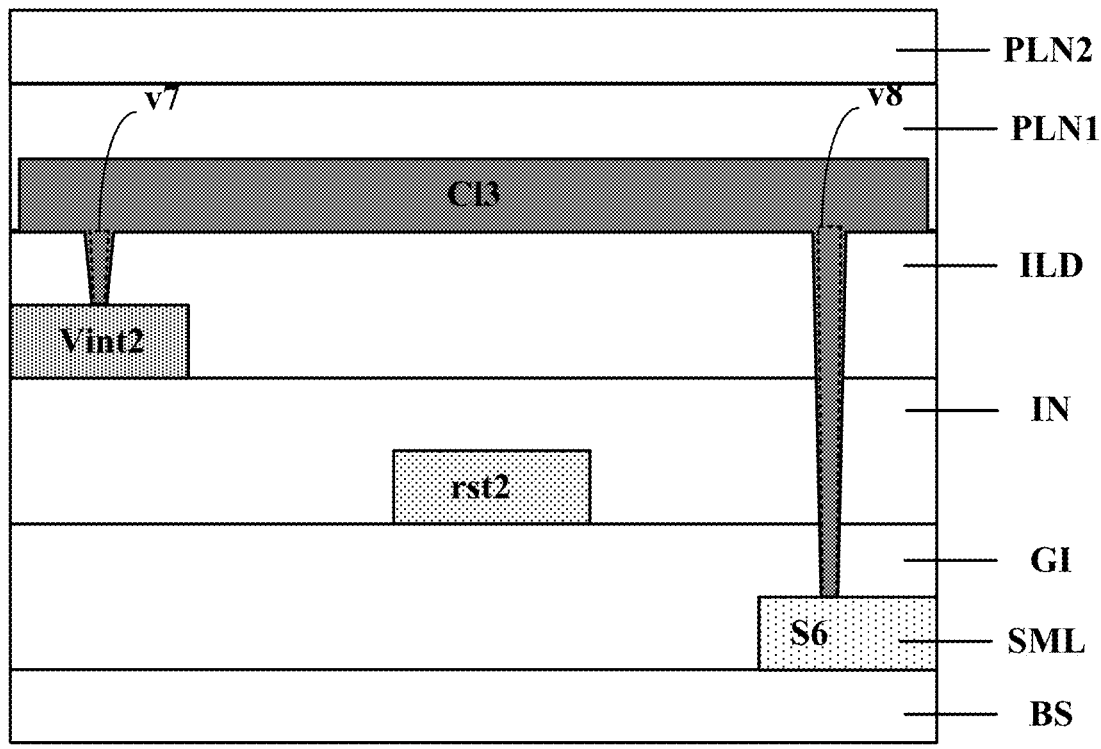
FIG. 4D is a cross-sectional view along a D-D' line in FIG. 3A.

FIG. 3C is a diagram illustrating the structure of a semiconductor material layer in a plurality of subpixels of an array substrate depicted in FIG. 3A. FIG. 3D is a diagram illustrating the structure of a first conductive layer in a plurality of subpixels of an array substrate depicted in FIG. 3A. FIG. 3E is a diagram illustrating the structure of a second conductive layer in a plurality of subpixels of an array substrate depicted in FIG. 3A. FIG. 3F is a diagram illustrating the structure of a first signal line layer in a plurality of subpixels of an array substrate depicted in FIG. 3A. FIG. 3G is a diagram illustrating the structure of a second signal line layer in a plurality of subpixels of an array substrate depicted in FIG. 3A. FIG. 3H is a diagram illustrating the structure of anodes in a plurality of subpixels of an array substrate depicted in FIG. 3A. FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A. Referring to FIG. 3A to FIG. 3H, and FIG. 4A to FIG. 4D, in some embodiments, the array substrate includes a base substrate BS, a semiconductor material layer SML on the base substrate BS, a gate insulating layer GI on a side of the semiconductor material layer SML away from the base substrate BS, a first conductive layer on a side of the gate insulating layer GI away from the semiconductor material layer SML, an insulating layer IN on a side of the first conductive layer away from the gate insulating layer GI, a second conductive layer on a side of the insulating layer IN away from the first conductive layer, an inter-layer dielectric layer ILD on a side of the second conductive layer away from the insulating layer IN, a first signal line layer on a side of the inter-layer dielectric layer ILD away from the second conductive layer, a first planarization layer PLN1 on a side of the first signal line layer away from the inter-layer dielectric layer ILD, a second signal line layer on a side of the first planarization layer PLN1 away from the first signal line layer, a second planarization layer PLN2 on a side of the second signal line layer away from the first planarization layer PLN1, and an anode layer on a side of the second planarization layer PLN2 away from the second signal line layer.

Referring to FIG. 2A, FIG. 3A, and FIG. 3C, in some embodiments, in each subpixel, the semiconductor material layer has a unitary structure. In FIG. 3C, the first subpixel on the left is annotated with labels indicating regions corresponding to the plurality of transistors in the pixel driving circuit, including the first transistor T1, the second transistor T2, the third transistor T3, the fourth transistor T4, the fifth transistor T5, the sixth transistor T6, and the driving transistor Td. In FIG. 3C, the subpixel on the right is annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd. In one example, the active layers (ACT1, ACT2, ACT3, ACT4, ACT5, ACT6 and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in a respective subpixel are parts of a unitary structure in the respective subpixel. In another example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) are in a same layer.

Referring to FIG. 2A, FIG. 3A, FIG. 3D, FIG. 4A, and FIG. 4B, the first conductive layer in some embodiments includes a plurality of gate lines GL, a plurality of first reset control signal lines rst1, a plurality of light emitting control signal lines em, a plurality of second reset control signal lines rst2, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of first reset control signal lines rst1, the plurality of light emitting control signal lines em, the plurality of second reset control signal lines rst2, and the first capacitor electrode Ce1 are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

Referring to FIG. 2A, FIG. 3A, and FIG. 3E, the second conductive layer in some embodiments includes a plurality of first reset signal lines Vint1, a second capacitor electrode Ce2 of the storage capacitor Cst, an interference preventing block IPB, and a plurality of second reset signal lines Vint2. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset signal lines Vint1, the plurality of second reset signal lines Vint2, the interference preventing block IPB, and the second capacitor electrode Ce2 are in a same layer. Referring to Referring to FIG. 2A, FIG. 3A, FIG. 3D, and FIG. 4B, in some embodiments, the interference preventing block IPB is in a same layer as the second capacitor electrode Ce2. The respective one of the plurality of voltage supply lines Vdd is connected to the interference preventing block IPB through a third main via v3. Optionally, the third main via v3 extends through the inter-layer dielectric layer ILD.

Referring to FIG. 2A, FIG. 3A, FIG. 3C, and FIG. 3F, the first signal line layer in some embodiments includes a plurality of voltage supply lines Vdd, a node connecting line Cln, a second connecting line C12, and a third connecting line C13. The node connecting line Cln connects the first capacitor electrode Ce1 and the source electrode of the third transistor T3 in a respective subpixel together. The second connecting line C12 connects a respective one of the plurality of first reset signal lines Vint1 and the source electrode of the first transistor T1 in a respective subpixel together. The third connecting line C13 connects a respective one of the plurality of second reset signal lines Vint2 and the source electrode of the sixth transistor T6 in a respective subpixel together. The first signal line layer in some embodiments further includes a relay electrode RE in a respective one of the plurality of subpixels sp. The relay electrode connects a source electrode of the fifth transistor T5 in the respective one of the plurality of subpixels sp to an anode contact pad in the respective one of the plurality of subpixels sp. Various appropriate conductive materials and various appropriate fabricating methods may be used to make the signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the plurality of data lines DL, the node connecting line Cln, the second connecting line C12, and the third connecting line C13, and the relay electrode RE, are in a same layer.

FIG. 4C is a cross-sectional view along a C-C' line in FIG. 3A. Referring to FIG. 2A, FIG. 3A, FIG. 3F, and FIG. 4C, in some embodiments, the second connecting line C12 connects the respective one of the plurality of first reset signal lines Vint1 and the source electrode S1 of the first transistor T1 in a respective subpixel together. The respective one of the plurality of first reset signal lines Vint1 is configured to provide a reset signal to the source electrode S1 of the first transistor T1 in the respective subpixel, through the second connecting line C12. Optionally, the second connecting line C12 is connected to the respective one of the plurality of first reset signal lines Vint1 through a fifth main via v5 extending through the inter-layer dielectric layer ILD. Optionally, the second connecting line C12 is connected to the source electrode S1 of the first transistor T1 in the respective subpixel through a sixth main via v6 extending through the inter-layer dielectric layer ILD, the insulating layer IN, and the gate insulating layer GI.

FIG. 4D is a cross-sectional view along a D-D' line in FIG. 3A. Referring to FIG. 2A, FIG. 3A, FIG. 3F, and FIG. 4D, in some embodiments, the third connecting line C13 connects the respective one of the plurality of second reset signal lines Vint2 and the source electrode S6 of the sixth transistor T6 in a respective subpixel together. The respective one of the plurality of second reset signal lines Vint2 is configured to provide a reset signal to the source electrode S6 of the sixth transistor T6 in the respective subpixel, through the second connecting line C12. Optionally, the third connecting line C13 is connected to the respective one of the plurality of second reset signal lines Vint2 through a seventh main via v7 extending through the inter-layer dielectric layer ILD. Optionally, the third connecting line C13 is connected to the source electrode S6 of the sixth transistor T6 in the respective subpixel through an eighth main via v8 extending through the inter-layer dielectric layer ILD, the insulating layer IN, and the gate insulating layer GI.

Referring to FIG. 2A, FIG. 3A, and FIG. 3G, the second signal line layer in some embodiments includes a plurality of data line DL. Optionally, the second signal line layer further includes an anode contact pad ACP in a respective one of the plurality of subpixels sp. The anode contact pad ACP is electrically connected to a source electrode of the fifth transistor T5 in the respective one of the plurality of subpixels sp through a relay electrode in the respective one of the plurality of subpixels sp. Referring to Referring to FIG. 2A, FIG. 3A, FIG. 3F, FIG. 3G, and FIG. 4B, in some embodiments, a respective one of the plurality of data lines DL is connected to a connecting portion CP through a via v4-1 extending through the first planarization layer PLN-1, and the connecting portion CP is connected to a source electrode S2 of the second transistor through a via v4-2 extending through the inter-layer dielectric layer ILD, the insulating layer IN, and the gate insulating layer GI.

Referring to FIG. 2A, FIG. 3A, FIG. 3D, FIG. 3E, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the signal line layer includes a node connecting line Cln on a side of the inter-layer dielectric layer ILD away from the second capacitor electrode Ce2. The node connecting line Cln is in a same layer as the plurality of voltage supply lines Vdd. Optionally, the array substrate further includes a first main via v1 in the hole region H and extending through the inter-layer dielectric layer ILD and the insulating layer IN. Optionally, the node connecting line Cln is connected to the first capacitor electrode Ce1 through the first main via v1. In some embodiments, the first capacitor electrode Ce1 is on a side of the gate insulating layer IN away from the base substrate BS. Optionally, the array substrate further includes a first main via v1 and a second main via v2. The first main via v1 is in the hole region H and extends through the inter-layer dielectric layer ILD and the insulating layer IN. The second main via v2 extends through the inter-layer dielectric layer ILD, the insulating layer IN, and the gate insulating layer GI. Optionally, the node connecting line Cln is connected to the first capacitor electrode Ce1 through the first main via v1, and is connected node connecting line Cln is connected the semiconductor material layer SML through the second main via v2. Optionally, the node connecting line Cln is connected to the source electrode S3 of third transistor, as depicted in FIG. 4A.

Referring to Referring to FIG. 2A, FIG. 3A, FIG. 3E, and FIG. 4B, in some embodiments, the interference preventing block IPB is in a same layer as the second capacitor electrode Ce2. The respective one of the plurality of voltage supply lines Vdd is connected to the interference preventing block IPB through a third main via v3. Optionally, the third main via v3 extends through the inter-layer dielectric layer ILD. Optionally, an orthographic projection of the interference preventing block IPB on the base substrate BS partially overlaps with an orthographic projection of the respective one of the plurality of voltage supply lines Vdd on the base substrate BS. Optionally, the orthographic projection of the interference preventing block IPB on the base substrate BS at least partially overlaps with an orthographic projection of an active layer ACT3 of the third transistor T3 on the base substrate BS. Optionally, the orthographic projection of the interference preventing block IPB on the base substrate BS at least partially overlaps with an orthographic projection of a drain electrode D1 of the first transistor T1 on the base substrate BS. Optionally, orthographic projections of a portion of the interference preventing block IPB and a portion of the respective one of the plurality of voltage supply lines Vdd on the base substrate BS commonly overlaps with an orthographic projection of a portion of the active layer ACT3 of the third transistor T3 on the base substrate BS.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

Referring to FIG. 2A, FIG. 3A, and FIG. 3H, the array substrate in some embodiments includes a first anode AD1 in the respective first subpixel sp1, a second anode AD2 in the respective second subpixel sp2, a third anode AD3 in the respective third subpixel sp3, and a fourth anode AD4 in the respective fourth subpixel sp4. The first anode AD1, the second anode AD2, the third anode AD3, and the fourth anode AD4, are respectively anodes of a first light emitting element, a second light emitting element, a third light emitting element, and a fourth light emitting element, respectively in the respective first subpixel sp1, the respective second subpixel sp2, the respective third subpixel sp3, and the respective fourth subpixel sp4. The array substrate in some embodiments further includes a pixel definition layer PDL on a side of the first anode AD1, the second anode AD2, the third anode AD3, and the fourth anode AD4 away from the second planarization layer PLN2. The array substrate further includes a respective first subpixel aperture SA1, a respective second subpixel aperture SA2, a respective third subpixel aperture SA3, a respective fourth subpixel aperture SA4 respectively extending through the pixel definition layer PDL. In some embodiments, the respective first subpixel sp1 is a red subpixel, and the first anode AD1 is an anode of the red subpixel; the respective second subpixel sp2 is a first green subpixel, and the second anode AD2 is an anode of the first green subpixel; the respective third subpixel sp3 is a blue subpixel, and the third anode AD3 is an anode of the blue subpixel; the respective fourth subpixel sp4 is a second green subpixel, and the fourth anode AD4 is an anode of the second green subpixel.

Figure 5A:
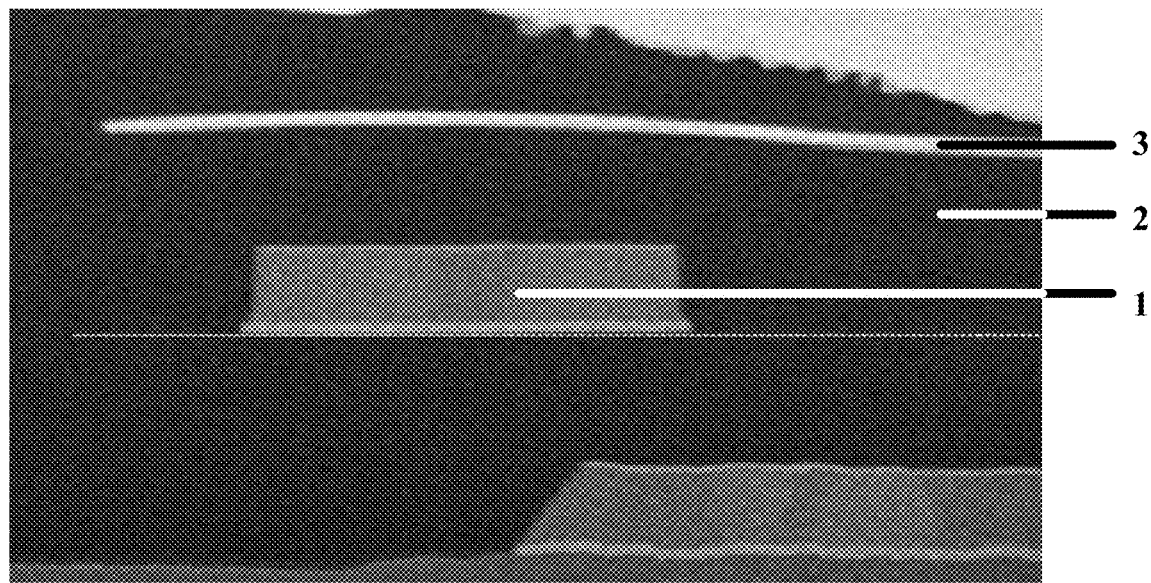
FIG. 5A is a cross-sectional image of an array substrate.

The inventors of the present disclosure discover that a degree of evenness of anodes in a display panel could adversely affect image display. For example, color shift may result from the anodes being tilted. It is discovered in the present disclosure that signal lines underneath the anodes could significantly affect the degree the anodes being titled. In one example, underneath an anode, at one side a signal line is disposed while the other side is absent of a signal line. This results in an uneven surface of a planarization layer on top of the signal line. The uneven surface of the planarization layer in turn results in the anode on top of the planarization layer being tilted. FIG. 5A is a cross-sectional image of an array substrate. As shown in FIG. 5A, the presence of a signal line 1 underneath a left side portion of the planarization layer 2 results in an uneven surface of the planarization, which in turn results in an anode 3 on top of the planarization layer 2 being titled toward the right side. The titled anode reflects more light toward the right side of the display panel. In the display panel, anodes associated with subpixels of different colors have different titled angles, thus light reflected by anodes in subpixels of different colors reflect light of different colors respectively at different angles. The accumulated effect of this issue lead to color shift at a large viewing angle.

Figure 5B:
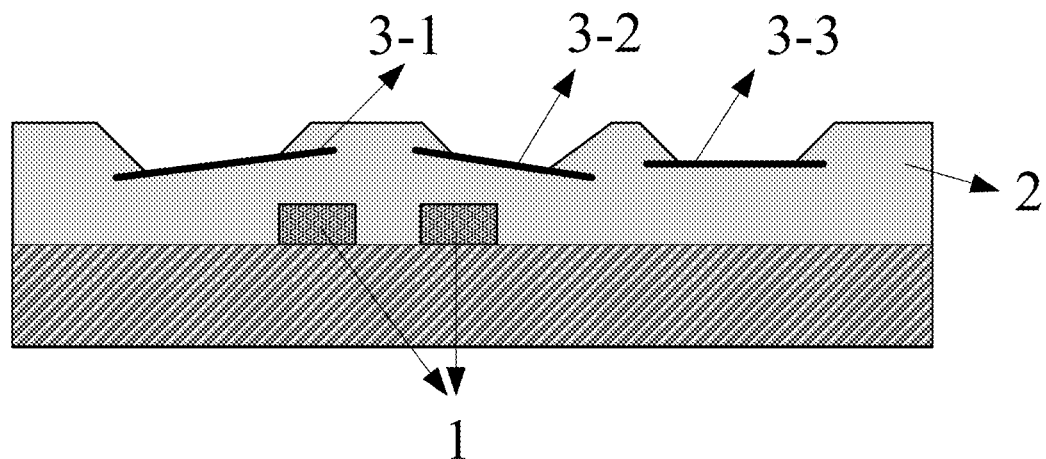
FIG. 5B is a schematic diagram illustrating a cross-sectional image of an array substrate.

FIG. 5B is a schematic diagram illustrating a cross-sectional image of an array substrate. As shown in FIG. 5B, signal lines 1 are absent underneath a third anode 3-3, which is not titled. The signal lines 1 are present underneath anodes 3-1 and 3-2. However, the signal line is only present underneath a right side portion of the anode 3-1, and only present underneath a left side portion of the anode 3-2, resulting in these two anodes being titled. Anodes 3-1, 3-2, and 3-3 are respectively anodes of a red subpixel, a green subpixel, and a blue subpixel. Because the titled angles of the anodes in three subpixels of different colors are different from each other, color shift at a large viewing angle occurs.

Figure 5C:
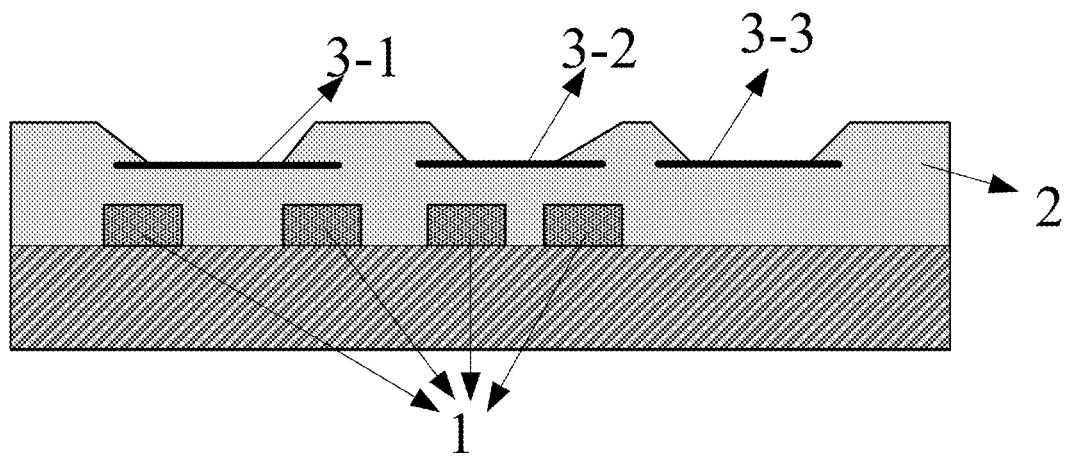
FIG. 5C is a schematic diagram illustrating a cross-sectional image of an array substrate.

FIG. 5C is a schematic diagram illustrating a cross-sectional image of an array substrate. As shown in FIG. 5C, signal lines are present underneath both the left side portion and the right side portion of the anode 3-1, and present underneath both the left side portion and the right side portion of the anode 3-2. Signal lines are absent underneath the anode 3-3. All anodes are substantially not titled, alleviating the color shift issue.

Figure 5D:
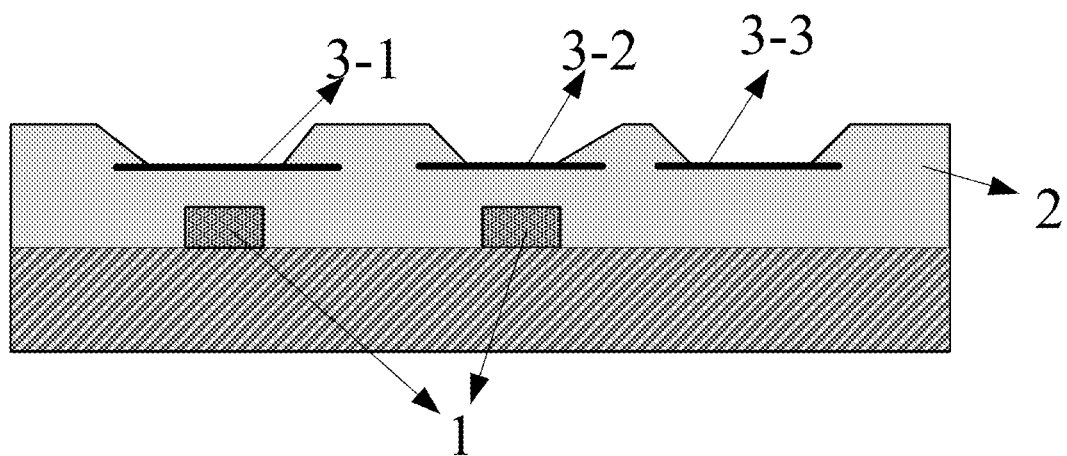
FIG. 5D is a schematic diagram illustrating a cross-sectional image of an array substrate.

FIG. 5D is a schematic diagram illustrating a cross-sectional image of an array substrate. As shown in FIG. 5D, a signal line is present underneath the central portion of the anode 3-1, and present underneath the central portion of the anode 3-2. Signal lines are absent underneath the anode 3-3. All anodes are substantially not titled, alleviating the color shift issue.

Figure 3I:
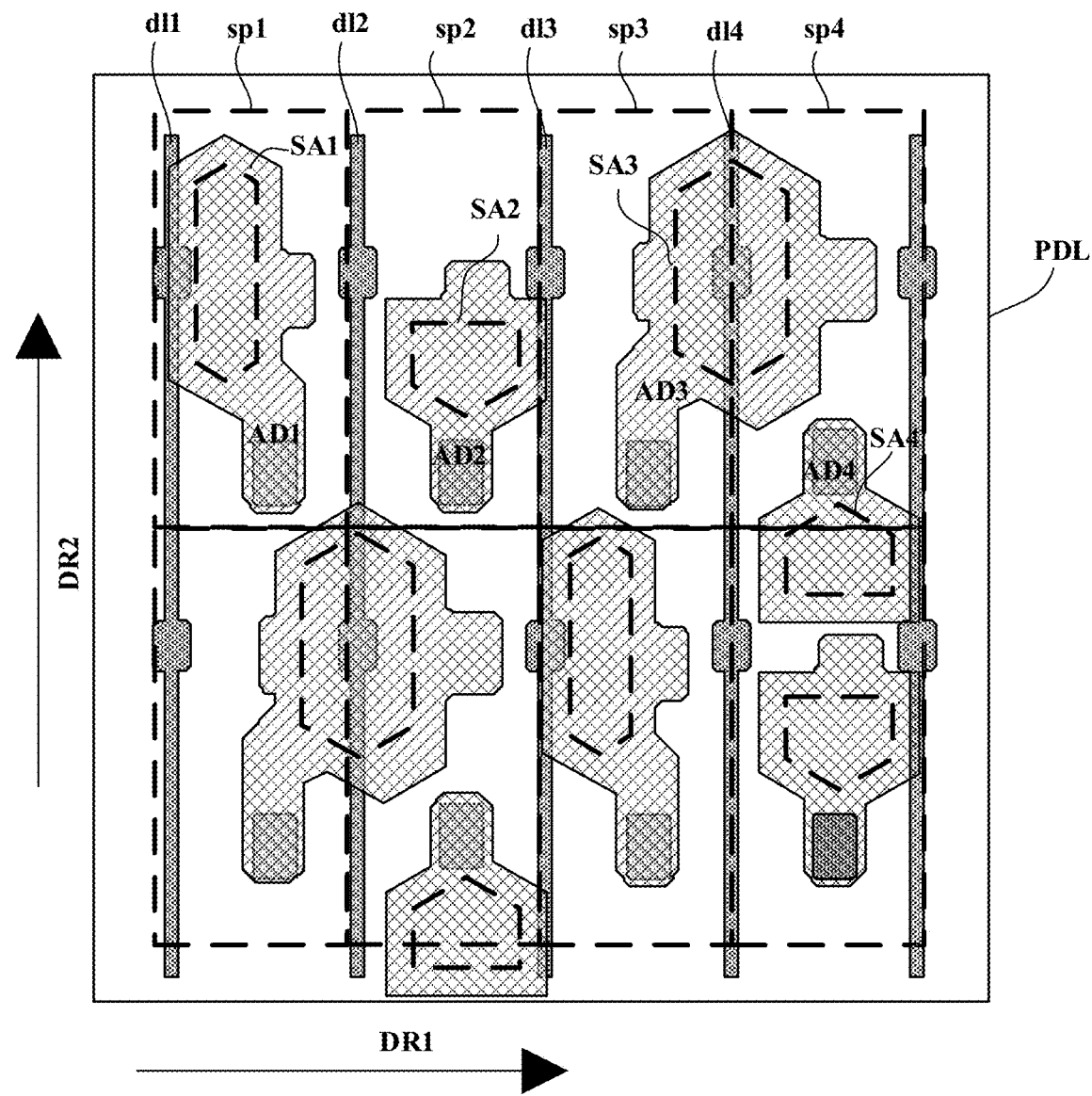
FIG. 3I is a diagram illustrating a superimposition of anodes and data lines in a plurality of subpixels of an array substrate depicted in FIG. 3A.

The present array substrate adopts an intricate structure of anodes and connecting lines to achieve an even surface of the planarization layer underneath the anodes. As a result, color shift issue can be alleviated. FIG. 3I is a diagram illustrating a superimposition of anodes and data lines in a plurality of subpixels of an array substrate depicted in FIG. 3A. Referring to FIG. 3I, the array substrate in some embodiments includes a plurality of data lines, a plurality of light emitting elements respectively in a plurality of subpixels, and a pixel definition layer PDL on the base substrate, the pixel definition layer defining a plurality of subpixel apertures. The plurality of light emitting elements include a first light emitting element in a respective first subpixel sp1, a second light emitting element in a respective second subpixel sp2, a third light emitting element in a respective third subpixel sp3, and a fourth light emitting element in a respective fourth subpixel sp4. The plurality of subpixel apertures include a respective first subpixel aperture SA1, a respective second subpixel aperture SA2, a respective third subpixel aperture SA3, a respective fourth subpixel aperture SA4 respectively extending through the pixel definition layer PDL. A first light emitting layer of the first light emitting element is connected to a first anode AD1 of the first light emitting element through the respective first subpixel aperture SA1; a second light emitting layer of the second light emitting element connected to a second anode AD2 of the second light emitting element through the respective second subpixel aperture SA2; a third light emitting layer of the third light emitting element connected to a third anode AD3 of the third light emitting element through the respective third subpixel aperture SA3; and a fourth light emitting layer of the fourth light emitting element connected to a fourth anode AD4 of the fourth light emitting element through the respective fourth subpixel aperture SA4.

In some embodiments, each of the respective first subpixel aperture SA1, the respective second subpixel aperture SA2, and the respective fourth subpixel aperture SA4 is not crossed over by any data line. As shown in FIG. 3I, the respective third subpixel aperture SA3 is crossed over by one of the plurality of data lines.

In some embodiments, the plurality of subpixel apertures include a plurality of minimum repeating units. A respective one of the plurality of minimum repeating units includes the respective first subpixel aperture SA1, the respective second subpixel aperture SA2, the respective third subpixel aperture SA3, and the respective fourth subpixel aperture SA4. Optionally, as shown in FIG. 3I, the respective first subpixel aperture SA1, the respective second subpixel aperture SA2, the respective third subpixel aperture SA3, and the respective fourth subpixel aperture SA4 in the respective one of the plurality of minimum repeating units are consecutively arranged, e.g., along a row. In the context of the present disclosure, the minimum repeating units are not necessarily minimum repeating units in an entirety of the array substrate. The minimum repeating units may be minimum repeating units in a local area of the array substrate, for example, a center area of the array substrate. Optionally, the local area having the minimum repeating units includes at least three minimum repeating units along a row direction. Optionally, the local area having the minimum repeating units includes at least three minimum repeating units along a column direction.

In some embodiments, the plurality of data lines include a first data line dl1, a second data line dl2, a third data line dl3, and a fourth data line dl4, configured to provide data signals respectively to the respective first subpixel sp1, the respective second subpixel sp2, the respective third subpixel sp3, and the respective fourth subpixel sp4. Optionally, the plurality of data lines include a plurality of repeating groups of data lines. Optionally, a respective group of the plurality of repeating groups of data lines includes the first data line dl1, the second data line dl2, the third data line dl3, and the fourth data line dl4. Optionally, the first data line dl1, the second data line dl2, the third data line dl3, and the fourth data line dl4 are consecutively arranged, e.g., along a row. As shown in FIG. 3I, in some embodiments, the fourth data line dl4 crosses over the respective third subpixel aperture SA3. Optionally, none of the plurality of data lines crosses over the respective first subpixel aperture SA1, the respective second subpixel aperture SA2, or the respective fourth subpixel aperture SA4.

In some embodiments, the respective first subpixel aperture SA1, the respective second subpixel aperture SA2, the respective third subpixel aperture SA3, and the respective fourth subpixel aperture SA4 are consecutively arranged along a row; the first data line dl1, the second data line dl2, the third data line dl3, and the fourth data line dl4 are consecutively arranged along the row. As shown in FIG. 3I, the respective first subpixel aperture SA1 is between the first data line dl1 and the second data line dl2; the respective second subpixel aperture SA2 is between the second data line dl2 and the third data line dl3; the respective third subpixel aperture SA3 is crossed over by the fourth data line dl4; and the respective fourth subpixel aperture SA4 is on a side of the fourth data line dl4 away from the third data line dl3.

Figure 3J:
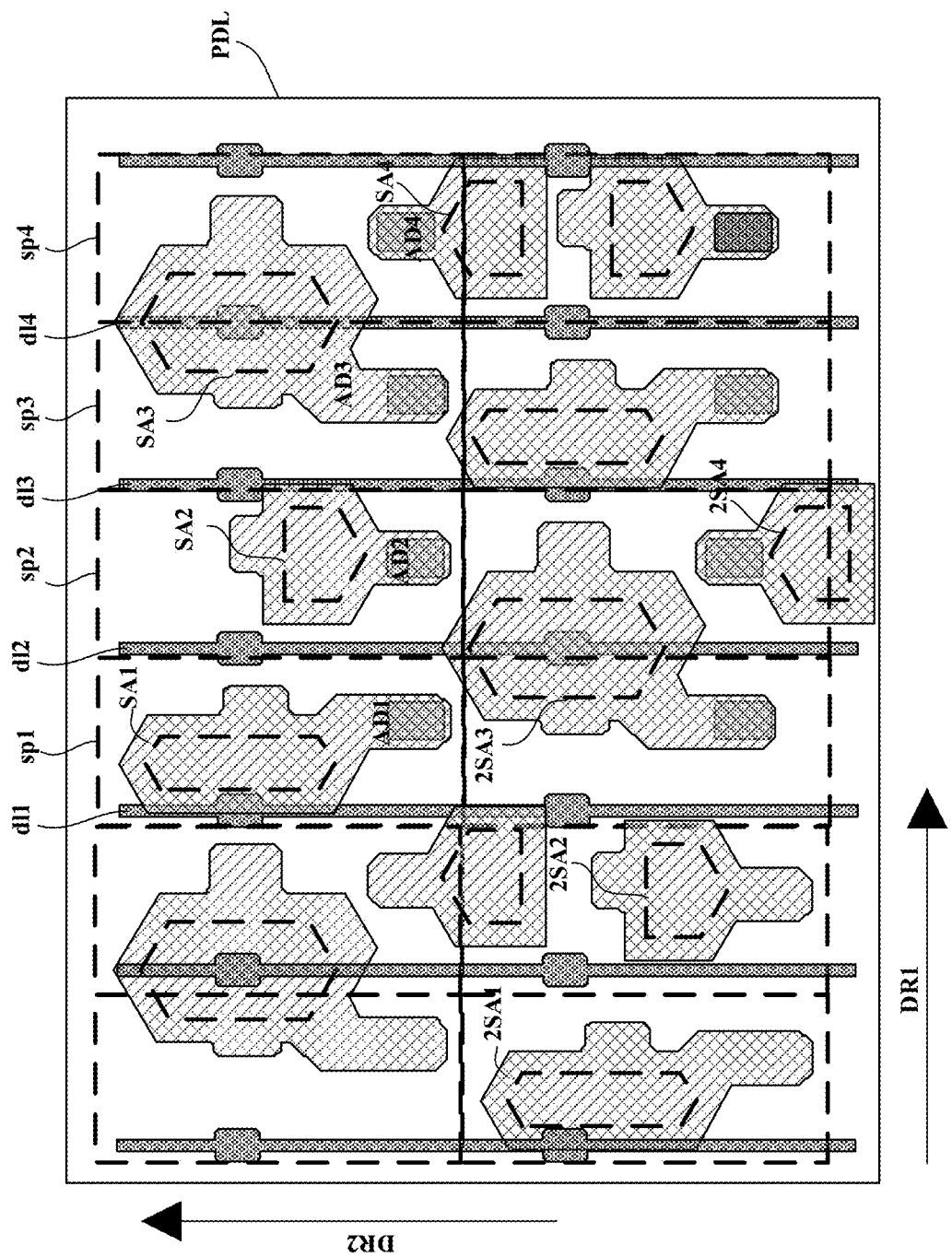
FIG. 3J is a diagram illustrating a superimposition of anodes and data lines in a plurality of subpixels of an array substrate in some embodiments according to the present disclosure.

FIG. 3J is a diagram illustrating a superimposition of anodes and data lines in a plurality of subpixels of an array substrate in some embodiments according to the present disclosure. Referring to FIG. 3J, in some embodiments, the respective first subpixel aperture SA1, the respective second subpixel aperture SA2, the respective third subpixel aperture SA3, and the respective fourth subpixel aperture SA4 are in a first minimum repeating unit in a first row of two nearest adjacent rows. The plurality of minimum repeating units include a second minimum repeating unit in a second row of the two nearest adjacent rows. The second minimum repeating unit, along a row direction, has a displacement of twice of an inter-data line distance with respect to the first minimum repeating unit, the inter-data line distance being a shortest distance between two nearest data lines along the row direction. In the context of the present disclosure, the shortest distance between two nearest data lines along the row direction refers to the shortest distance between two nearest data lines in the display are along the row direction. Optionally, the inter-data line distance equals to one half of an inter-subpixel distance of a same color, wherein the inter-subpixel distance of a same color refers to a distance between centers of two subpixels of a same color in a same row. Optionally, the second minimum repeating unit in the second row includes a second respective first subpixel aperture 2SA1, a second respective second subpixel aperture 2SA2, a second respective third subpixel aperture 2SA3, and a second respective fourth subpixel aperture 2SA4 consecutively arranged along the row. As shown in FIG. 3J, the fourth data line dl4 crosses over the respective third subpixel aperture SA3; and the second data line dl2 crosses over the second respective second subpixel aperture 2SA2 in the second row.

In some embodiments, a minimum repeating unit of the plurality of subpixels of the array substrate comprises the respective first subpixel sp1, the respective second subpixel sp2, the respective third subpixel sp3, and the respective fourth subpixel sp4. In some embodiments, two subpixels of the respective first subpixel, the respective second subpixel, the respective third subpixel, and the respective fourth subpixel are subpixels of a same color (e.g., green color). Optionally, the respective second subpixel sp2 and the respective fourth subpixel sp4 are subpixels of a same color, which is different from a color of the respective first subpixel sp1 and different from a color of the respective third subpixel sp3. In one example, the respective second subpixel sp2 and the respective fourth subpixel sp4 are green subpixels, the respective first subpixel sp1 is a red subpixel, and the respective third subpixel sp3 is a blue subpixel. In some embodiments, two light emitting elements of the first light emitting element, the second light emitting element, the third light emitting element, and the fourth light emitting element are light emitting elements of a same color (e.g., green color). Optionally, the second light emitting element and the fourth light emitting element are light emitting elements of a same color, which is different from a color of the first light emitting element and different from a color of the third light emitting element. In one example, the second light emitting element and the fourth light emitting element are green light emitting elements, the first light emitting element is a red light emitting element, and the third light emitting element is a blue light emitting element.

Figure 6:
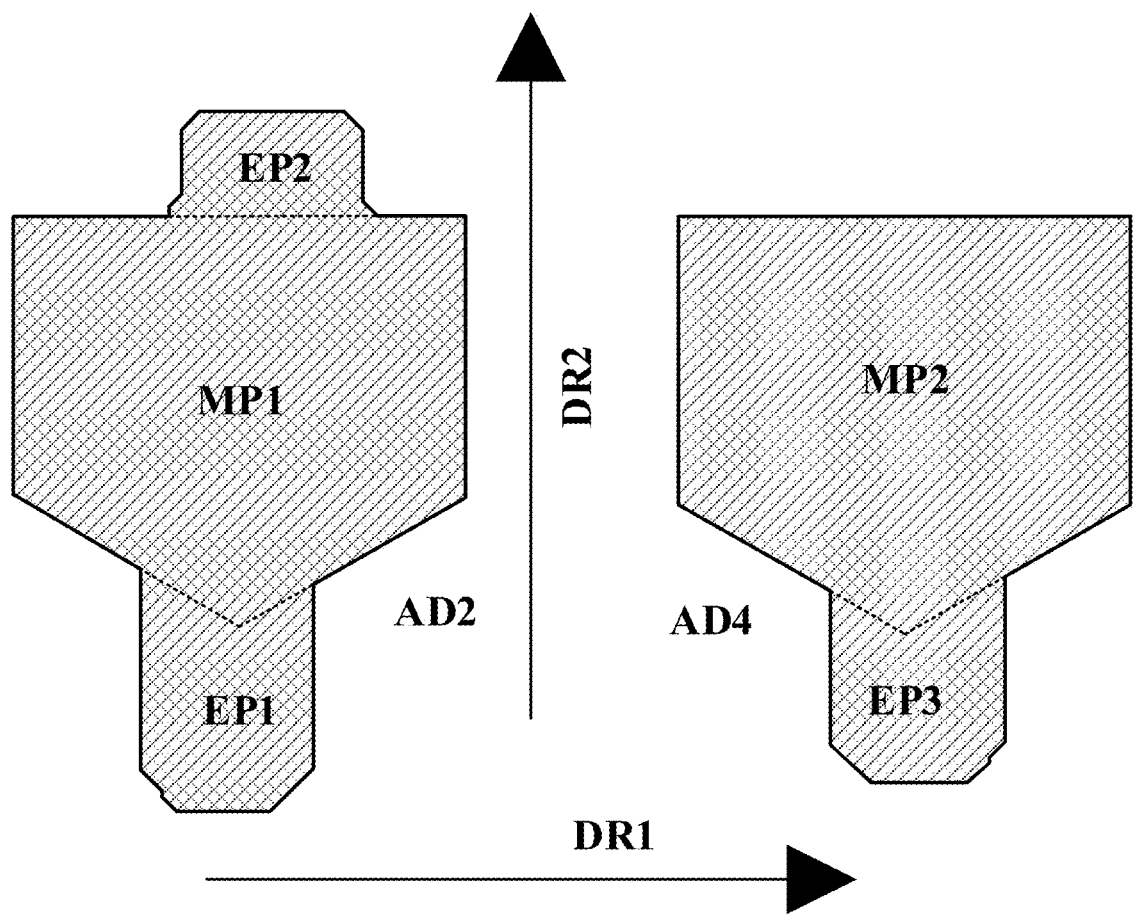
FIG. 6 illustrates structural difference between a second anode and a fourth anode in some embodiments according to the present disclosure.

In some embodiments, as shown in FIG. 3I, the first anode AD1, the second anode AD2, and the third anode AD3 have different areas and different shapes. In some embodiments, as shown in FIG. 3I, the first anode AD1, the second anode AD2, and the fourth anode AD4 have different areas and different shapes. Optionally, as shown in FIG. 3I, the first anode AD1, the second anode AD2, the third anode AD3, and the fourth anode AD4 have different areas and different shapes. In one example, the second anode AD2 and the fourth anode AD4 are the anodes of the two light emitting elements of the same color. FIG. 6 illustrates structural difference between a second anode and a fourth anode in some embodiments according to the present disclosure. Referring to FIG. 6, in some embodiments, the second anode AD2 includes a first main portion MP1, a first extra portion EP1, and a second extra portion EP2; the fourth anode AD4 includes a second main portion MP2 and a third extra portion EP3.

In some embodiments, the first main portion MP1 is a combination of a rectangle part and a triangle part, and the second main portion MP2 is a combination of a rectangle part and a triangle part. Optionally, the first main portion MP1 and the second main portion MP2 have substantially same shape (and dimensions). Optionally, the first extra portion EP1 abuts the triangle part of the first main portion MP1. Optionally, the second extra portion EP2 abuts a side of the rectangle part of the first main portion MP1 away from the triangle part of the first main portion MP1. Optionally, the third extra portion EP3 abuts the triangle part of the second main portion MP2.

Optionally, the first extra portion EP1, the first main portion MP1, the second extra portion EP2, are sequentially arranged along a direction substantially parallel to the plurality of data lines (e.g., the second direction DR2). Optionally, the second main portion MP2 and the third extra portion EP3 are sequentially arranged along a direction substantially parallel to the plurality of data lines (e.g., the second direction DR2).

Figure 7:
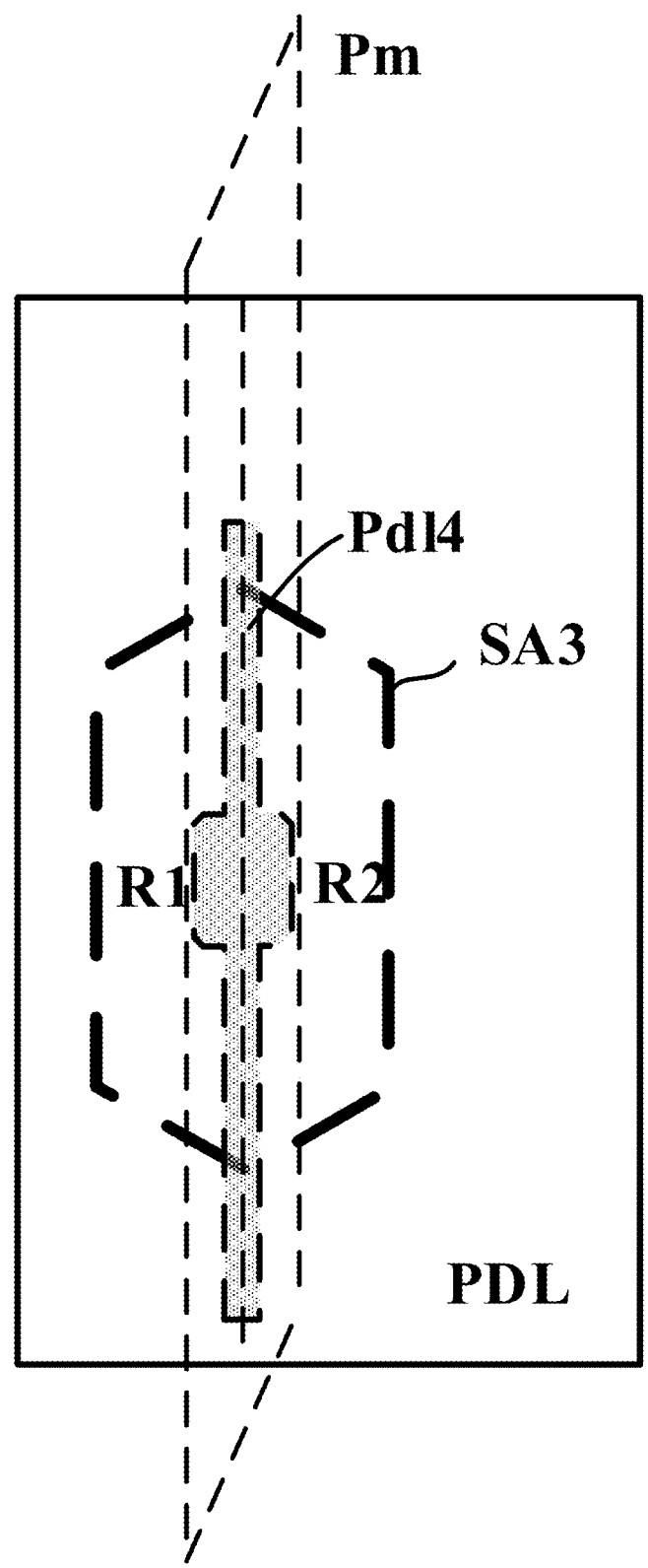
FIG. 7 shows an orthographic projection of a fourth data line on a pixel definition layer in some embodiments according to the present disclosure.

FIG. 7 shows an orthographic projection of a fourth data line on a pixel definition layer in some embodiments according to the present disclosure. Referring to FIG. 7, in some embodiments, a first plane containing an orthographic projection Pdl4 of the fourth data line on a second plane containing a surface of the pixel definition layer PDL divides the respective third subpixel aperture SA3 into a first region R1 and a second region R2. Optionally, the first plane orthogonal to the second plane. In some embodiments, a ratio of a first area of the first region to a second area of the second region is in a range of 2:8 to 8:2, e.g., 2:8 to 3:8, 3:8 to 1:2, 1:2 to 5:8, 5:8 to 6:8, 6:8 to 7:8, 7:8 to 1:1, 1:1 to 8:7, 8:7 to 8:6, 8:6 to 8:5, 8:5 to 1:2, 1:2 to 3:8, or 3:8 to 2:8. Optionally, the ratio of the first area of the first region to the second area of the second region is in a range of 1:1.5 to 1.5:1, e.g., 1:1.5 to 1:1.4, 1:1.4 to 1:1.3, 1:1.3 to 1:1.2, 1:1.2 to 1:1.1, 1:1.1 to 1:1, 1:1 to 1.1:1, 1.1:1 to 1.2:1, 1.2:1 to 1.3:1, 1.3:1 to 1.4:1, or 1.4:1 to 1.5:1. In one example, the first area of the first region R1 equal to the second area of the second region R2. In the context of the present disclosure, the first plane is a plane containing the orthographic projection Pdl4, or containing an orthographic projection of a line in the fourth data line on the second plane containing a surface of the pixel definition layer PDL, the line in the fourth data line extending along a direction parallel to an extension direction of the fourth data line.

Optionally, the respective third subpixel aperture SA3 has a substantially mirror symmetry with respect to a plane Pm perpendicular to the pixel definition layer PDL and intersecting with the orthographic projection Pdl4 of the fourth data line on the pixel definition layer PDL. As used herein, the term substantially mirror symmetry refers to two objects having a mirror symmetry within 10% error (e.g., within 8% error, within 6% error, within 4% error, within 2% error, or within 1% error). In one example, at least 90% of a first object overlaps with a second object after a mirror symmetry is operated on the first object, and at least 90% of the second object overlaps with the first object after a mirror symmetry is operated on the second object.

Optionally, the respective third subpixel aperture SA3 has a hexagonal shape. Optionally, the orthographic projection Pdl4 of the fourth data line on the pixel definition layer PDL substantially overlaps with a central line of the hexagonal shape.

Figure 8A:
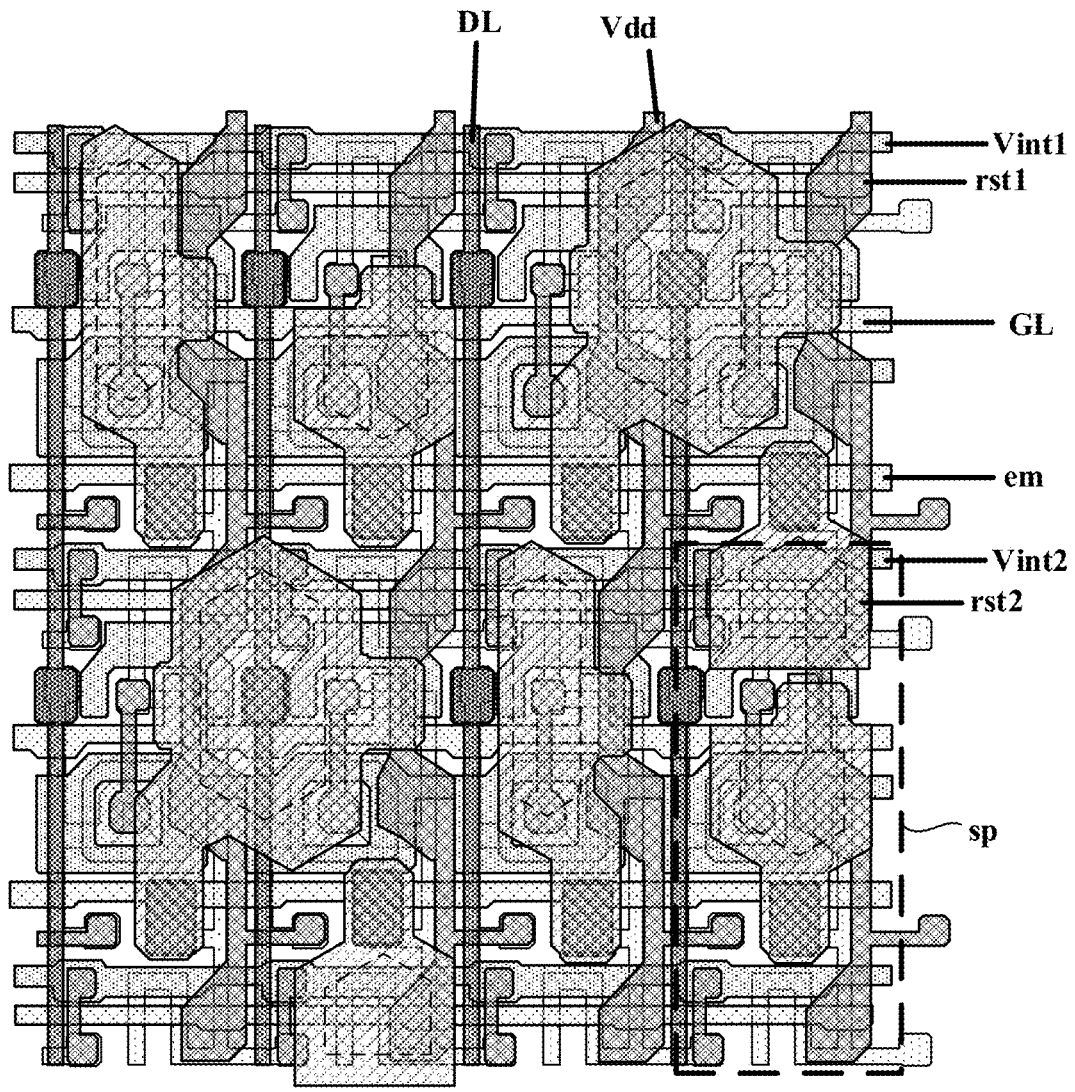
FIG. 8A is a diagram illustrating the structure of a plurality of subpixels of an array substrate in some embodiments according to the present disclosure.
Figure 8B:
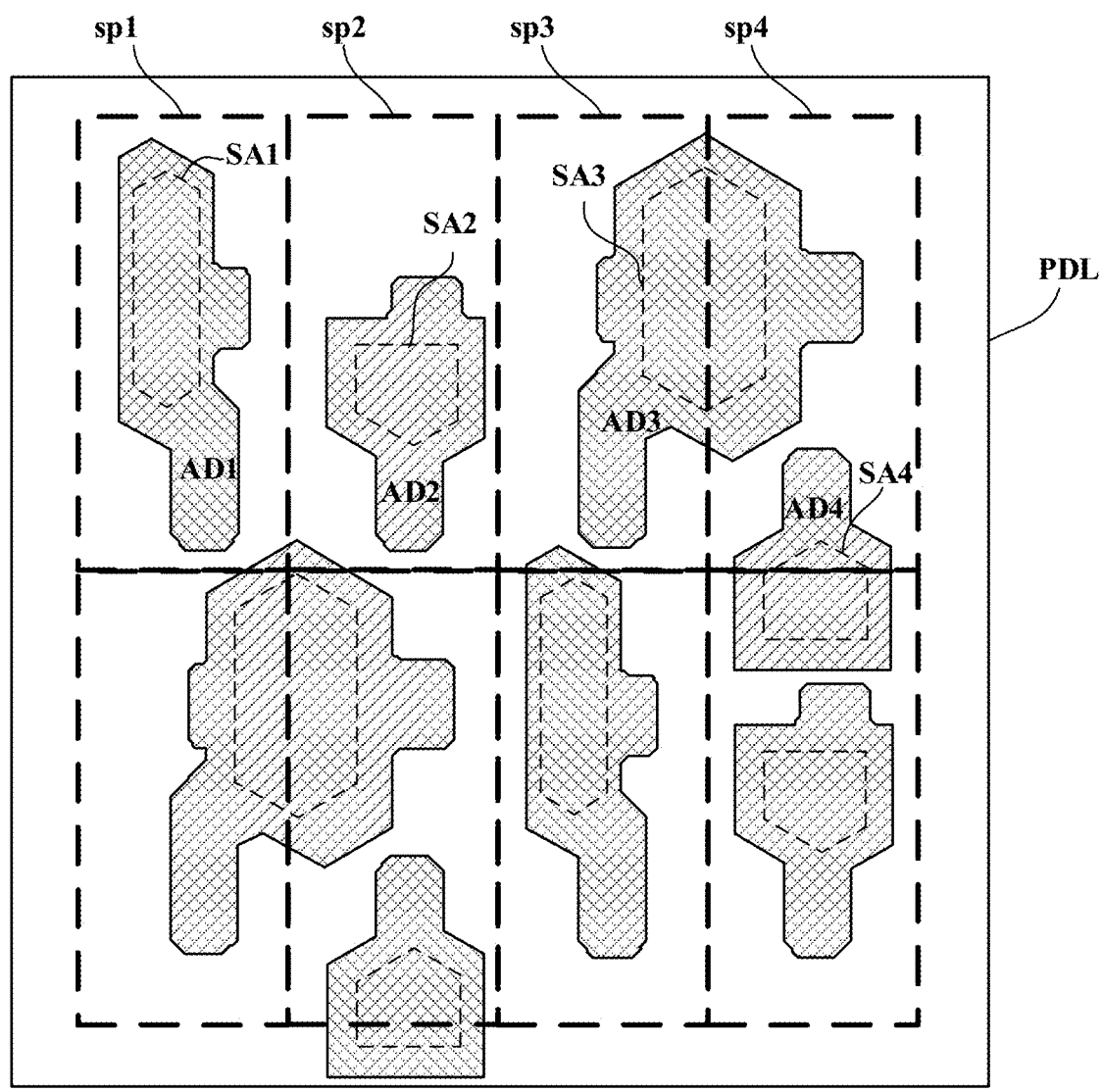
FIG. 8B is a diagram illustrating the structure of anodes in a plurality of subpixels of an array substrate depicted in FIG. 8A.
Figure 8C:
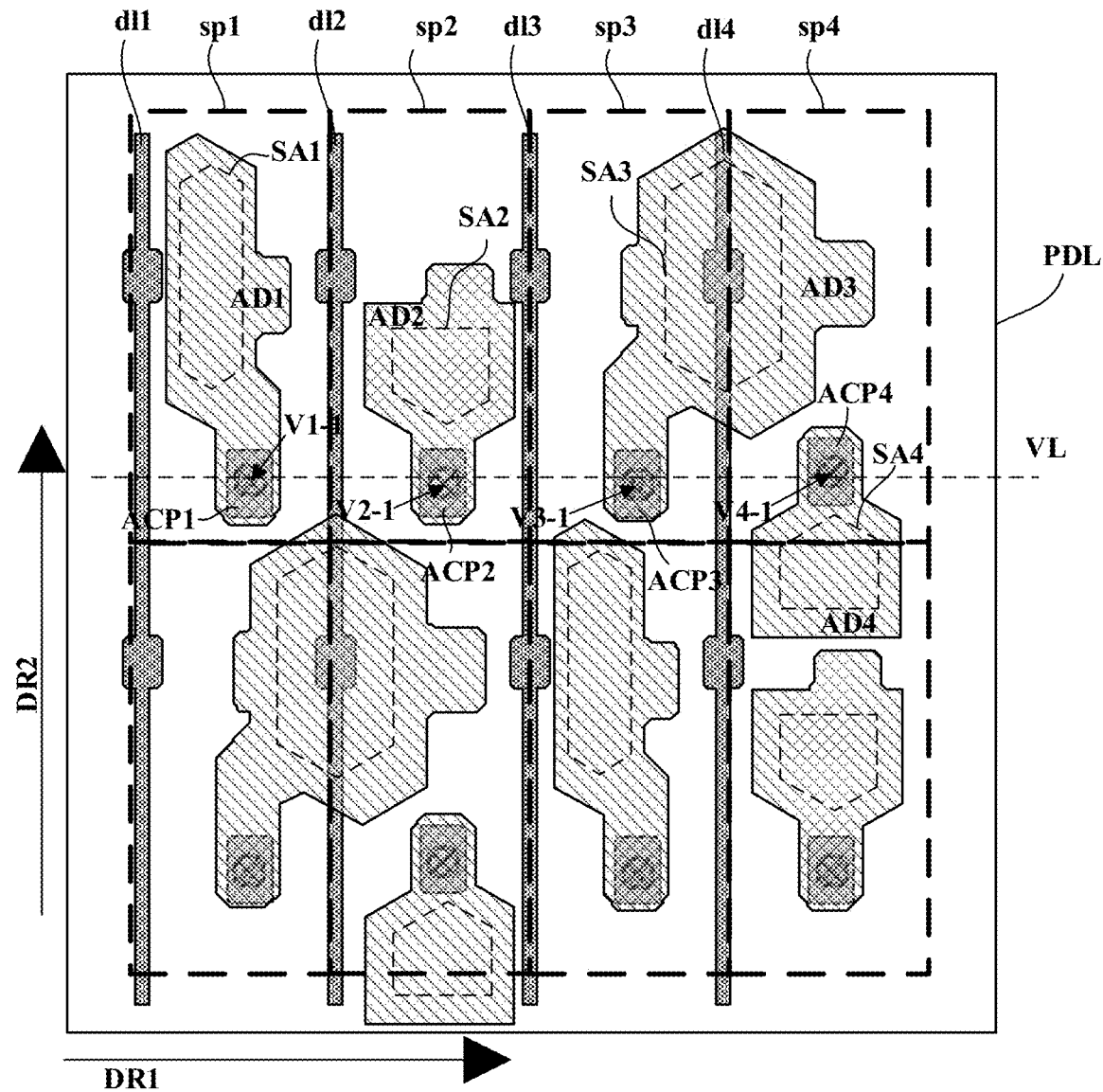
FIG. 8C is a diagram illustrating a superimposition of anodes and data lines in a plurality of subpixels of an array substrate depicted in FIG. 8A.

FIG. 8A is a diagram illustrating the structure of a plurality of subpixels of an array substrate in some embodiments according to the present disclosure. FIG. 8B is a diagram illustrating the structure of anodes in a plurality of subpixels of an array substrate depicted in FIG. 8A. FIG. 8C is a diagram illustrating a superimposition of anodes and data lines in a plurality of subpixels of an array substrate depicted in FIG. 8A. Layers other than the anode layer in the array substrate as shown in FIG. 8A have structures largely similar to those depicted in FIG. 3B to FIG. 3G. Referring to FIG. 8A, FIG. 8B, and FIG. 8C, in some embodiments, the fourth data line dl4 crosses over the third anode AD3 and crosses over the respective third subpixel aperture SA3. Optionally, none of the plurality of data lines crosses over the second anode AD2. Optionally, none of the plurality of data lines crosses over the fourth anode AD4. Optionally, none of the plurality of data lines crosses over the first anode AD1. By having none of the plurality of data lines crosses each of the second anode AD2, the fourth anode AD4, or the first anode AD1, a highly even planarization surface can be achieved underneath each of these anodes.

In some embodiments, an area of an orthographic projection of any data line on the second anode AD2 is smaller than an area of an orthographic projection of any data line on the first anode AD1 and smaller than an area of an orthographic projection of any data line on the third anode AD3. In some embodiments, an area of an orthographic projection of any data line on the fourth anode AD4 is smaller than an area of an orthographic projection of any data line on the first anode AD1 and smaller than an area of an orthographic projection of any data line on the third anode AD3. Optionally, an edge of the second anode is at least partially covered by an orthographic projection of a data line adjacent to the edge of the second anode on the second anode. Optionally, an edge of the fourth anode is at least partially covered by an orthographic projection of a data line adjacent to the edge of the fourth anode on the fourth anode.

In some embodiments, an edge of the first anode AD1 is at least partially covered by an orthographic projection of a data line adjacent to the edge of the first anode AD1 on the first anode AD1.

Figure 8D:
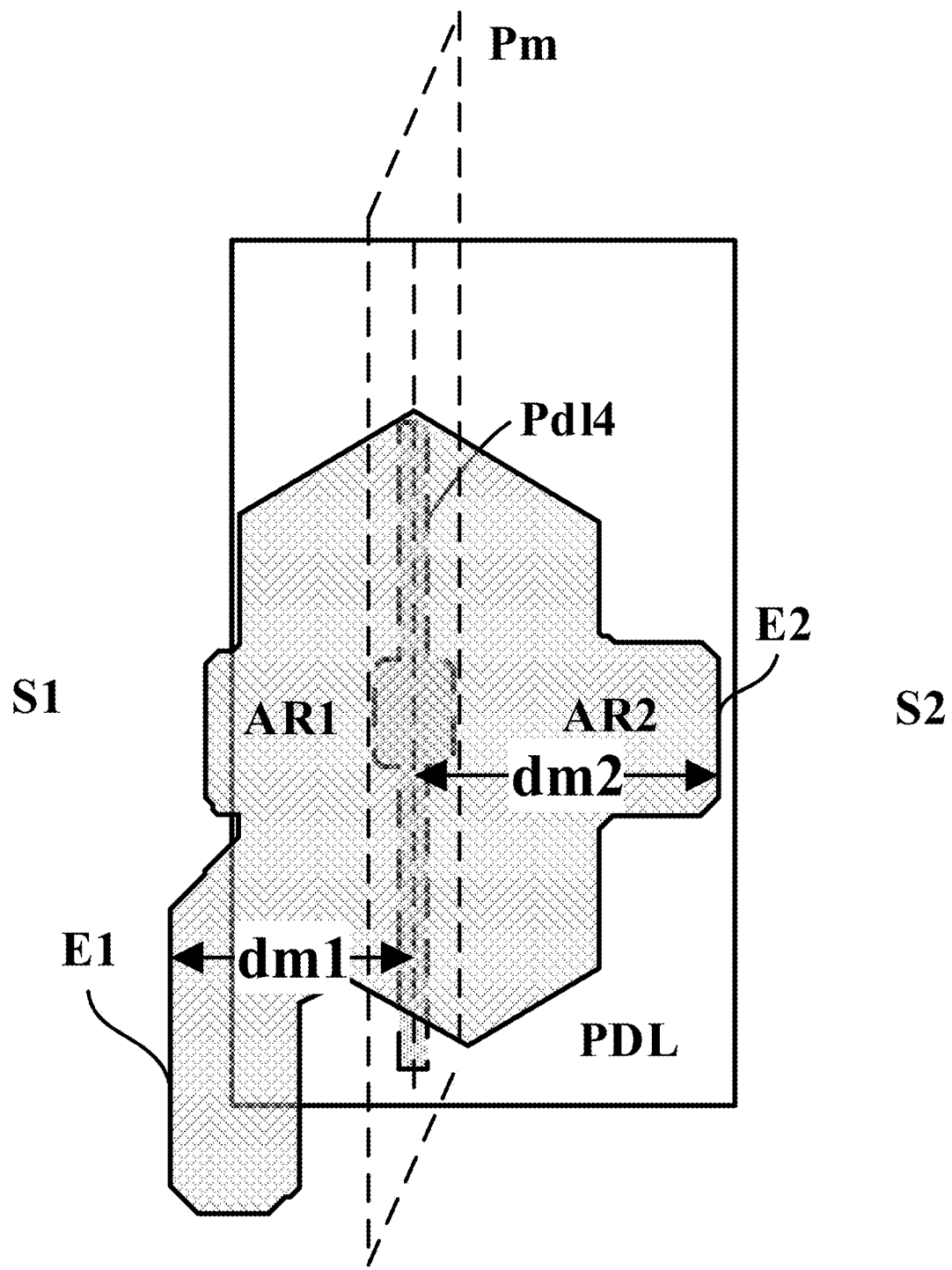
FIG. 8D shows an orthographic projection of a fourth data line on a third anode in some embodiments according to the present disclosure.

FIG. 8D shows an orthographic projection of a fourth data line on a third anode in some embodiments according to the present disclosure. Referring to FIG. 8D, in some embodiments, an orthographic projection Pdl4 of the fourth data line on the third anode AD3 divides the third anode into a first anode region AR1 and a second anode region AR2. In some embodiments, a ratio of a first area of the first anode region AR1 to a second area of the second anode region AR2 is in a range of 2:8 to 8:2, e.g., 2:8 to 3:8, 3:8 to 1:2, 1:2 to 5:8, 5:8 to 6:8, 6:8 to 7:8, 7:8 to 1:1, 1:1 to 8:7, 8:7 to 8:6, 8:6 to 8:5, 8:5 to 1:2, 1:2 to 3:8, or 3:8 to 2:8. Optionally, the ratio of the first area of the first region to the second area of the second region is in a range of 1:1.5 to 1.5:1, e.g., 1:1.5 to 1:1.4, 1:1.4 to 1:1.3, 1:1.3 to 1:1.2, 1:1.2 to 1:1.1, 1:1.1 to 1:1, 1:1 to 1.1:1, 1.1:1 to 1.2:1, 1.2:1 to 1.3:1, 1.3:1 to 1.4:1, or 1.4:1 to 1.5:1. In one example, the first area of the first anode region AR1 equal to the second area of the second anode region AR2. By having the fourth data line dl4 crossing over the third anode AD3 in the described manner, a highly even planarization surface can be achieved underneath the third anode AD3.

In some embodiments, the third anode AD3 has a first edge E1 on a first side of the orthographic projection Pdl4 of the fourth data line on the third anode AD3, wherein the first edge E1 is parallel to the fourth data line and is an edge most distal to the orthographic projection Pdl4 of the fourth data line on the third anode AD3 on the first side S1; and a second edge E2 on a second side of the orthographic projection Pdl4 of the fourth data line on the third anode AD3, wherein the second edge E2 is parallel to the fourth data line and is an edge most distal to the orthographic projection Pdl4 of the fourth data line on the third anode AD3 on the second side S2. Optionally, a ratio of a first shortest distance dm1 between the first edge E1 and the orthographic projection Pdl4 of the fourth data line on the third anode AD3 to a second shortest distance dm2 between the second edge E2 and the orthographic projection Pdl4 of the fourth data line on the third anode AD3 is in a range of 2:8 to 8:2, e.g., 2:8 to 3:8, 3:8 to 1:2, 1:2 to 5:8, 5:8 to 6:8, 6:8 to 7:8, 7:8 to 1:1, 1:1 to 8:7, 8:7 to 8:6, 8:6 to 8:5, 8:5 to 1:2, 1:2 to 3:8, or 3:8 to 2:8. Optionally, the ratio of the first shortest distance dm1 to the second shortest distance dm2 is in a range of 1:1.5 to 1.5:1, e.g., 1:1.5 to 1:1.4, 1:1.4 to 1:1.3, 1:1.3 to 1:1.2, 1:1.2 to 1:1.1, 1:1.1 to 1:1, 1:1 to 1.1:1, 1.1:1 to 1.2:1, 1.2:1 to 1.3:1, 1.3:1 to 1.4:1, or 1.4:1 to 1.5:1.

In some embodiments, an orthographic projection of the first node in the respective subpixel on the base substrate is at least partially overlapped by an orthographic projection of am anode on the base substrate. Referring to FIG. 2A, FIG. 3A to FIG. 3H, and FIG. 4A, in some embodiments, an orthographic projection of the first anode AD1 in a respective first subpixel sp1 on the base substrate BS at least partially overlaps with an orthographic projection of the node connecting line Cln in the respective first subpixel sp1 on the base substrate BS; an orthographic projection of the second anode AD2 in a respective second subpixel sp2 on the base substrate BS at least partially overlaps with an orthographic projection of the node connecting line Cln in the respective second subpixel sp2 on the base substrate BS; an orthographic projection of the third anode AD3 in a respective third subpixel sp3 on the base substrate BS at least partially overlaps with an orthographic projection of the node connecting line Cln in the respective third subpixel sp3 on the base substrate BS, and at least partially overlaps with an orthographic projection of the node connecting line Cln in the respective fourth subpixel sp4 on the base substrate BS. Optionally, an orthographic projection of the fourth anode AD4 in a respective fourth subpixel sp4 on the base substrate BS is non-overlapping with an orthographic projection of any node connecting line.

Optionally, an orthographic projection of the first anode AD1 in a respective first subpixel sp1 on the base substrate BS at least partially overlaps with an orthographic projection of the first capacitor electrode Ce1 in the respective first subpixel sp1 on the base substrate BS; an orthographic projection of the second anode AD2 in a respective second subpixel sp2 on the base substrate BS at least partially overlaps with an orthographic projection of the first capacitor electrode Ce1 in the respective second subpixel sp2 on the base substrate BS; an orthographic projection of the third anode AD3 in a respective third subpixel sp3 on the base substrate BS at least partially overlaps with an orthographic projection of the first capacitor electrode Ce1 in the respective third subpixel sp3 on the base substrate BS, and at least partially overlaps with an orthographic projection of the first capacitor electrode Ce1 in the respective fourth subpixel sp4 on the base substrate BS. Optionally, an orthographic projection of the fourth anode AD4 in a respective fourth subpixel sp4 on the base substrate BS is non-overlapping with an orthographic projection of any first capacitor electrode on the base substrate BS.

Optionally, an orthographic projection of the first anode AD1 in a respective first subpixel sp1 on the base substrate BS at least partially overlaps with an orthographic projection of the second capacitor electrode Ce2 in the respective first subpixel sp1 on the base substrate BS; an orthographic projection of the second anode AD2 in a respective second subpixel sp2 on the base substrate BS at least partially overlaps with an orthographic projection of the second capacitor electrode Ce2 in the respective second subpixel sp2 on the base substrate BS; an orthographic projection of the third anode AD3 in a respective third subpixel sp3 on the base substrate BS at least partially overlaps with an orthographic projection of the second capacitor electrode Ce2 in the respective third subpixel sp3 on the base substrate BS, and at least partially overlaps with an orthographic projection of the second capacitor electrode Ce2 in the respective fourth subpixel sp4 on the base substrate BS. Optionally, an orthographic projection of the fourth anode AD4 in a respective fourth subpixel sp4 on the base substrate BS is non-overlapping with an orthographic projection of any second capacitor electrode on the base substrate BS.

Optionally, an orthographic projection of the first anode AD1 in a respective first subpixel sp1 on the base substrate BS at least partially overlaps with an orthographic projection of the active layer ACTd of the driving transistor Td in the respective first subpixel sp1 on the base substrate BS; an orthographic projection of the second anode AD2 in a respective second subpixel sp2 on the base substrate BS at least partially overlaps with an orthographic projection of the active layer ACTd of the driving transistor Td in the respective second subpixel sp2 on the base substrate BS; an orthographic projection of the third anode AD3 in a respective third subpixel sp3 on the base substrate BS at least partially overlaps with an orthographic projection of the active layer ACTd of the driving transistor Td in the respective third subpixel sp3 on the base substrate BS, and at least partially overlaps with an orthographic projection of the active layer ACTd of the driving transistor Td in the respective fourth subpixel sp4 on the base substrate BS. Optionally, an orthographic projection of the fourth anode AD4 in a respective fourth subpixel sp4 on the base substrate BS is non-overlapping with an orthographic projection of an active layer of any driving transistor.

Optionally, an orthographic projection of the first anode AD1 in a respective first subpixel sp1 on the base substrate BS covers an orthographic projection of a portion of the node connecting line Cln at a position connecting to the first capacitor electrode Ce1 in the respective first subpixel sp1 on the base substrate BS; an orthographic projection of the second anode AD2 in a respective second subpixel sp2 on the base substrate BS covers an orthographic projection of a portion of the node connecting line Cln at a position connecting to the first capacitor electrode Ce1 in the respective second subpixel sp2 on the base substrate BS; an orthographic projection of the third anode AD3 in a respective third subpixel sp3 on the base substrate BS covers an orthographic projection of a portion of the node connecting line Cln at a position connecting to the first capacitor electrode Ce1 in the respective fourth subpixel sp4 on the base substrate BS, and partially overlaps with an orthographic projection of a portion of the node connecting line Cln at a position connecting to the first capacitor electrode Ce1 in the respective third subpixel sp3 on the base substrate BS.

In the present array substrate, the N1 nodes of the pixel driving circuits are at least partially overlapped by the orthographic projections of the anodes on the base substrate BS, loading among various anodes and loading among various pixel driving circuits in respective subpixels can be maintained consistent with respect to each other, improving image display uniformity.

Figure 9A:
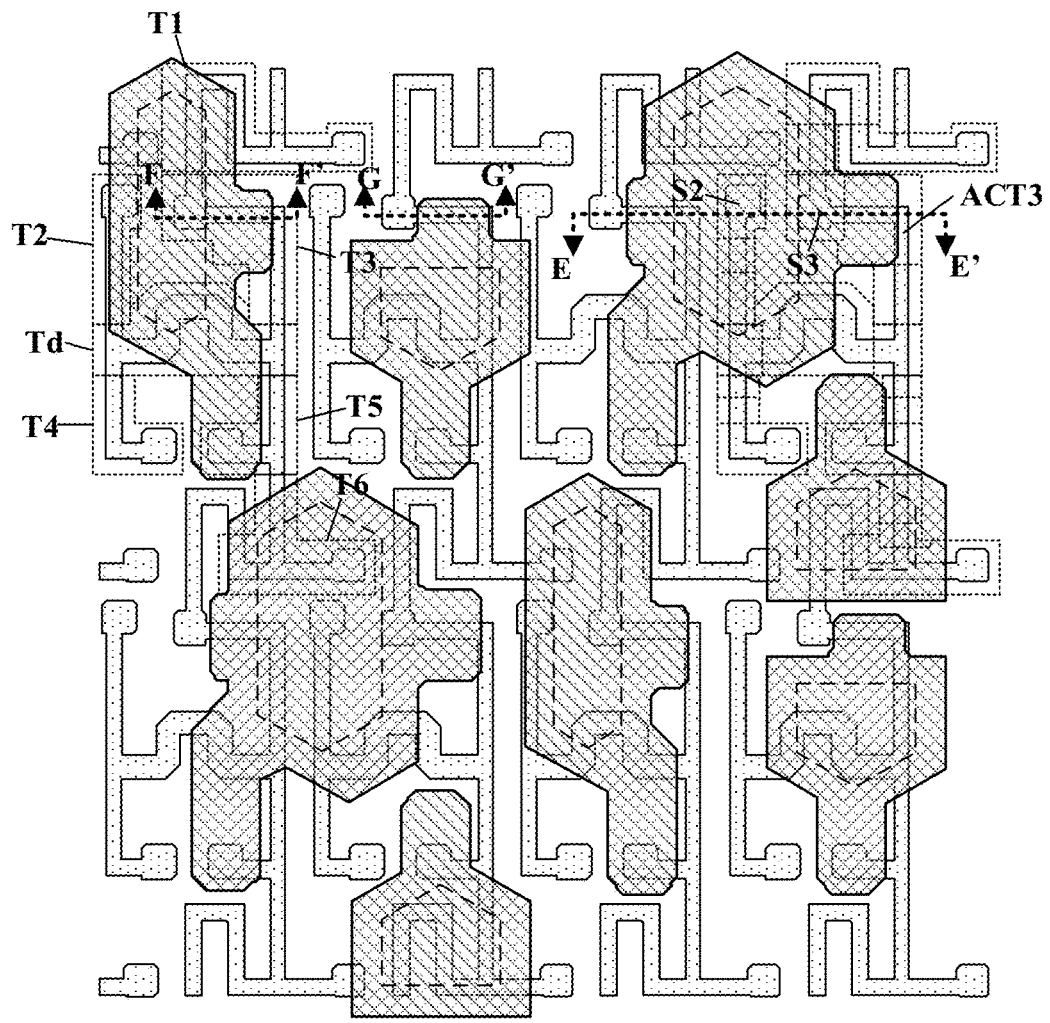
FIG. 9A is a diagram illustrating anodes and a semiconductor material layer in an array substrate in some embodiments according to the present disclosure.
Figure 9B:
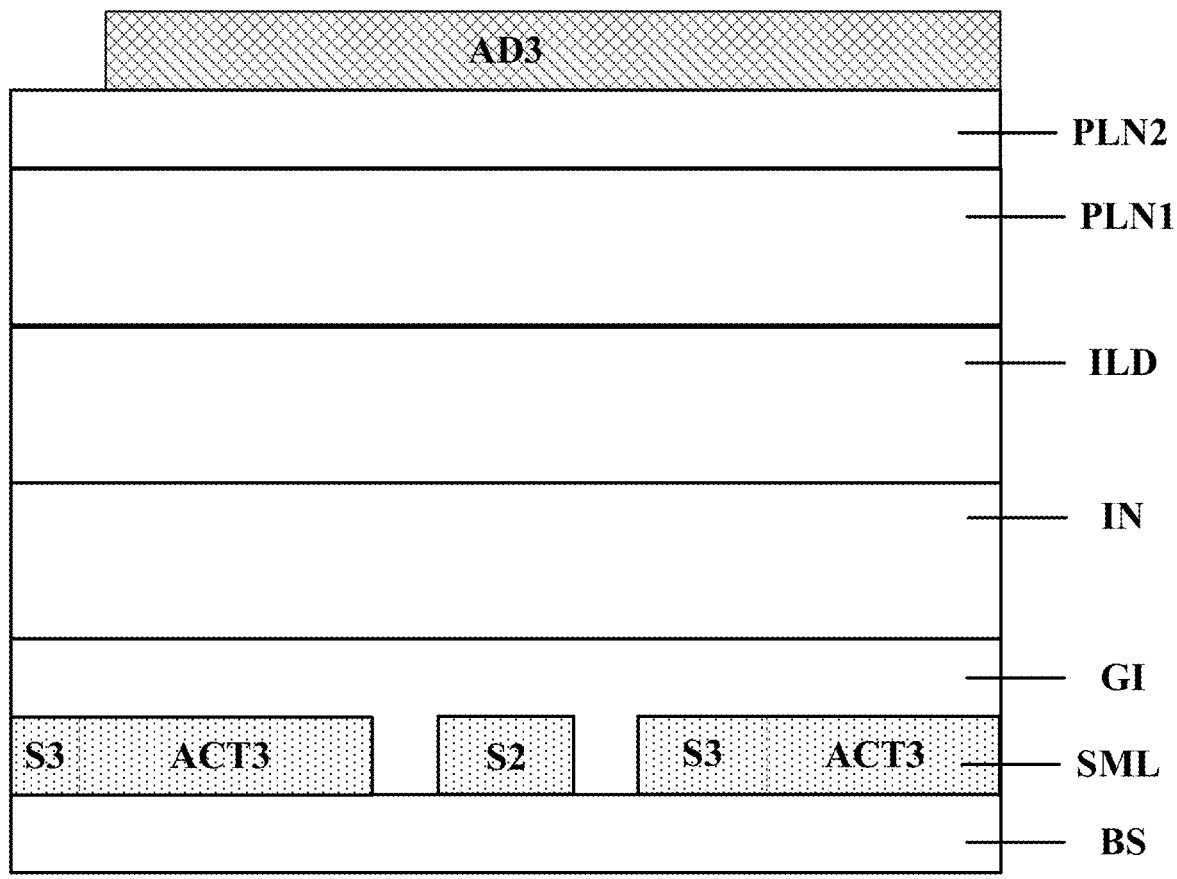
FIG. 9B is a cross-sectional view along an E-E' line in FIG. 9A.

FIG. 9A is a diagram illustrating anodes and a semiconductor material layer in an array substrate in some embodiments according to the present disclosure. FIG. 9B is a cross-sectional view along an E-E' line in FIG. 9A. Referring to FIG. 9A and FIG. 9B, in some embodiments, an orthographic projection of the third anode AD3 of the third light emitting element in the respective third subpixel on the base substrate BS at least partially overlaps with an orthographic projection of a third transistor in a respective third subpixel on the base substrate BS and at least partially overlaps with an orthographic projection of a third transistor in a respective fourth subpixel adjacent to the respective third subpixel on the base substrate BS. Optionally, the orthographic projection of the third anode AD3 on the base substrate partially overlaps with an orthographic projection of an active layer ACT3 of the third transistor in the respective third subpixel on the base substrate BS, covers an orthographic projection of a source electrode S3 of a third transistor in the respective fourth subpixel on the base substrate BS, and partially overlaps with an orthographic projection of an active layer ACT3 of the third transistor in the respective fourth subpixel on the base substrate BS.

Figure 9C:
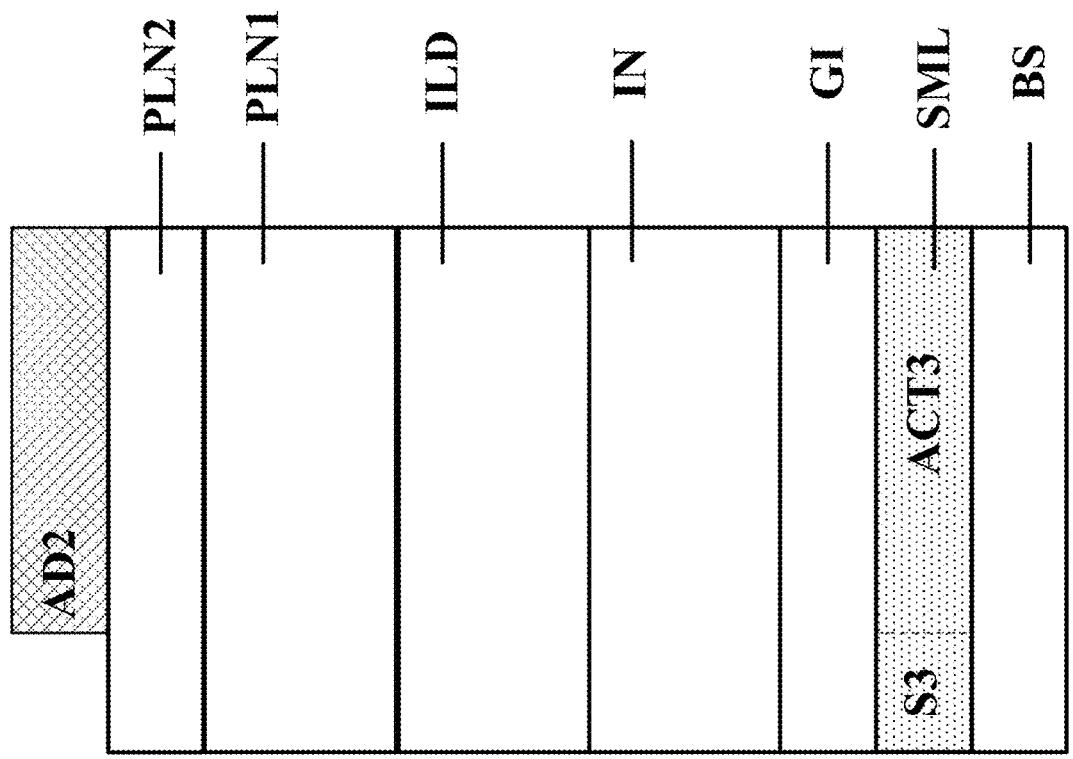
FIG. 9C is a cross-sectional view along an F-F' line in FIG. 9A.

FIG. 9C is a cross-sectional view along an F-F' line in FIG. 9A. Referring to FIG. 9A and FIG. 9C, in some embodiments, an orthographic projection of the first anode AD1 on the base substrate BS at least partially overlaps with an orthographic projection of a third transistor in a respective first subpixel on the base substrate BS. Optionally, the orthographic projection of the first anode AD1 on the base substrate BS covers an orthographic projection of a source electrode S3 of the third transistor in the respective first subpixel on the base substrate BS, and partially overlaps with an orthographic projection of an active layer ACT3 of the third transistor in the respective first subpixel on the base substrate BS.

In the present array substrate, the orthographic projections of the anodes on the base substrate BS respectively at least partially overlaps with the active layers of the third transistors. Because the anodes are typically made of a reflective material, they can prevent ultraviolet rays from irradiating on the active layer, thereby protecting the transistors.

Figure 9D:
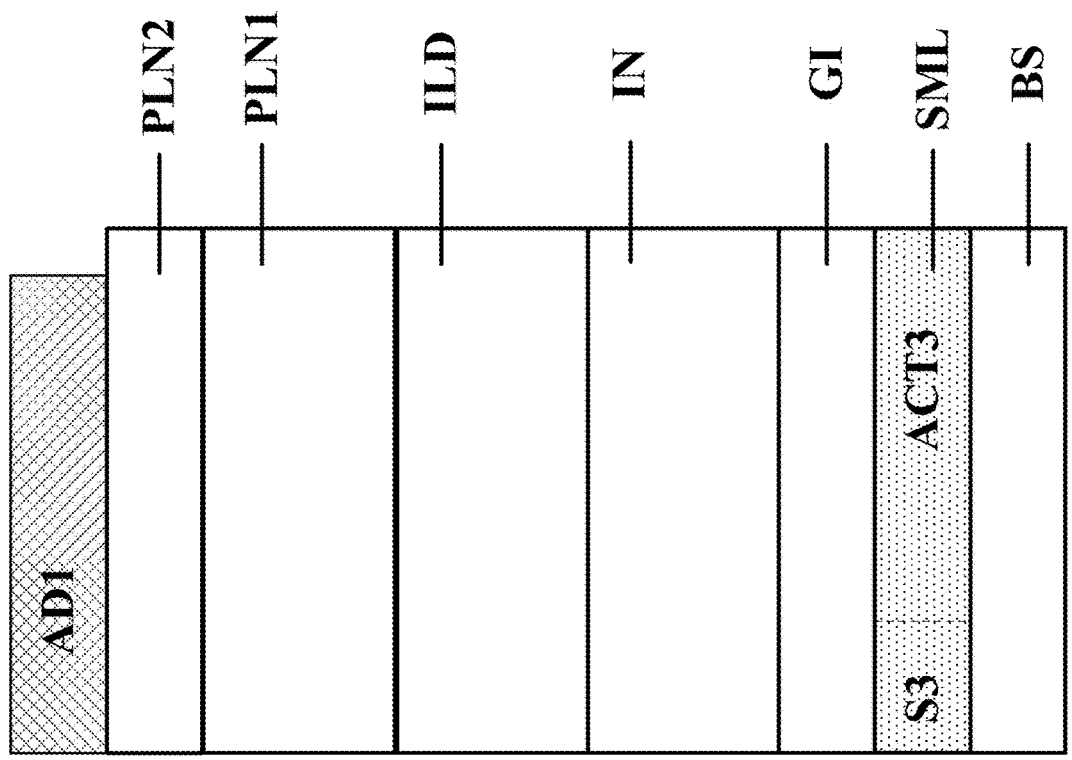
FIG. 9D is a cross-sectional view along a G-G' line in FIG. 9A.

FIG. 9D is a cross-sectional view along a G-G' line in FIG. 9A. Referring to FIG. 9A and FIG. 9D, in some embodiments, an orthographic projection of the second anode AD2 on the base substrate BS at least partially overlaps with an orthographic projection of a third transistor in a respective second subpixel on the base substrate BS. Optionally, the orthographic projection of the second anode AD2 on the base substrate BS partially overlaps with an orthographic projection of an active layer ACT3 of the third transistor in the respective second subpixel on the base substrate BS.

Figure 8E:
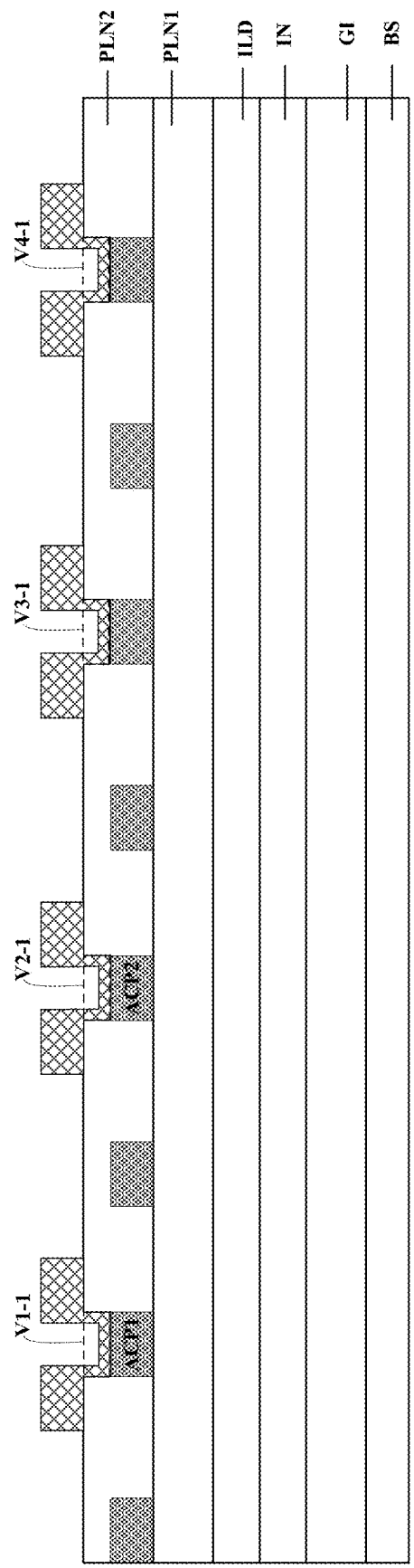
FIG. 8E is a cross-sectional view along a virtual line VL in FIG. 8C.

FIG. 8E is a cross-sectional view along a virtual line VL in FIG. 8C. Referring to FIG. 8C and FIG. 8E, in some embodiments, in a respective first subpixel sp1, the first anode AD1 is connected to a first anode contact pad ACP1 through a first via V1-1 extending through the second planarization layer PLN-2; in a respective second subpixel sp2, the second anode AD2 is connected to a second anode contact pad ACP2 through a second via V2-1 extending through the second planarization layer PLN-2; in a respective third subpixel sp3, the third anode AD3 is connected to a third anode contact pad ACP3 through a third via V3-1 extending through the second planarization layer PLN-2; and in a respective fourth subpixel sp4, the fourth anode AD4 is connected to a fourth anode contact pad ACP4 through a fourth via V4-1 extending through the second planarization layer PLN-2. In some embodiments, the virtual line VL along the first direction DR1 crosses over the first via V1-1, the second via V2-1, the third via V3-1, and the fourth via V4-1.

In some embodiments, shortest distances between edges of the first anode AD1 other than one where the first anode AD1 connects to the first anode contact pad ACP1 through the first via V1-1 and the respective first subpixel aperture SA1 are non-uniform. Optionally, shortest distances between edges of the second anode AD2 other than one where the second anode AD2 connects to the second anode contact pad ACP2 through the second via V2-1 and the respective second subpixel aperture SA2 are non-uniform. Optionally, shortest distances between edges of the third anode AD3 other than one where the third anode AD3 connects to the third anode contact pad ACP3 through the third via V3-1 and the respective third subpixel aperture SA3 are non-uniform.

Figure 10:
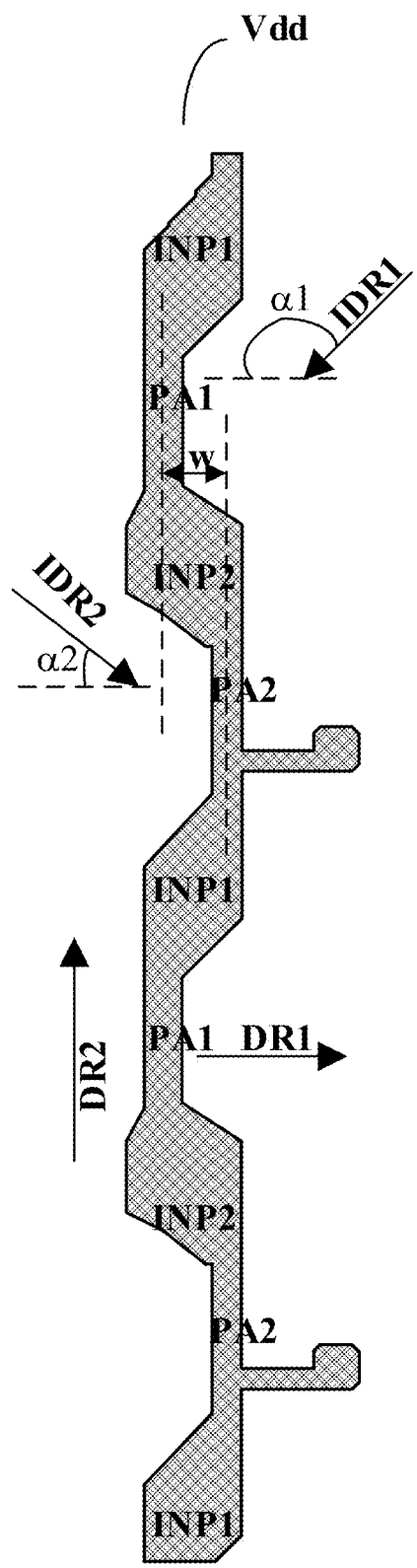
FIG. 10 illustrates a partial structure of a voltage supply line in some embodiments according to the present disclosure.

FIG. 10 illustrates a partial structure of a voltage supply line in some embodiments according to the present disclosure. Referring to FIG. 10, the respective one of the plurality of voltage supply lines Vdd in some embodiments includes a first inclined portion INP1, a second inclined portion INP2, a first parallel portion PA1 connecting the first inclined portion INP1 and the second inclined portion INP2, a second parallel portion PA2 connected to the first parallel portion PA1 through the second inclined portion INP2. The first parallel portion PA1 and the second parallel portion PA2 respectively extend along a direction substantially parallel to the second direction DR2. The first inclined portion INP1 extends along a first inclined angle $\alpha 1$ with respect to the first direction DR1. The second inclined portion INP2 extends along a second inclined angle $\alpha 2$ with respect to the first direction DR2. Optionally, the first inclined angle $\alpha 1$ and the second inclined angle $\alpha 2$ are supplementary angles, e.g., $\alpha 1+\alpha 2=180$ degrees. Central lines of the first parallel portion PA1 and the second parallel portion PA2 respectively along the direction substantially parallel to the second direction DR2 are spaced apart by a width w greater than zero.

As shown in FIG. 10, the respective one of the plurality of voltage supply lines Vdd includes a repeating pattern of the first inclined portion INP1, the first parallel portion PA1, the second inclined portion INP2, the second parallel portion PA2 sequentially connected. In the context of the present disclosure, the term "repeating pattern" refers to a perfectly repeating pattern, or a substantially repeating pattern that allows a deviation of less than 5% (e.g., less than 4%, less than 3%, less than 2%, or less than 1%) from the perfectly repeating pattern. In the context of the present disclosure, the repeating pattern is not necessarily a repeating pattern throughout an entirety of the array substrate. The repeating pattern may be a repeating pattern in a local area of the array substrate, for example, a center area of the array substrate.

First parallel portions in the respective one of the plurality of voltage supply lines Vdd are aligned along a first aligned direction substantially parallel to the second direction DR2. Second parallel portions in the respective one of the plurality of voltage supply lines Vdd are aligned along a second aligned direction substantially parallel to the second direction DR2. The first aligned direction is substantially parallel to the second aligned direction. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

Referring to FIG. 10, FIG. 3A, FIG. 3F, and FIG. 4B, the first inclined portion INP1, the first parallel portion PA1, and the second inclined portion INP2, in combination surround one side of the connecting portion CP, which is connected to a respective one of the plurality of data lines DL through a via v4-1 extending through the first planarization layer PLN-1, and connected to a source electrode S2 of the second transistor through a via v4-2 extending through the interlayer dielectric layer ILD, the insulating layer IN, and the gate insulating layer GI.

Figure 11:
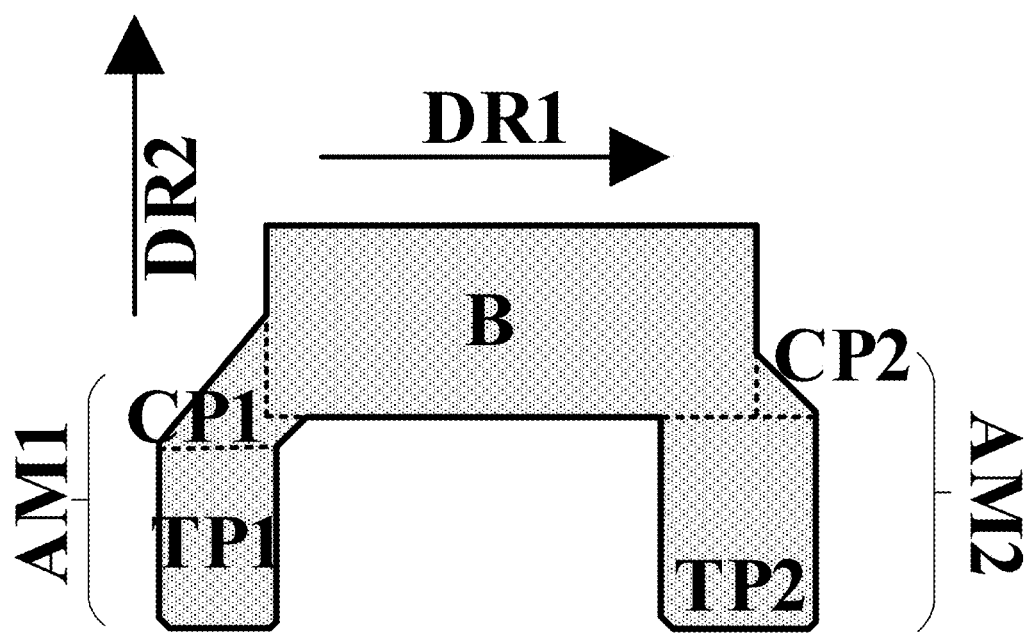
FIG. 11 illustrates a detailed structure of an interference preventing block in some embodiments according to the present disclosure.

FIG. 11 illustrates a detailed structure of an interference preventing block in some embodiments according to the present disclosure. Referring to FIG. 3A, FIG. 4B, and FIG. 11, the interference preventing block IPB in some embodiments includes a base B, a first arm AM1, and a second arm AM2. The respective one of the plurality of voltage supply lines Vdd is connected to the base B through the third main via v3. Optionally, the first arm AM1 includes a first tip portion TP1 and a first connecting bridge portion CP1 connecting the base B and the first tip portion TP1. Optionally, the second arm AM2 includes a second tip portion TP2, and a second connecting bridge portion CP2 connecting the base B and the second tip portion TP2.

Optionally, the first tip portion TP1 and the first connecting bridge portion CP1 are arranged along a direction substantially parallel to the second direction DR2. Optionally, the second tip portion TP2 and the second connecting bridge portion CP2 are arranged along a direction substantially parallel to the second direction DR2. Optionally, a longitudinal side of the base B is along a direction substantially parallel to the first direction DR1, and a lateral side of the base B is along a direction substantially parallel to the second direction DR2.

Optionally, the base B has a substantially rectangular shape. Optionally, the first tip portion TP1 has a substantially rectangular shape. Optionally, the second tip portion TP2 has a substantially rectangular shape. Optionally, the first connecting bridge portion CP1 has a substantially triangular shape. Optionally, the second connecting bridge portion CP2 has a triangular shape.

Figure 12:
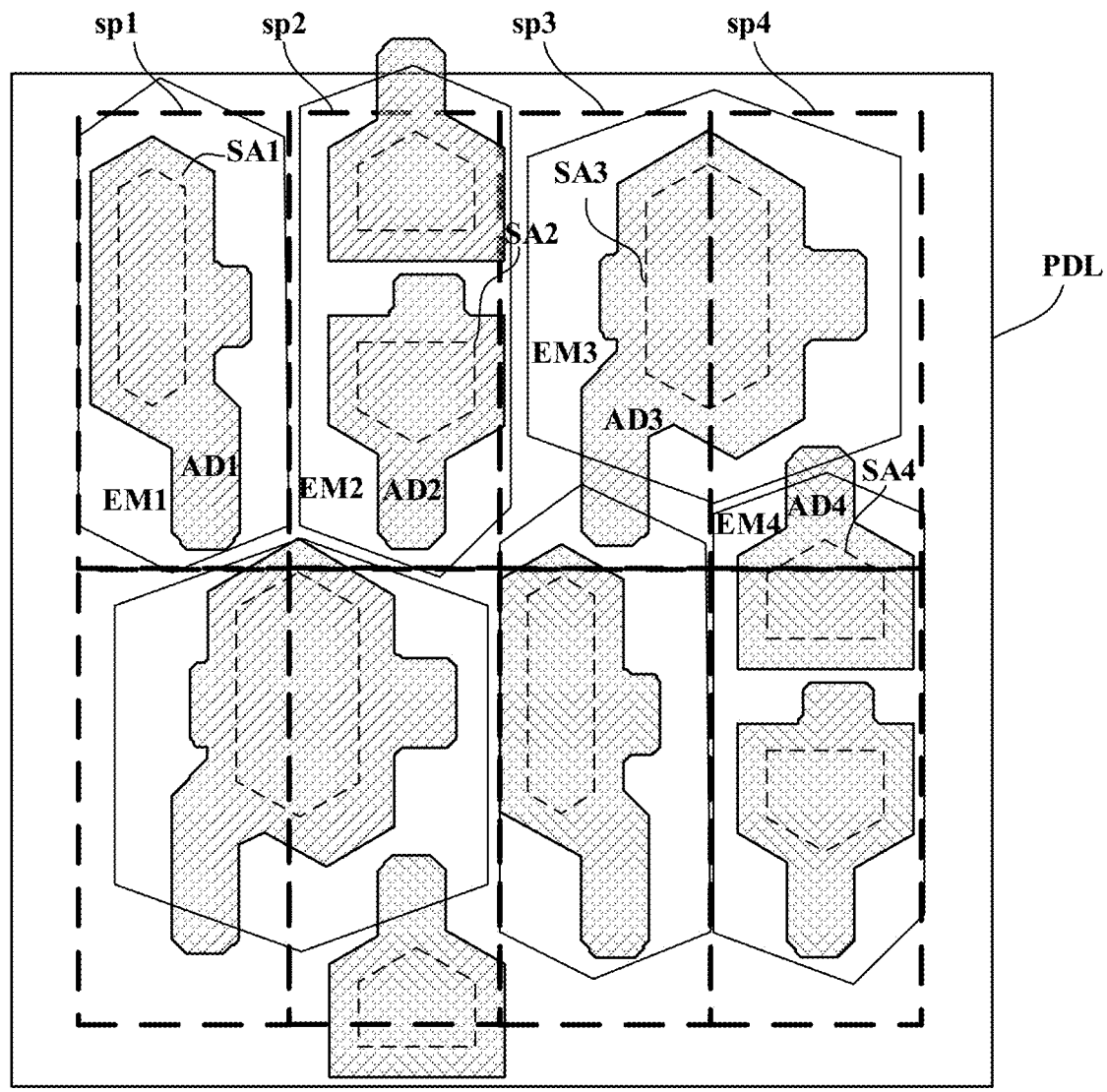
FIG. 12 is a diagram illustrating a superimposition of anodes and light emitting layers in a plurality of subpixels of an array substrate depicted in FIG. 3A.

FIG. 12 is a diagram illustrating a superimposition of anodes and light emitting layers in a plurality of subpixels of an array substrate depicted in FIG. 3A. Referring to FIG. 12, in some embodiments, a first light emitting layer EM1 of the first light emitting element is connected to a first anode AD1 of the first light emitting element through the respective first subpixel aperture SA1; a second light emitting layer EM2 of the second light emitting element connected to a second anode AD2 of the second light emitting element through the respective second subpixel aperture SA2; a third light emitting layer EM3 of the third light emitting element connected to a third anode AD3 of the third light emitting element through the respective third subpixel aperture SA3; and a fourth light emitting layer EM4 of the fourth light emitting element connected to a fourth anode AD4 of the fourth light emitting element through the respective fourth subpixel aperture SA4. Optionally, as shown in FIG. 12, the second light emitting layer EM2 and the fourth light emitting layer EM4 respectively from two directly adjacent second light emitting element and fourth light emitting element are parts of a unitary structure.

In some embodiments, the array substrate includes a plurality of first type data lines (e.g., the fourth data line dl4) and a plurality of second type data lines (e.g., the first data line dl1, the second data line dl2, the third data line dl3). Optionally, a respective one of the plurality of first type data lines crosses over subpixel apertures of multiple subpixels of a first color (e.g., the respective third subpixel aperture SA3), and does not crosses over subpixel apertures of any subpixel of a second color (e.g., the respective first subpixel aperture SA1) and does not crosses over subpixel apertures of any subpixel of a third color (e.g., the respective second subpixel aperture SA2 and the respective fourth subpixel aperture SA4). The first color (e.g., blue), the second color (e.g., red), and the third color (e.g., green) are three different colors. A respective one of the plurality of second type data line (e.g., the first data line dl1, the second data line dl2, the third data line dl3) does not cross over any subpixel aperture. Optionally, a first plane containing an orthographic projection of the respective one of the plurality of first type data lines on a second plane containing a surface of a pixel definition layer divides a respective subpixel aperture of a subpixel of the first color into a first region and a second region, the first plane orthogonal to the second plane. Optionally, a ratio of a first area of the first region to a second area of the second region is in a range of 2:8 to 8:2. Optionally, a ratio of a total number of the plurality of first type data lines to a total number of the plurality of second type data lines is in a range of 0.2 to 4, e.g., 0.3 to 3, 0.4 to 2, or 0.5 to 1.5. As shown in FIG. 3I and FIG. 3J, in one example, the ratio of a total number of the plurality of first type data lines to a total number of the plurality of second type data lines is 1:1.

Figure 13:
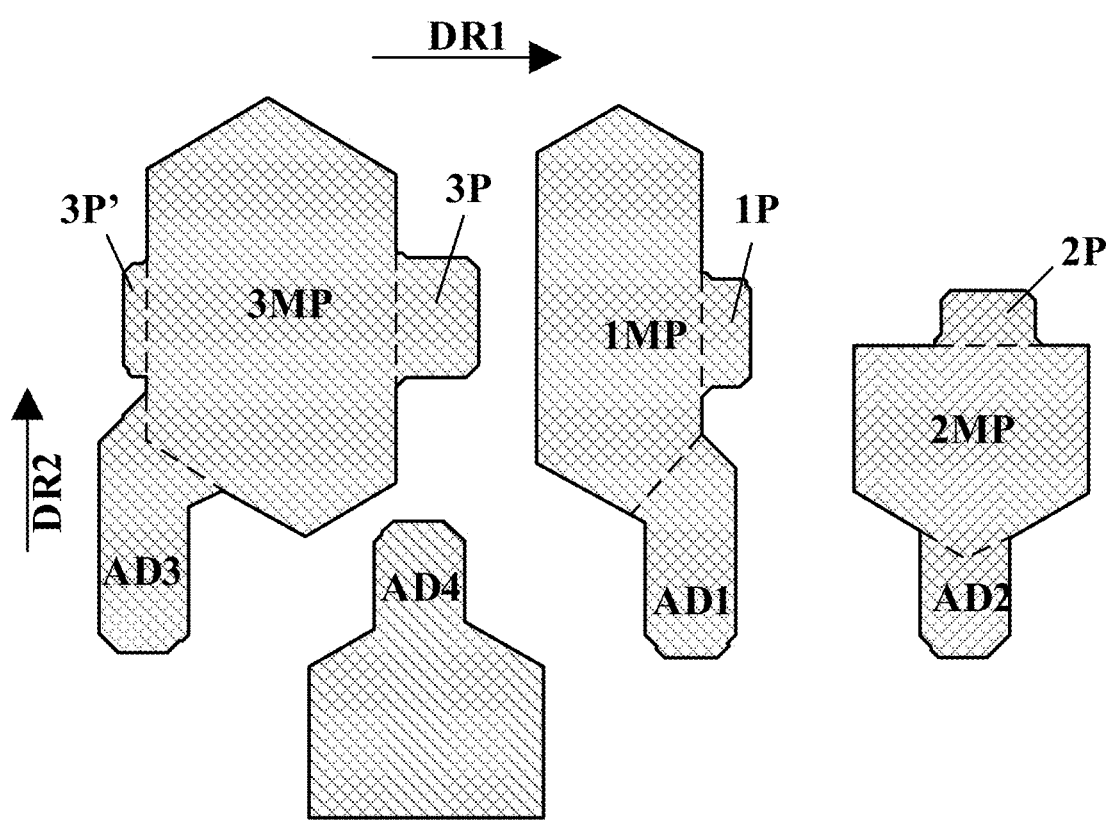
FIG. 13 is a diagram illustrating the structure of anodes in an array substrate in some embodiments according to the present disclosure.

FIG. 13 is a diagram illustrating the structure of anodes in an array substrate in some embodiments according to the present disclosure. Referring to FIG. 13, in some embodiments, the first anode AD1 includes a main portion 1MP, and a protrusion 1P protruding along a row direction (e.g., the first direction DR1) from a side of the main portion IMP. Referring to FIG. 13, FIG. 3A, and FIG. 3C, an orthographic projection of the protrusion 1P on the base substrate at least partially overlaps with an orthographic projection of a semiconductor material portion (e.g., a polycrystalline silicon portion) of a compensating transistor (e.g., the third transistor T3) on the base substrate, the semiconductor material portion extending along the row direction. Optionally, an orthographic projection of the protrusion 1P on the base substrate at least partially overlaps with an orthographic projection of a gate electrode of the compensating transistor (e.g., the third transistor T3) on the base substrate.

Referring to FIG. 13, in some embodiments, the second anode AD2 includes a main portion 2MP, a protrusion 2P protruding along a column direction (e.g., the second direction DR2) from a side of the main portion 2MP. Referring to FIG. 13, FIG. 3A, and FIG. 3C, an orthographic projection of the protrusion 2P on the base substrate at least partially overlaps with an orthographic projection of a semiconductor material portion of a compensating transistor (e.g., the third transistor T3) on the base substrate, the semiconductor material portion extending along the row direction.

Referring to FIG. 13, in some embodiments, the third anode AD3 includes a main portion 3MP, a first protrusion 3P and a second protrusion 3P' respectively protruding along a row direction (e.g., the first direction DR1) from two sides of the main portion 3MP. Referring to FIG. 13, FIG. 3A, and FIG. 3C, orthographic projections of the first protrusion 3P and the second protrusion 3P' on a plane parallel to a column direction (e.g., the second direction DR2) and intersecting (e.g., perpendicularly intersecting) the third anode AD3 substantially overlap with each other. Optionally, the first protrusion 3P and the second protrusion 3P' are on a same side of a gate line GL controlling a third transistor T3. In one example, the first protrusion 3P and the second protrusion 3P' are substantially aligned along the row direction. Optionally, a ratio of a first dimension of the first protrusion 3P along the column direction to a second dimension of the second protrusion 3P' along the column direction is in a range of 0.1 to 8.0. Optionally, a ratio of a first area of the first protrusion 3P to a second area of the second protrusion 3P' is in a range of 0.2 to 5. Referring to FIG. 13, FIG. 3A, and FIG. 3C, an orthographic projection of the first protrusion 3P on the base substrate at least partially overlaps with an orthographic projection of a first semiconductor material portion (e.g., a first polycrystalline silicon portion) of a compensating transistor (e.g., the third transistor T3) in a first adjacent subpixel on the base substrate, the first semiconductor material portion extending along the row direction. Optionally, an orthographic projection of the first protrusion 3P on the base substrate at least partially overlaps with an orthographic projection of a second semiconductor material portion (e.g., a second polycrystalline silicon portion) of the compensating transistor (e.g., the third transistor T3) in a second adjacent subpixel on the base substrate, the second semiconductor material portion extending along the row direction, the first adjacent subpixel and the second adjacent subpixel directly adjacent to each other. Optionally, a ratio of a first area of the first protrusion 3P to a main area of the main portion 3MP is in a range of 0.01 to 0.1. Optionally, a ratio of a second area of the second protrusion 3P' to a main area of the main portion 3MP is in a range of 0.02 to 0.2. Optionally, the second rea of the second protrusion 3P' is greater than the first area of the first protrusion 3P.

Referring to FIG. 3C, in some embodiments, a first transistor T1 is in a pixel driving circuit in a present stage, a reset transistor (e.g., a sixth transistor T6) is in a second pixel driving circuit in a previous stage, and the first transistor T1 and the reset transistor are commonly controlled by a same reset control signal line (e.g., rst1 in FIG. 3D). In some embodiments, and referring to FIG. 3A, FIG. 3C, and FIG. 3F, an initialization connecting line (e.g., the second connecting line C12 in FIG. 3F) connects a respective one of the plurality of first reset signal lines rst and a source electrode of the first transistor T1, the respective one of the plurality of first reset signal lines configured to provide a reset signal to the source electrode of the first transistor T1, through the initialization connecting line. Optionally, the initialization connecting line is on a same side of active layers or gate electrodes of the first transistor T1 and the reset transistor along a row direction.

Figure 14A:
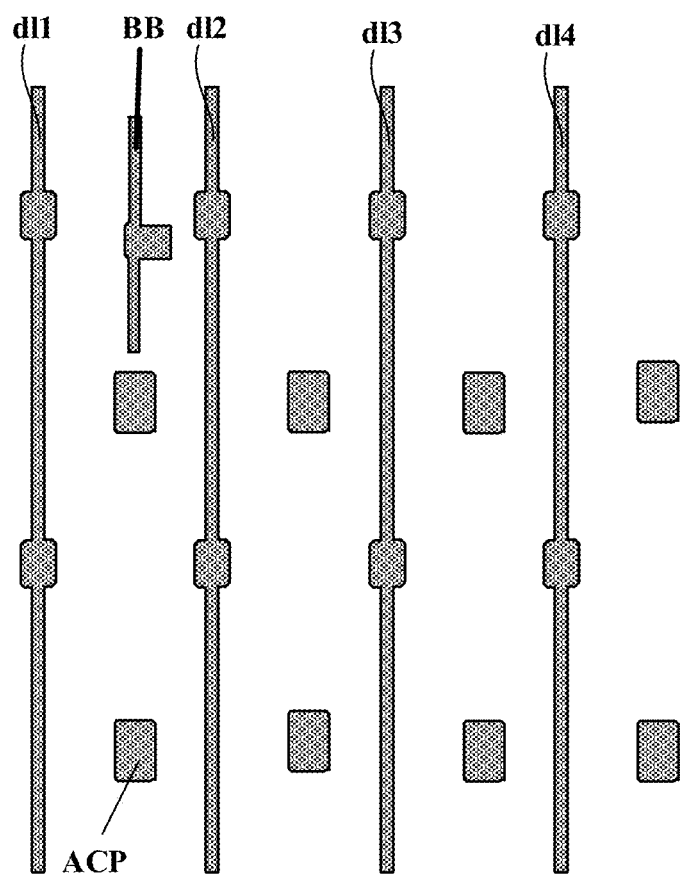
FIG. 14A is a diagram illustrating the structure of a second signal line layer in a plurality of subpixels of an array substrate in some embodiments according to the present disclosure.
Figure 14B:
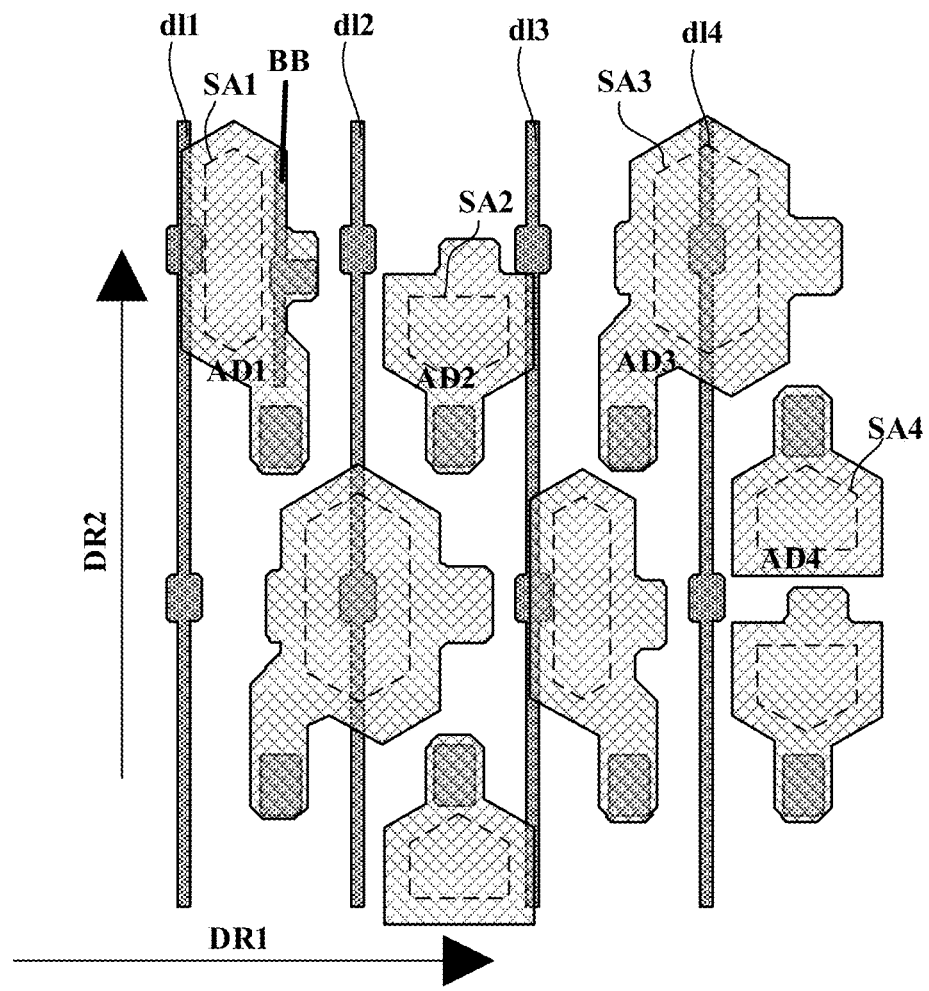
FIG. 14B is a diagram illustrating a superimposition of anodes and a second signal line layer in a plurality of subpixels of an array substrate in some embodiments according to the present disclosure.
Figure 14C:
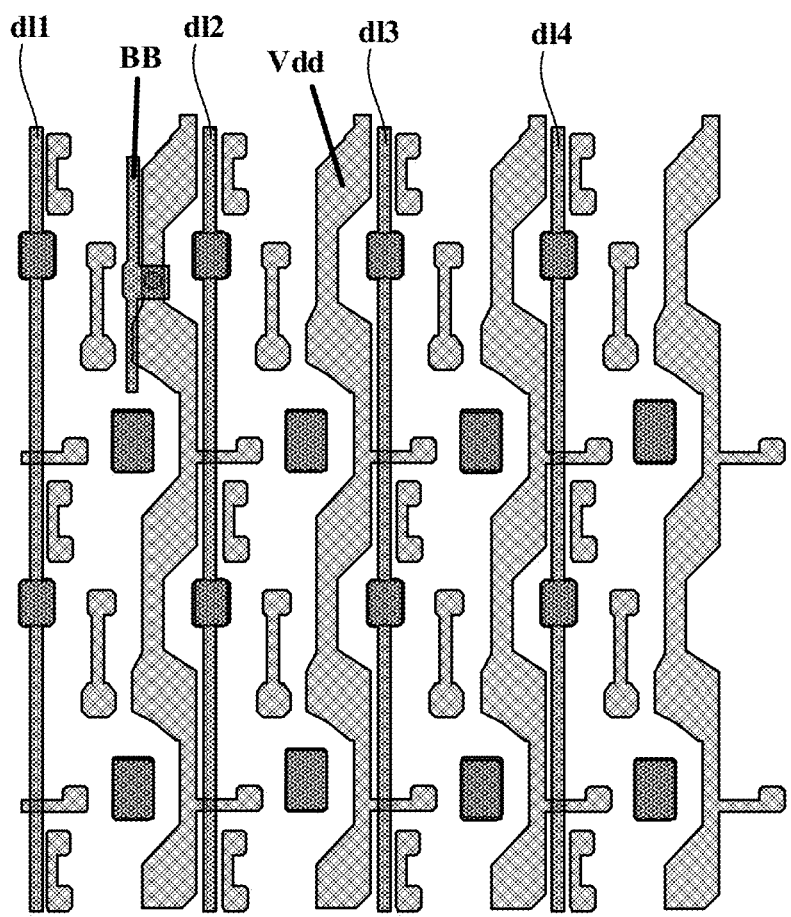
FIG. 14C is a diagram illustrating a superimposition of a first signal line layer and a second signal line layer in a plurality of subpixels of an array substrate in some embodiments according to the present disclosure.

FIG. 14A is a diagram illustrating the structure of a second signal line layer in a plurality of subpixels of an array substrate depicted in FIG. 3A. FIG. 14B is a diagram illustrating a superimposition of anodes and a second signal line layer in a plurality of subpixels of an array substrate in some embodiments according to the present disclosure. FIG. 14C is a diagram illustrating a superimposition of a first signal line layer and a second signal line layer in a plurality of subpixels of an array substrate in some embodiments according to the present disclosure. Referring to FIG. 14A to FIG. 14C, in some embodiments, the second signal line layer further includes a balance block BB is between the first data line dl1 and the second data line dl2, and is electrically connected to a respective one of the plurality of voltage supply lines Vdd through a via extending through the first planarization layer PLN1. An orthographic projection of the first anode AD1 on a base substrate at least partially overlaps with an orthographic projection of the balancing block BB on the base substrate.

Referring to FIG. 14A to FIG. 14C, and FIG. 13, in some embodiments, an orthographic projection of the main portion 1MP of the first anode AD1 on a base substrate at least partially overlaps with the orthographic projection of the first data line dl1 on the base substrate, and also at least partially overlaps with the orthographic projection of the balancing block BB on the base substrate. An orthographic projection of the protrusion 1P on the base substrate at least partially overlaps with the orthographic projection of the balancing block BB on the base substrate.

Figure 14D:
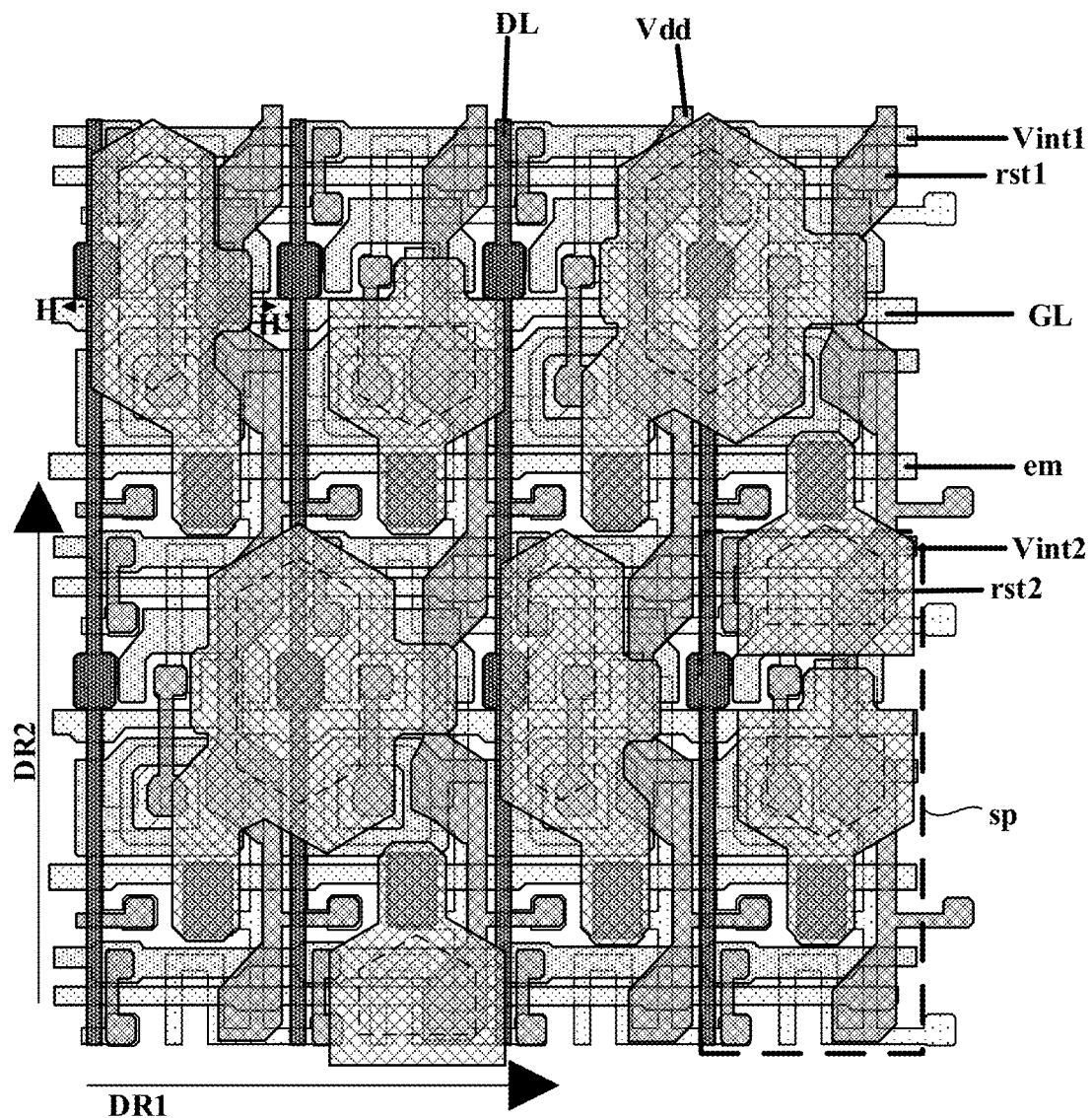
FIG. 14D is a diagram illustrating the structure of a plurality of subpixels of an array substrate in some embodiments according to the present disclosure.
Figure 14E:
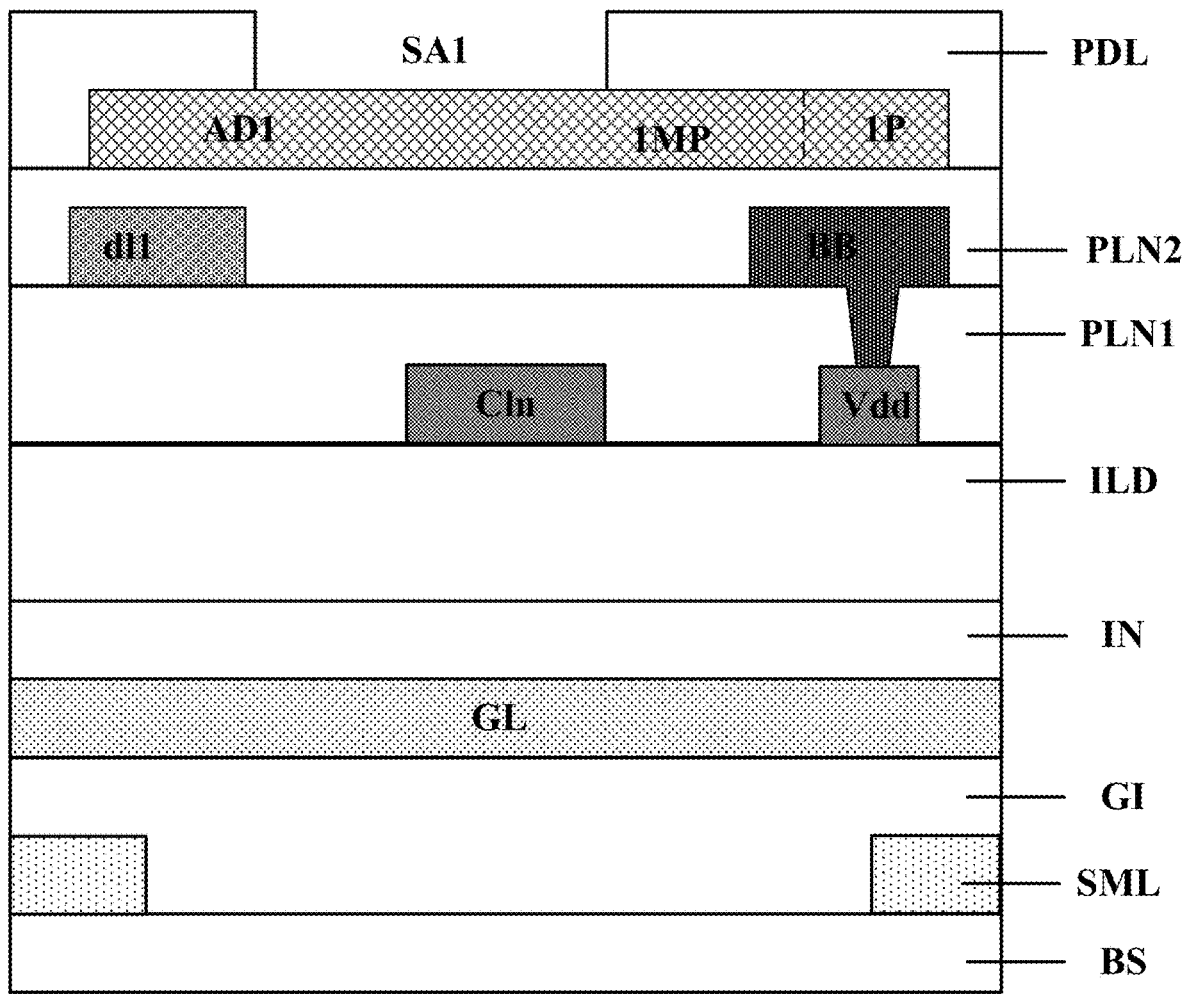
FIG. 14E is a cross-sectional view along an H-H' line in FIG. 14E.

FIG. 14D is a diagram illustrating the structure of a plurality of subpixels of an array substrate in some embodiments according to the present disclosure. FIG. 14E is a cross-sectional view along an H-H' line in FIG. 14E. As shown in FIG. 14A to FIG. 14E, along the first direction DR1, orthographic projections of the first data line dl1 and the balancing block BB on the base substrate BS are respectively on two opposite sides of an orthographic projection of the respective first subpixel aperture SA1 on the base substrate BS. An orthographic projection of the respective first subpixel aperture SA1 on the base substrate BS is non-overlapping with the orthographic projection of the first data line dl1 on the base substrate BS, and is also non-overlapping with the orthographic projection of the balancing block BB on the base substrate BS. By having the balancing block BB underneath the first anode AD1, the signal lines (the first data line dl1 and the balancing block BB) are more evenly distributed underneath both a left side portion and a right side portion of the first anode AD1, preventing the first anode AD1 being titled. As a result, color shift issue can be alleviated.

In another aspect, the present disclosure provides a display panel including the array substrate described herein or fabricated by a method described herein, and a counter substrate facing the array substrate. Optionally, the display panel is an organic light emitting diode display panel. Optionally, the display panel is micro light emitting diode display panel.

In another aspect, the present invention provides a display apparatus, including the array substrate described herein or fabricated by a method described herein, and one or more integrated circuits connected to the array substrate.

In another aspect, the present invention provides a method of fabricating an array substrate. In some embodiments, the method includes forming a plurality of data lines on a base substrate; forming a plurality of light emitting elements respectively in a plurality of subpixels; and forming a pixel definition layer on the base substrate, the pixel definition layer defining a plurality of subpixel apertures. Optionally, forming the plurality of light emitting elements includes forming a first light emitting element in a respective first subpixel, forming a second light emitting element in a respective second subpixel, forming a third light emitting element in a respective third subpixel, and forming a fourth light emitting element in a respective fourth subpixel. Optionally, forming the plurality of subpixel apertures includes forming a respective first subpixel aperture, forming a respective second subpixel aperture, forming a respective third subpixel aperture, forming a respective fourth subpixel aperture respectively extending through the pixel definition layer. Optionally, a first light emitting layer of the first light emitting element is formed to be connected to a first anode of the first light emitting element through the respective first subpixel aperture. Optionally, a second light emitting layer of the second light emitting element is formed to be connected to a second anode of the second light emitting element through the respective second subpixel aperture. Optionally, a third light emitting layer of the third light emitting element is formed to be connected to a third anode of the third light emitting element through the respective third subpixel aperture. Optionally, a fourth light emitting layer of the fourth light emitting element is formed to be connected to a fourth anode of the fourth light emitting element through the respective fourth subpixel aperture. Optionally, forming the plurality of data lines includes forming a first data line, forming a second data line, forming a third data line, and forming a fourth data line, configured to provide data signals respectively to the respective first subpixel, the respective second subpixel, the respective third subpixel, and the respective fourth subpixel. Optionally, data lines are formed so that each of the respective first subpixel aperture, the respective second subpixel aperture, and the respective fourth subpixel aperture is not crossed over by any data line. Optionally, the respective third subpixel aperture is crossed over by one of the plurality of data lines.

In some embodiments, the plurality of subpixel apertures include a plurality of minimum repeating units, a respective one of the plurality of minimum repeating units including the respective first subpixel aperture, the respective second subpixel aperture, the respective third subpixel aperture, and the respective fourth subpixel aperture; the plurality of data lines include a plurality of repeating groups of data lines, a respective group of the plurality of repeating groups of data lines including a first data line, a second data line, a third data line, and a fourth data line consecutively arranged, and respectively configured to provide data signals respectively to the respective first subpixel, the respective second subpixel, the respective third subpixel, and the respective fourth subpixel. Optionally, the fourth data line is formed to cross over the respective third subpixel aperture.

In some embodiments, the respective first subpixel aperture, the respective second subpixel aperture, the respective third subpixel aperture, and the respective fourth subpixel aperture in the respective one of the plurality of minimum repeating units are consecutively arranged along a row. The first data line, the second data line, the third data line, and the fourth data line are consecutively arranged along the row. The respective first subpixel aperture is formed between the first data line and the second data line. The respective second subpixel aperture is formed between the second data line and the third data line. The respective third subpixel aperture is formed to be crossed over by the fourth data line. The respective fourth subpixel aperture is formed on a side of the fourth data line away from the third data line.

In some embodiments, the respective first subpixel aperture, the respective second subpixel aperture, the respective third subpixel aperture, and the respective fourth subpixel aperture are in a first minimum repeating unit in a first row of two nearest adjacent rows; a second minimum repeating unit in a second row of the two nearest adjacent rows, along a row direction, has a displacement of twice of an inter-data line distance with respect to the first minimum repeating unit, the inter-data line distance being a shortest distance between two nearest data lines along the row direction. The second minimum repeating unit in the second row comprises a second respective first subpixel aperture, a second respective second subpixel aperture, a second respective third subpixel aperture, and a second respective fourth subpixel aperture consecutively arranged along the row. Optionally, the second data line is formed to cross over the second respective second subpixel aperture in the second row.

In some embodiments, a first plane containing an orthographic projection of the fourth data line on a second plane containing a surface of the pixel definition layer divides the respective third subpixel aperture into a first region and a second region. Optionally, the first plane orthogonal to the second plane. Optionally, a ratio of a first area of the first region to a second area of the second region is in a range of 2:8 to 8:2.

In some embodiments, the ratio of the first area of the first region to the second area of the second region is in a range of 1:1.5 to 1.5:1. Optionally, the respective third subpixel aperture is formed to have a substantially mirror symmetry with respect to a plane perpendicular to the pixel definition layer and intersecting with the orthographic projection of the fourth data line on the pixel definition layer.

In some embodiments, the fourth data line is formed to cross over the third anode. Optionally, an orthographic projection of the fourth data line on the third anode divides the third anode into a first anode region and a second anode region. Optionally, a ratio of a first area of the first anode region to a second area of the second anode region is in a range of 2:8 to 8:2.

In some embodiments, an area of an orthographic projection of any data line on the second anode is smaller than an area of an orthographic projection of any data line on the first anode and smaller than an area of an orthographic projection of any data line on the third anode. In some embodiments, an area of an orthographic projection of any data line on the fourth anode is smaller than an area of an orthographic projection of any data line on the first anode and smaller than an area of an orthographic projection of any data line on the third anode.

In some embodiments, none of the plurality of data lines is formed to cross over the second anode or the fourth anode.

In some embodiments, an edge of the first anode is at least partially covered by an orthographic projection of a data line adjacent to the edge of the first anode on the first anode.

In some embodiments, none of the plurality of data lines is formed to cross over the first anode.

In some embodiments, the plurality of subpixels of the array substrate are formed to have a minimum repeating unit including the respective first subpixel, the respective second subpixel, the respective third subpixel, and the respective fourth subpixel. Optionally, the respective second subpixel and the respective fourth subpixel are subpixels of a same color, which is different from a color of the respective first subpixel and different from a color of the respective third subpixel. Optionally, the second light emitting element and the fourth light emitting element are light emitting elements of a same color, which is different from a color of the first light emitting element and different from a color of the third light emitting element. Optionally, the first anode, the second anode, and the third anode are formed to have different areas and different shapes. Optionally, the first anode, the third anode, and the fourth anode are formed to have different areas and different shapes. Optionally, the first anode, the second anode, the third anode, and the fourth anode are formed to have different areas and different shapes.

In some embodiments, the second anode and the fourth anode are anodes of two light emitting elements of the same color. Optionally, the second anode is formed to include a first main portion and a first extra portion and a second extra portion. Optionally, the fourth anode is formed to include a second main portion and a third extra portion. Optionally, the first main portion is a combination of a rectangle part and a triangle part. Optionally, the second main portion is a combination of a rectangle part and a triangle part. Optionally, the first main portion and the second main portion have substantially same shape. Optionally, the first extra portion abuts the triangle part of the first main portion. Optionally, the second extra portion abuts a side of the rectangle part of the first main portion away from the triangle part of the first main portion. Optionally, the third extra portion abuts the triangle part of the second main portion. Optionally, the first extra portion, the first main portion, the second extra portion, are sequentially arranged along a direction substantially parallel to the plurality of data lines. Optionally, the second main portion and the third extra portion are sequentially arranged along a direction substantially parallel to the plurality of data lines.

In some embodiments, the method further includes forming a plurality of gate lines, forming a plurality of first reset control signal lines, forming a plurality of first reset signal lines, forming a plurality of voltage supply lines, forming a plurality of pixel driving circuits respectively in the plurality of subpixels configured to respectively drive the plurality of light emitting elements, forming a semiconductor material layer on the base substrate, and forming a node connecting line. The plurality of gate lines, the plurality of first reset control signal lines, and the plurality of first reset signal lines are formed to respectively extend along a first direction. The plurality of voltage supply lines are formed to respectively extending along a second direction. Optionally, forming a respective one of the plurality of pixel driving circuits includes forming a plurality of transistors, and forming a storage capacitor. Optionally, forming the storage capacitor includes forming a first capacitor electrode, forming a second capacitor electrode electrically connected to a respective voltage supply line, and forming an insulating layer. The insulating layer is formed between the first capacitor electrode and the second capacitor electrode. Optionally, the node connecting line is formed in a same layer as the respective voltage supply line, connected to the first capacitor electrode through a first main via, and connected to the semiconductor material layer through a second main via. Optionally, an orthographic projection of a first anode of the first light emitting element in the respective first subpixel on the base substrate at least partially overlaps with an orthographic projection of the node connecting line in the respective first subpixel on the base substrate. Optionally, an orthographic projection of a second anode of the second light emitting element in the respective second subpixel on the base substrate at least partially overlaps with an orthographic projection of the node connecting line in the respective second subpixel on the base substrate. Optionally, an orthographic projection of a third anode of the third light emitting element in the respective third subpixel on the base substrate at least partially overlaps with an orthographic projection of the node connecting line in the respective third subpixel on the base substrate, at least partially overlaps with an orthographic projection of the node connecting line in the respective fourth subpixel on the base substrate.

In some embodiments, the orthographic projection of the first anode in the respective first subpixel on the base substrate covers an orthographic projection of a portion of the node connecting line at a position connecting to a first capacitor electrode in the respective first subpixel on the base substrate. Optionally, the orthographic projection of the second anode in the respective second subpixel on the base substrate covers an orthographic projection of a portion of the node connecting line at a position connecting to a first capacitor electrode in the respective second subpixel on the base substrate. Optionally, the orthographic projection of the third anode in the respective third subpixel on the base substrate covers an orthographic projection of a portion of the node connecting line at a position connecting to a first capacitor electrode in the respective fourth subpixel on the base substrate, and partially overlaps with an orthographic projection of a portion of the node connecting line at a position connecting to a first capacitor electrode in the respective third subpixel on the base substrate In some embodiments, the orthographic projection of the third anode on the base substrate at least partially overlaps with an orthographic projection of a third transistor in the respective third subpixel on the base substrate and at least partially overlaps with an orthographic projection of a third transistor in the respective fourth subpixel adjacent to the respective third subpixel on the base substrate.

In some embodiments, the orthographic projection of the third anode on the base substrate partially overlaps with an orthographic projection of an active layer of the third transistor in the respective third subpixel on the base substrate, covers an orthographic projection of a source electrode of a third transistor in the respective fourth subpixel on the base substrate, and partially overlaps with an orthographic projection of an active layer of the third transistor in the respective fourth subpixel on the base substrate.

In some embodiments, the orthographic projection of the first anode on the base substrate at least partially overlaps with an orthographic projection of a third transistor in the respective first subpixel on the base substrate.

In some embodiments, the orthographic projection of the first anode on the base substrate covers an orthographic projection of a source electrode of the third transistor in the respective first subpixel on the base substrate, and partially overlaps with an orthographic projection of an active layer of the third transistor in the respective first subpixel on the base substrate.

In some embodiments, the orthographic projection of the second anode on the base substrate at least partially overlaps with an orthographic projection of a third transistor in the respective second subpixel on the base substrate.

In some embodiments, the orthographic projection of the second anode on the base substrate partially overlaps with an orthographic projection of an active layer of the third transistor in the respective second subpixel on the base substrate.

In some embodiments, the method further includes forming a semiconductor material layer on the base substrate; forming a gate insulating layer on a side of the semiconductor material layer away from the base substrate; forming an insulating layer on a side of the gate insulating layer away from the base substrate; forming an inter-layer dielectric layer on a side of the insulating layer away from the gate insulating layer; a relay electrode layer on a side of the inter-layer dielectric layer away from the insulating layer; forming a first planarization layer on a side of the relay electrode layer away from the inter-layer dielectric layer; forming an anode contact pad layer on a side of the first planarization layer away from the inter-layer dielectric layer; and forming a second planarization layer on side of the anode contact pad layer away from the first planarization layer. Optionally, the pixel definition layer is formed on a side of the second planarization layer away from the base substrate. Optionally, respective anodes are formed on a side of the second planarization layer away from the first planarization layer; and respective light emitting layers are formed on a side of the respective anodes away from the second planarization layer. Optionally, in the respective first subpixel, the first anode is formed to be connected to a first anode contact pad through a first via extending through the second planarization layer; in the respective second subpixel, the second anode is formed to be connected to a second anode contact pad through a second via extending through the second planarization layer; in the respective third subpixel, the third anode is formed to be connected to a third anode contact pad through a third via extending through the second planarization layer; and in a respective fourth subpixel, the fourth anode is formed to be connected to a fourth anode contact pad through a fourth via extending through the second planarization layer.

In some embodiments, shortest distances between edges of the first anode other than one where the first anode connects to the first anode contact pad through the first via and the respective first subpixel aperture are non-uniform. Optionally, shortest distances between edges of the second anode other than one where the second anode connects to the second anode contact pad through the second via and the respective second subpixel aperture are non-uniform. Optionally, shortest distances between edges of the third anode other than one where the third anode connects to the third anode contact pad through the third via and the respective third subpixel aperture are non-uniform.

In some embodiments, forming a respective one of the plurality of voltage supply lines includes forming a first inclined portion, forming a second inclined portion, forming a first parallel portion connecting the first inclined portion and the second inclined portion, forming a second parallel portion connected to the first parallel portion through the second inclined portion. Optionally, the first parallel portion and the second parallel portion are formed to respectively extend along a direction substantially parallel to the second direction. Optionally, the first inclined portion is formed to extend along a first inclined angle with respect to the first direction. Optionally, the second inclined portion is formed to extend along a second inclined angle with respect to the first direction. Optionally, the first inclined angle and the second inclined angle are supplementary angles. Optionally, central lines of the first parallel portion and the second parallel portion respectively along the direction substantially parallel to the second direction are spaced apart by a width greater than zero. Optionally, the respective one of the plurality of voltage supply lines is formed to include a repeating pattern of the first inclined portion, the first parallel portion, the second inclined portion, the second parallel portion sequentially connected. Optionally, first parallel portions in the respective one of the plurality of voltage supply lines are aligned along a first aligned direction substantially parallel to the second direction. Optionally, second parallel portions in the respective one of the plurality of voltage supply lines are aligned along a second aligned direction substantially parallel to the second direction. Optionally, the first parallel portion and the second inclined portion, in combination, are formed to surround one side of the connecting portion, which is connected to a respective one of the plurality of data lines through a via extending through the first planarization layer, and connected to a source electrode of the second transistor through a via extending through the inter-layer dielectric layer, the insulating layer, and the gate insulating layer In some embodiments, the method further includes forming an interference preventing block in a same layer as the second capacitor electrode, the respective one of the plurality of voltage supply lines connected to the interference preventing block through a third main via. Optionally, forming the interference preventing block includes forming a base, forming a first arm, and forming a second arm. Optionally, the respective one of the plurality of voltage supply lines is formed to be connected to the base through the third main via. Optionally, forming the first arm includes forming a first tip portion and forming a first connecting bridge portion connecting the base and the first tip portion. Optionally, forming the second arm includes forming a second tip portion, and forming a second connecting bridge portion connecting the base and the second tip portion. Optionally, the first tip portion and the first connecting bridge portion are arranged along a direction substantially parallel to the second direction. Optionally, the second tip portion and the second connecting bridge portion are arranged along a direction substantially parallel to the second direction. Optionally, a longitudinal side of the base is along a direction substantially parallel to the first direction. Optionally, a lateral side of the base is along a direction substantially parallel to the second direction. Optionally, the base has a substantially rectangular shape. Optionally, the first tip portion has a substantially rectangular shape. Optionally, the second tip portion has a substantially rectangular shape. Optionally, the first connecting bridge portion has a pseudo triangular shape. Optionally, the second connecting bridge portion has a triangular shape.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of first type data lines and a plurality of second type data lines;
   wherein a respective one of the plurality of first type data lines crosses over subpixel apertures of multiple subpixels of a first color, and does not crosses over subpixel apertures of any subpixel of a second color and does not crosses over subpixel apertures of any subpixel of a third color, the first color, the second color, and the third color being three different colors;
   a respective one of the plurality of second type data line does not cross over any subpixel aperture;
   a first plane containing an orthographic projection of the respective one of the plurality of first type data lines on a second plane containing a surface of a pixel definition layer divides a respective subpixel aperture of a subpixel of the first color into a first region and a second region, the first plane orthogonal to the second plane; and
   a ratio of a first area of the first region to a second area of the second region is in a range of 2:8 to 8:2;
   wherein the array substrate comprises:
   a base substrate;
   a plurality of data lines;
   a plurality of light emitting elements respectively in a plurality of subpixels; and
   a pixel definition layer on the base substrate, the pixel definition layer defining a plurality of subpixel apertures;
   wherein the plurality of light emitting elements comprise a first light emitting element in a respective first subpixel, a second light emitting element in a respective second subpixel, a third light emitting element in a respective third subpixel, and a fourth light emitting element in a respective fourth subpixel;
   the plurality of subpixel apertures comprise a respective first subpixel aperture, a respective second subpixel aperture, a respective third subpixel aperture, a respective fourth subpixel aperture respectively extending through the pixel definition layer;
   a first light emitting layer of the first light emitting element is connected to a first anode of the first light emitting element through the respective first subpixel aperture;
   a second light emitting layer of the second light emitting element is connected to a second anode of the second light emitting element through the respective second subpixel aperture;
   a third light emitting layer of the third light emitting element is connected to a third anode of the third light emitting element through the respective third subpixel aperture;
   a fourth light emitting layer of the fourth light emitting element is connected to a fourth anode of the fourth light emitting element through the respective fourth subpixel aperture;
   each of the respective first subpixel aperture, the respective second subpixel aperture, and the respective fourth subpixel aperture is not crossed over by any data line; and
   the respective third subpixel aperture is crossed over by one of the plurality of data lines;
   wherein an area of an orthographic projection of any data line on the second anode is smaller than an area of an orthographic projection of any data line on the first anode and smaller than an area of an orthographic projection of any data line on the third anode; and
   an area of an orthographic projection of any data line on the fourth anode is smaller than an area of an orthographic projection of any data line on the first anode and smaller than an area of an orthographic projection of any data line on the third anode.

2. The array substrate of claim 1, wherein the plurality of subpixel apertures comprise a plurality of minimum repeating units, a respective one of the plurality of minimum repeating units comprising the respective first subpixel aperture, the respective second subpixel aperture, the respective third subpixel aperture, and the respective fourth subpixel aperture;
   the plurality of data lines comprise a plurality of repeating groups of data lines, a respective group of the plurality of repeating groups of data lines comprising a first data line, a second data line, a third data line, and a fourth data line consecutively arranged, and respectively configured to provide data signals respectively to the respective first subpixel, the respective second subpixel, the respective third subpixel, and the respective fourth subpixel; and
   the fourth data line crosses over the respective third subpixel aperture;
   wherein a first plane containing an orthographic projection of the fourth data line on a second plane containing a surface of the pixel definition layer divides the respective third subpixel aperture into a first region and a second region, the first plane orthogonal to the second plane; and
   a ratio of a first area of the first region to a second area of the second region is in a range of 2:8 to 8:2;
   wherein the ratio of the first area of the first region to the second area of the second region is in a range of 1:1.5 to 1.5:1; and
   the respective third subpixel aperture has a substantially mirror symmetry with respect to a plane perpendicular to the pixel definition layer and intersecting with the orthographic projection of the fourth data line on the pixel definition layer.

3. The array substrate of claim 1, wherein the plurality of subpixel apertures comprise a plurality of minimum repeating units, a respective one of the plurality of minimum repeating units comprising the respective first subpixel aperture, the respective second subpixel aperture, the respective third subpixel aperture, and the respective fourth subpixel aperture;
   the plurality of data lines comprise a plurality of repeating groups of data lines, a respective group of the plurality of repeating groups of data lines comprising a first data line, a second data line, a third data line, and a fourth data line consecutively arranged, and respectively configured to provide data signals respectively to the respective first subpixel, the respective second subpixel, the respective third subpixel, and the respective fourth subpixel; and the fourth data line crosses over the respective third subpixel aperture;
wherein the fourth data line crosses over the third anode;
an orthographic projection of the fourth data line on the third anode divides the third anode into a first anode region and a second anode region; and
a ratio of a first area of the first anode region to a second area of the second anode region is in a range of 2:8 to 8:2.

4. The array substrate of claim 1, wherein an edge of the second anode is at least partially covered by an orthographic projection of a data line adjacent to the edge of the second anode on the second anode; and
an edge of the fourth anode is at least partially covered by an orthographic projection of a data line adjacent to the edge of the fourth anode on the fourth anode.

5. The array substrate of claim 1, wherein an edge of the first anode is at least partially covered by an orthographic projection of a data line adjacent to the edge of the first anode on the first anode.

6. The array substrate of claim 1, wherein a minimum repeating unit of the plurality of subpixels of the array substrate comprises the respective first subpixel, the respective second subpixel, the respective third subpixel, and the respective fourth subpixel;
the respective second subpixel and the respective fourth subpixel are subpixels of a same color, which is different from a color of the respective first subpixel and different from a color of the respective third subpixel;
the second light emitting element and the fourth light emitting element are light emitting elements of a same color, which is different from a color of the first light emitting element and different from a color of the third light emitting element;
the first anode, the second anode, and the third anode have different areas and different shapes; and
the first anode, the third anode, and the fourth anode have different areas and different shapes.

7. The array substrate of claim 6, wherein the second anode and the fourth anode are anodes of two light emitting elements of the same color;
the second anode comprises a first main portion and a first extra portion and a second extra portion;
the fourth anode comprises a second main portion and a third extra portion;
the first main portion is a combination of a rectangle part and a triangle part;
the second main portion is a combination of a rectangle part and a triangle part;
the first main portion and the second main portion have substantially same shape;
the first extra portion abuts the triangle part of the first main portion;
the second extra portion abuts a side of the rectangle part of the first main portion away from the triangle part of the first main portion;
the third extra portion abuts the triangle part of the second main portion;
the first extra portion, the first main portion, the second extra portion, are sequentially arranged along a direction substantially parallel to the plurality of data lines; and
the second main portion and the third extra portion are sequentially arranged along a direction substantially parallel to the plurality of data lines.

8. The array substrate of claim 1, further comprising a first anode of a first light emitting element, the first anode comprising a main portion, and a protrusion protruding along a first direction from a side of the main portion; and
an orthographic projection of the protrusion on the base substrate at least partially overlaps with an orthographic projection of a semiconductor material portion of a third transistor on the base substrate, the semiconductor material portion extending along the first direction.

9. The array substrate of claim 1, further comprising a second anode of a second light emitting element, the second anode comprising a main portion, and a protrusion protruding along a second direction from a side of the main portion away from a portion wherein the second anode connects to an anode contact pad; and
an orthographic projection of the protrusion on the base substrate at least partially overlaps with an orthographic projection of a semiconductor material portion of a third transistor on the base substrate, the semiconductor material portion extending along a first direction.

10. A display apparatus, comprising the array substrate of claim 1, and an integrated circuit connected to the array substrate.

11. An array substrate, comprising a plurality of first type data lines and a plurality of second type data lines, and a third anode of a third light emitting element, the third anode comprising a main portion, a first protrusion and a second protrusion respectively protruding along a first direction from two sides of the main portion;
wherein a respective one of the plurality of first type data lines crosses over subpixel apertures of multiple subpixels of a first color, and does not crosses over subpixel apertures of any subpixel of a second color and does not crosses over subpixel apertures of any subpixel of a third color, the first color, the second color, and the third color being three different colors;
a respective one of the plurality of second type data line does not cross over any subpixel aperture;
a first plane containing an orthographic projection of the respective one of the plurality of first type data lines on a second plane containing a surface of a pixel definition layer divides a respective subpixel aperture of a subpixel of the first color into a first region and a second region, the first plane orthogonal to the second plane; and
a ratio of a first area of the first region to a second area of the second region is in a range of 2:8 to 8:2;
wherein the array substrate comprises:
a base substrate;
a plurality of data lines;
a plurality of light emitting elements respectively in a plurality of subpixels; and
a pixel definition layer on the base substrate, the pixel definition layer defining a plurality of subpixel apertures;
wherein the plurality of light emitting elements comprise a first light emitting element in a respective first subpixel, a second light emitting element in a respective second subpixel, a third light emitting element in a respective third subpixel, and a fourth light emitting element in a respective fourth subpixel;
the plurality of subpixel apertures comprise a respective first subpixel aperture, a respective second subpixel aperture, a respective third subpixel aperture, a respective fourth subpixel aperture respectively extending through the pixel definition layer;

a first light emitting layer of the first light emitting element is connected to a first anode of the first light emitting element through the respective first subpixel aperture;

a second light emitting layer of the second light emitting element is connected to a second anode of the second light emitting element through the respective second subpixel aperture;

a third light emitting layer of the third light emitting element is connected to a third anode of the third light emitting element through the respective third subpixel aperture;

a fourth light emitting layer of the fourth light emitting element is connected to a fourth anode of the fourth light emitting element through the respective fourth subpixel aperture;

each of the respective first subpixel aperture, the respective second subpixel aperture, and the respective fourth subpixel aperture is not crossed over by any data line;

the respective third subpixel aperture is crossed over by one of the plurality of data lines;

orthographic projections of the first protrusion and the second protrusion on a plane parallel to a second direction and intersecting the third anode substantially overlap with each other;

a ratio of a first dimension of the first protrusion along the second direction to a second dimension of the second protrusion along the second direction is in a range of 0.1 to 8.0; and a ratio of a first area of the first protrusion to a second area of the second protrusion is in a range of 0.1 to 8.0.

12. The array substrate of claim 11, wherein an orthographic projection of the first protrusion on the base substrate at least partially overlaps with an orthographic projection of a first semiconductor material portion of a third transistor in a first adjacent subpixel on the base substrate, the first semiconductor material portion extending along the first direction; and an orthographic projection of the first protrusion on the base substrate at least partially overlaps with an orthographic projection of a second semiconductor material portion of the third transistor in a second adjacent subpixel on the base substrate, the second semiconductor material portion extending along the first direction, the first adjacent subpixel and the second adjacent subpixel directly adjacent to each other.

13. An array substrate, comprising:
a base substrate;
a plurality of first type data lines and a plurality of second type data lines;
a plurality of pixel driving circuits respectively in a plurality of subpixels configured to respectively drive a plurality of light emitting elements, wherein a respective one of the plurality of pixel driving circuits comprises a plurality of transistors, and a storage capacitor comprising a first capacitor electrode, a second capacitor electrode electrically connected to a respective voltage supply line, and an insulating layer between the first capacitor electrode and the second capacitor electrode;
a semiconductor material layer on the base substrate; and
a node connecting line in a same layer as the respective voltage supply line, connected to the first capacitor electrode through a first main via, and connected to the semiconductor material layer through a second main via;

wherein a respective one of the plurality of first type data lines crosses over subpixel apertures of multiple subpixels of a first color, and does not crosses over subpixel apertures of any subpixel of a second color and does not crosses over subpixel apertures of any subpixel of a third color, the first color, the second color, and the third color being three different colors;

a respective one of the plurality of second type data line does not cross over any subpixel aperture;

a first plane containing an orthographic projection of the respective one of the plurality of first type data lines on a second plane containing a surface of a pixel definition layer divides a respective subpixel aperture of a subpixel of the first color into a first region and a second region, the first plane orthogonal to the second plane; and a ratio of a first area of the first region to a second area of the second region is in a range of 2:8 to 8:2;

wherein the array substrate comprises:
a plurality of data lines;
the plurality of light emitting elements respectively in the plurality of subpixels; and
a pixel definition layer on the base substrate, the pixel definition layer defining a plurality of subpixel apertures;

wherein the plurality of light emitting elements comprise a first light emitting element in a respective first subpixel, a second light emitting element in a respective second subpixel, a third light emitting element in a respective third subpixel, and a fourth light emitting element in a respective fourth subpixel;

the plurality of subpixel apertures comprise a respective first subpixel aperture, a respective second subpixel aperture, a respective third subpixel aperture, a respective fourth subpixel aperture respectively extending through the pixel definition layer;

a first light emitting layer of the first light emitting element is connected to a first anode of the first light emitting element through the respective first subpixel aperture;

a second light emitting layer of the second light emitting element is connected to a second anode of the second light emitting element through the respective second subpixel aperture;

a third light emitting layer of the third light emitting element is connected to a third anode of the third light emitting element through the respective third subpixel aperture;

a fourth light emitting layer of the fourth light emitting element is connected to a fourth anode of the fourth light emitting element through the respective fourth subpixel aperture;

each of the respective first subpixel aperture, the respective second subpixel aperture, and the respective fourth subpixel aperture is not crossed over by any data line; and the respective third subpixel aperture is crossed over by one of the plurality of data lines;

wherein an orthographic projection of a first anode of the first light emitting element in the respective first subpixel on the base substrate at least partially overlaps with an orthographic projection of the node connecting line in the respective first subpixel on the base substrate;

an orthographic projection of a second anode of the second light emitting element in the respective second subpixel on the base substrate at least partially overlaps with an orthographic projection of the node connecting line in the respective second subpixel on the base substrate; and an orthographic projection of a third anode of the third light emitting element in the respective third subpixel on the base substrate at least partially overlaps with an orthographic projection of the node connecting line in the respective third subpixel on the base substrate, at least partially overlaps with an orthographic projection of the node connecting line in the respective fourth subpixel on the base substrate.

14. The array substrate of claim 13, wherein the orthographic projection of the first anode in the respective first subpixel on the base substrate covers an orthographic projection of a portion of the node connecting line at a position connecting to a first capacitor electrode in the respective first subpixel on the base substrate;

the orthographic projection of the second anode in the respective second subpixel on the base substrate covers an orthographic projection of a portion of the node connecting line at a position connecting to a first capacitor electrode in the respective second subpixel on the base substrate; and the orthographic projection of the third anode in the respective third subpixel on the base substrate covers an orthographic projection of a portion of the node connecting line at a position connecting to a first capacitor electrode in the respective fourth subpixel on the base substrate, and partially overlaps with an orthographic projection of a portion of the node connecting line at a position connecting to a first capacitor electrode in the respective third subpixel on the base substrate.

15. The array substrate of claim 13, wherein the orthographic projection of the third anode on the base substrate at least partially overlaps with an orthographic projection of a third transistor in the respective third subpixel on the base substrate and at least partially overlaps with an orthographic projection of a third transistor in the respective fourth subpixel adjacent to the respective third subpixel on the base substrate.

16. The array substrate of claim 15, wherein the orthographic projection of the third anode on the base substrate at least partially overlaps with an orthographic projection of an active layer of the third transistor in the respective third subpixel on the base substrate, at least partially overlaps with an orthographic projection of a source electrode of a third transistor in the respective fourth subpixel on the base substrate, and at least partially overlaps with an orthographic projection of an active layer of the third transistor in the respective fourth subpixel on the base substrate.

17. The array substrate of claim 13, wherein the orthographic projection of the first anode on the base substrate at least partially overlaps with an orthographic projection of a third transistor in the respective first subpixel on the base substrate.

18. The array substrate of claim 17, wherein the orthographic projection of the first anode on the base substrate covers an orthographic projection of a source electrode of the third transistor in the respective first subpixel on the base substrate, and at least partially overlaps with an orthographic projection of an active layer of the third transistor in the respective first subpixel on the base substrate.

19. The array substrate of claim 13, wherein the orthographic projection of the second anode on the base substrate at least partially overlaps with an orthographic projection of a third transistor in the respective second subpixel on the base substrate.

* * * * *